United States Patent [19]

Kramer et al.

[11] Patent Number: 5,043,929

[45] Date of Patent: Aug. 27, 1991

[54] CLOSED-FORM KINEMATICS

[75] Inventors: Glenn A. Kramer, Austin, Tex.; Harry G. Barrow, Brighton, England; Philip E. Agre, San Francisco, Calif.

[73] Assignee: Schlumberger Technologies, Inc., San Jose, Calif.

[21] Appl. No.: 365,627

[22] Filed: Jun. 13, 1989

[51] Int. Cl.$^5$ .............................................. G06F 15/20
[52] U.S. Cl. ...................................... 364/578; 364/512
[58] Field of Search .............. 364/578, 200, 900, 300, 364/513, 191, 512, 474.24

[56] References Cited

U.S. PATENT DOCUMENTS

| | | | |
|---|---|---|---|
| 4,736,306 | 4/1988 | Christensen | 364/513 |
| 4,831,548 | 5/1989 | Matoba et al. | 364/513 |
| 4,835,709 | 5/1989 | Tsai | 364/513 |

OTHER PUBLICATIONS

Gelsey; "Automated Reasoning About Machine Geometry and Kinematics"; IEEE 1987.
Heginbotham et al.; "Rapid Assessment of Industrial Robots Performance by Interactive Graphics"; 1979.
Meyer; "An Emulation System for Programmable Sensory Robots"; IBM J. Res. Dev., Nov. 1981.
Levery et al., "Hybrid Expert Simulation System"; Expert System, May 1988.
Sutherland, "Sketchpad: A Man-Machine Graphical Communication System," Ph.D. Thesis, MIT, Cambridge, Mass., 1963.
Borning, "ThingLab—A Constraint-Oriented Simulation Laboratory," Ph.D. Thesis, Stanford University, Stanford, Calif., Jul. 1979.
Steele, Jr., "The Definition and Implementation of a Programming Language Based on Constraints," Ph.D. Thesis, MIT, Cambridge, Mass., 1980.
Gelernter, *Computers and Thought*, Feigenbaum and Feldman, eds., pp. 134–152, McGraw Hill, New York, N.Y., 1963.
Johnson, "Optimal Linkage Synthesis: Design of a Constant Velocity, Straight Line Motion Scanning Mechanism," Masters Thesis, University of California, Berkeley, Calif., 1985.
Kota et al., *Mechanical Engineering* (1987), pp. 34–38.
Turner, "BravoMOST: Optimal Synthesis for Mechanism Design," May 10, 1989.
Bobrow, "Qualitative Reasoning about Physical Systems: An Introduction," *Artificial Intelligence*, vol. 24, Nos. 1–3, 1984, pp. 1–5.
DeKleer et al., "A Qualitative Physics Based on Confluences," *Artificial Intelligence*, vol. 24, Nos. 1–3, 1984, pp. 7–83.
Orlandea et al., *J. of Eng. for Industry* (1977) 99: 780–784.
Shigley et al., *Theory of Machines and Mechanisms*, Chapter 5, pp. 169–192, McGraw-Hill Book Company, 1980.
Erdman et al., *Mechanism Design: Analysis and Synthesis*, Chapter 8, pp. 391–478, Prentice Hall, Englewood Cliffs, N.J., 1984.
Artobolevsky, *Mechanisms in Modern Engineering Design;* originally published as *Manual of Mechanisms*, USSR Academy of Sciences, 1947–1952; translated and reprinted, Mir Publishers, Moscow, 1975.

(List continued on next page.)

Primary Examiner—Parshotam S. Lall
Assistant Examiner—Ellis B. Ramirez
Attorney, Agent, or Firm—Townsend and Townsend

[57] ABSTRACT

A method and apparatus for performing kinematic analysis of linkages is disclosed. Generalized mechanisms are selected from a catalog of mechanisms. From an initial selection of mechanisms, the one most closely matching a desired behavior is chosen and an optimization procedure is conducted. The method may be preceded by a qualitative kinematic analysis or the qualitative analysis may be used in lieu of a catalog selection. An improved optimization technique is disclosed, along with a closed form kinematic analysis method.

43 Claims, 8 Drawing Sheets

Microfiche Appendix Included
(5 Microfiche, 487 Pages)

OTHER PUBLICATIONS

Cagan and Agogino, "Innovative Design of Mechanical Structures from First Principles," to appear in AI EDAM, 1988.

Hall, *Kinematics and Linkage Desing*, (1961) Chapter 7, pp. 111-153.

Hrones and Nelson, *Analysis of the Four-Bar Linkage*, the Technology Press of MIT and John Wiley & Sons, Inc., New York, 1951.

Kowalski, "The VLSI Design Automation Assistant: A Knowledge-Based Expert System," Ph.D. Thesis, Dept. of Electrical and Computer Engineering, Carnegie-Mellon University, Apr. 1984.

Mead and Conway, *Introduction to VLSI Sytems*, Addison-Wesley, Reading, MA, 1980.

Roylance, "A Simple Model of Circuit Design," MIT Artificial Intelligence Lab Memo AI-TR-703, 1983.

Turner and Bodner, "Optimization and Synthesis for Mechanism Design," *Proc. of AUTOFACT*-88, Detroit, Oct. 1988.

Press et al., *Numerical Recipes: The Art of Scientific Computing*, Cambridge University Press, 1986.

Okino et al., *Robotics & Computer-Integrated Manufacturing* (1987) 3:429-437.

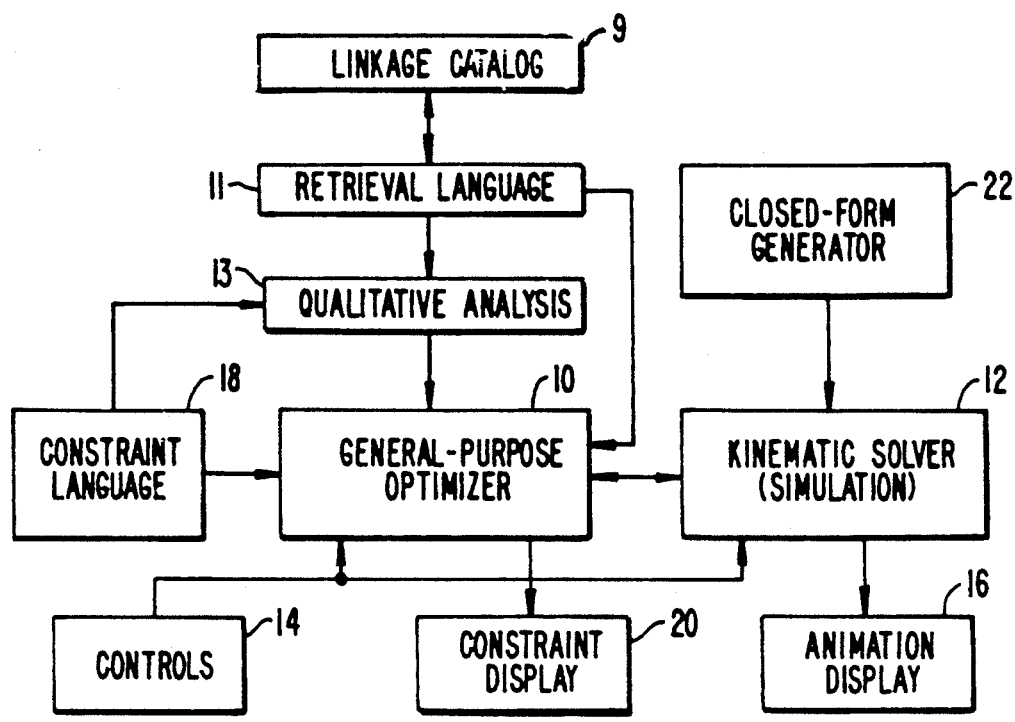
FIG._1.
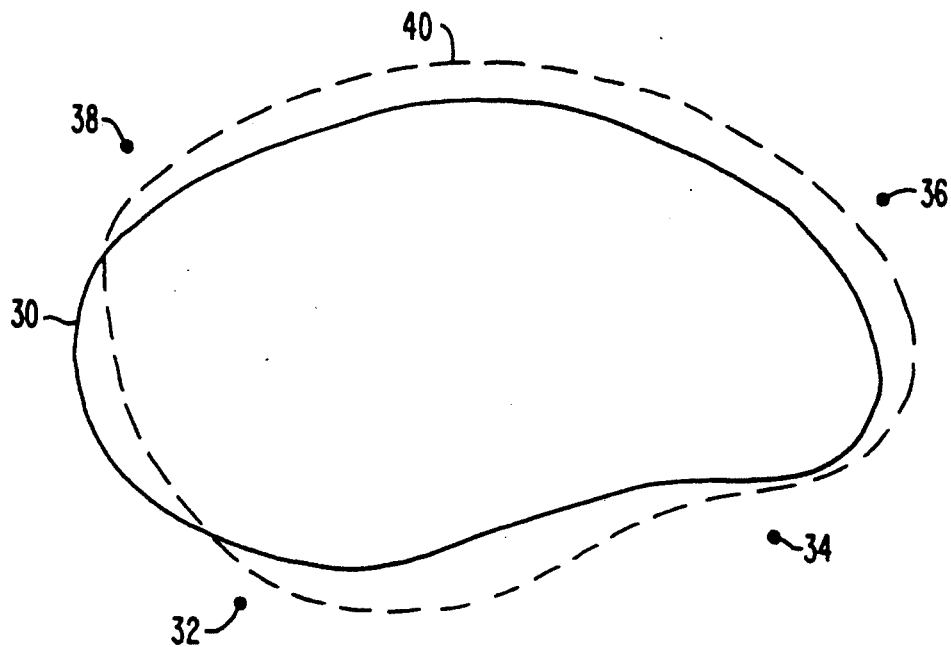
FIG._8.

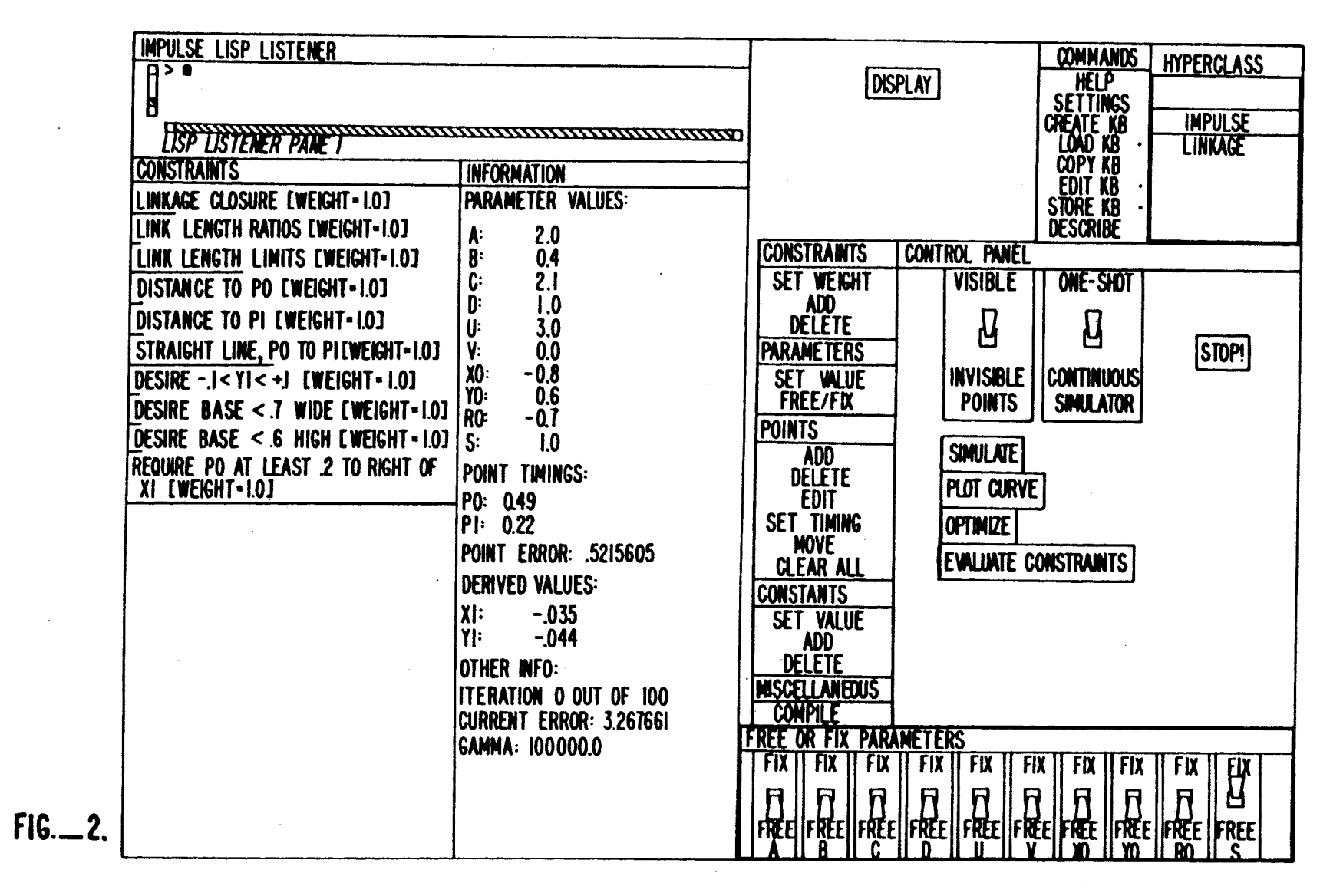

FIG._2.

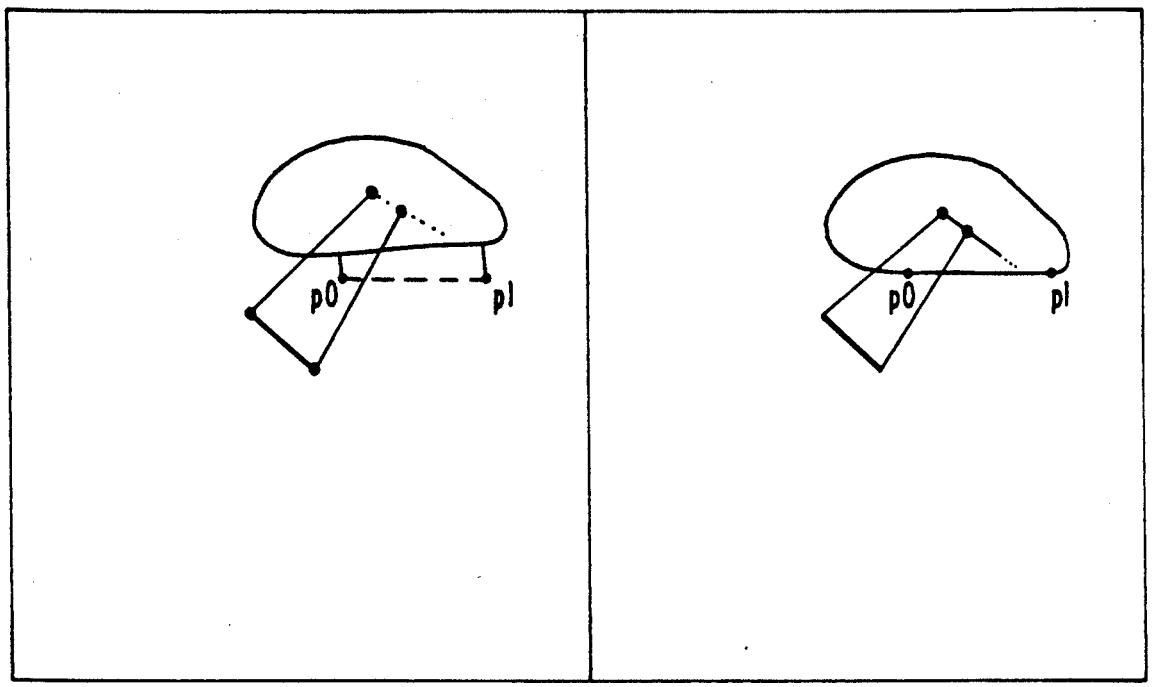
FIG._3a.
FIG._3b.

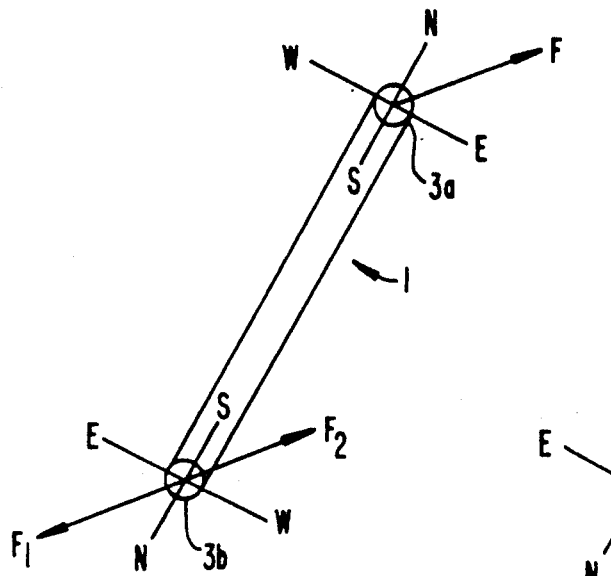
FIG._4a.
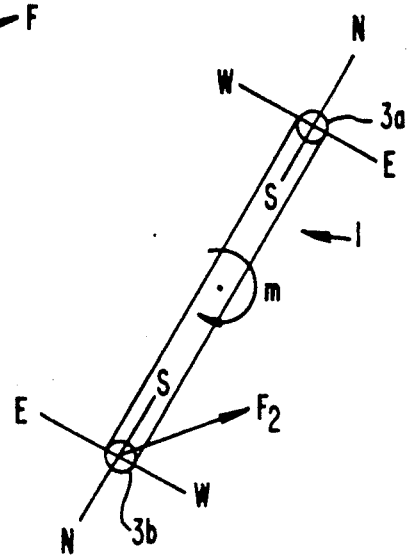
FIG._4b.
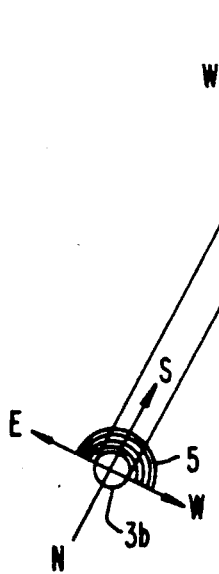
FIG._4c.
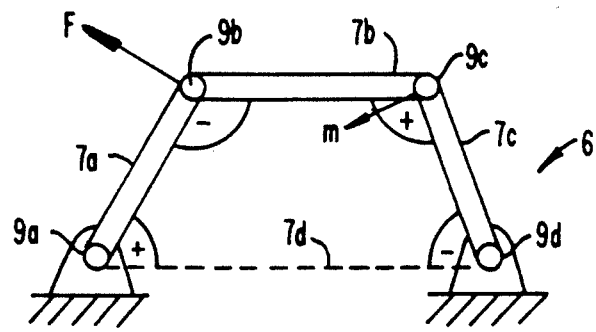
FIG._5.
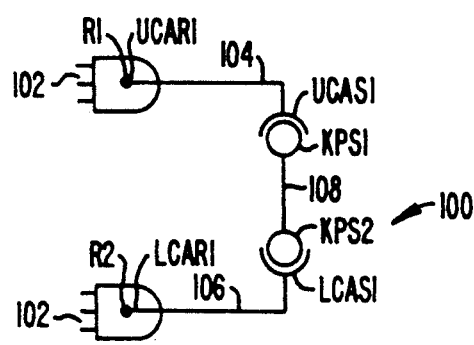
FIG._10.

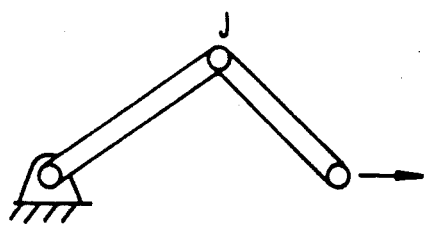
FIG._6a.
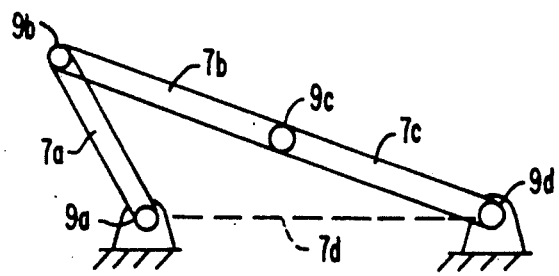
FIG._7a.
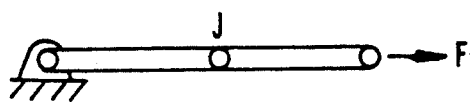
FIG._6b.
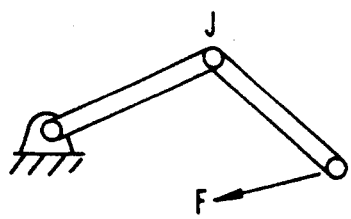
FIG._6c.
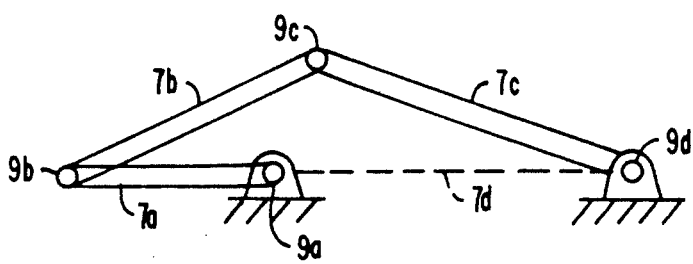
FIG._7b.
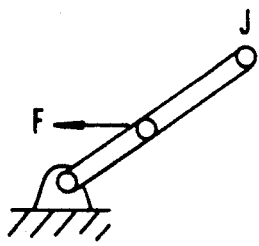
FIG._6d.
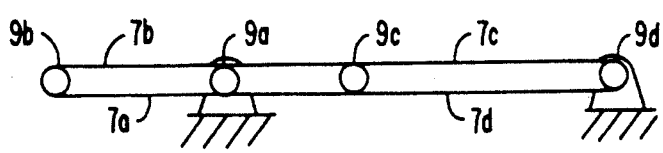
FIG._7c.
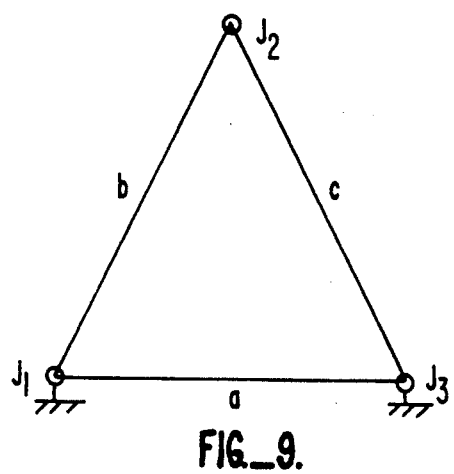
FIG._9.

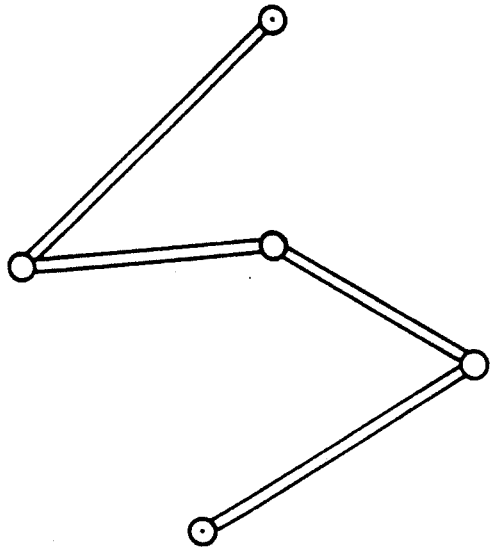
FIG._11a.
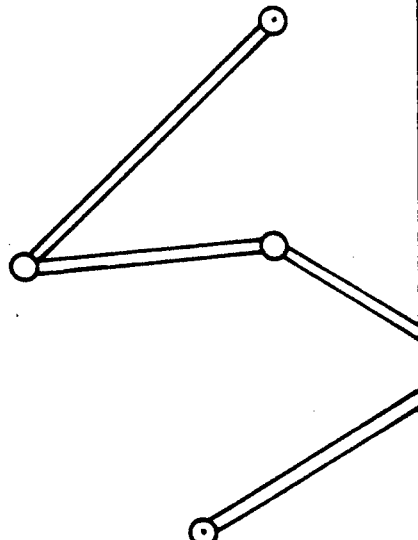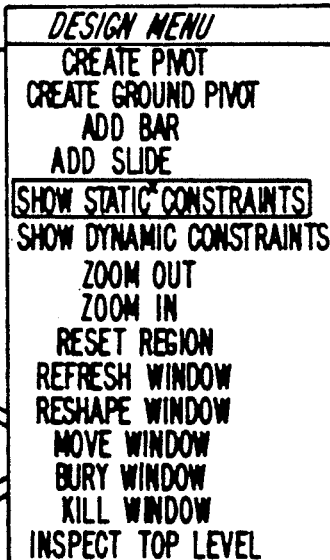
FIG._11b.

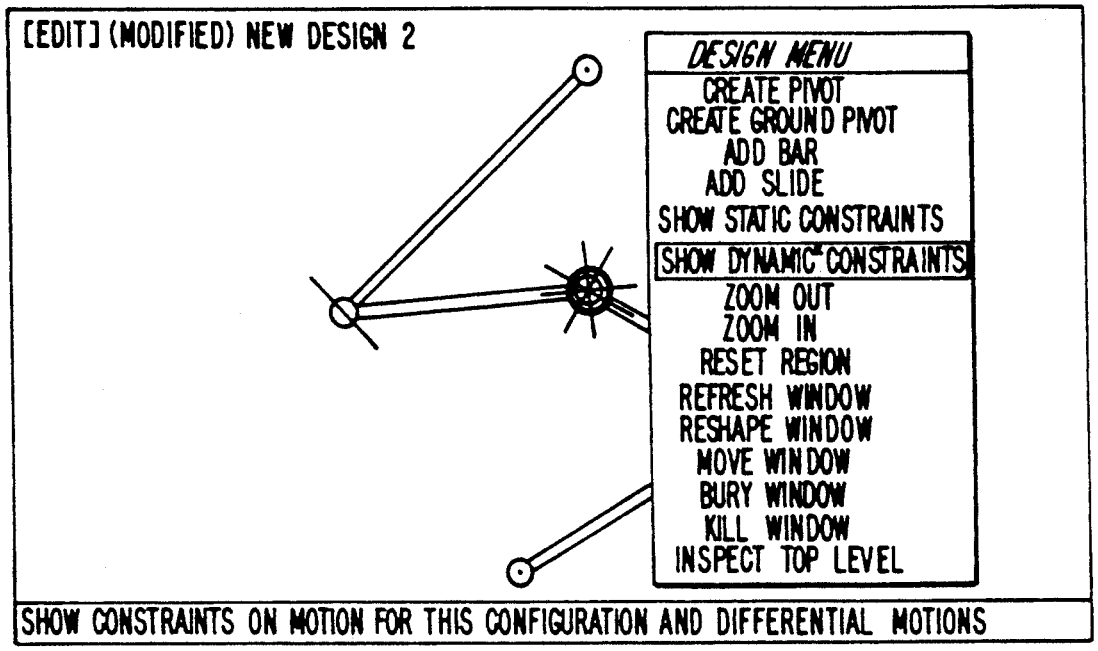
FIG._11d.
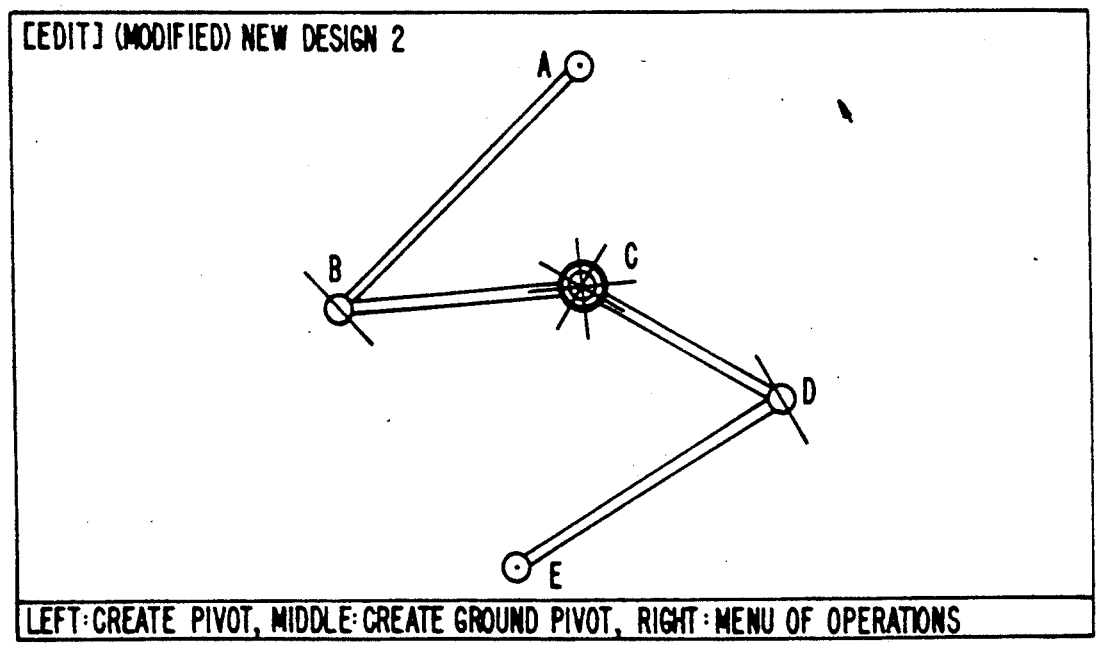
FIG._11c.

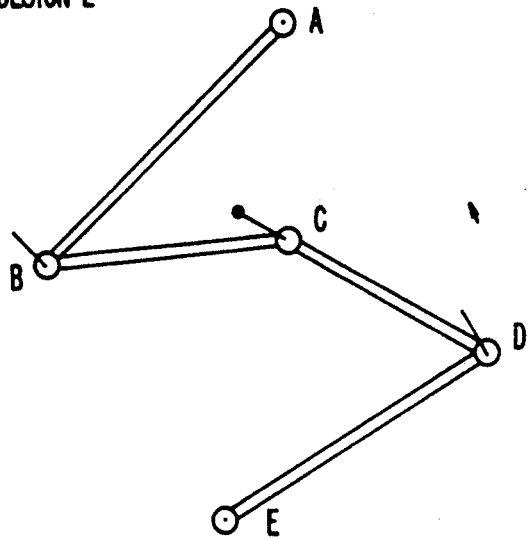
FIG.__11e.
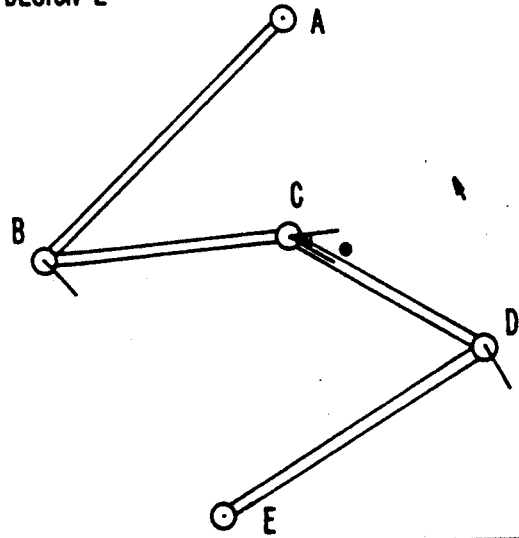
FIG.__11f.

CLOSED-FORM KINEMATICS

The Disclosure herein includes Microfiche Appendices 1 to 4 consisting of 5 sheets of fiche with 487 frames.

COPYRIGHT NOTICE

A portion of this disclosure contains material which is subject to copyright protection. The owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention is related to the design of mechanical devices. In particular the present invention provides a system for the kinematic design of mechanical linkages in computer-aided engineering systems.

2. Description of Related Art

Linkages are found in a large variety of everyday objects. For example, the hinge for an automobile hood, an automobile suspension, aircraft landing gear, assembly line mechanisms, the diaphragm in a camera lens, cranes, typewriter keys, prosthetic devices, bicycle derailleurs, and oil field logging tools are all comprised of linkages. Examination of these mechanisms reveals that a small collection of moving parts can produce very complex motions.

Usually, a kinematic design is the first step in the design of a linkage. Kinematic design is concerned solely with how the mechanism will move, as constrained by its geometric and topological properties. Once a design with satisfactory kinematic properties has been obtained, the designer will take into consideration such things as the physical shape of the links, mass properties of the parts, material strengths, and joint tolerances. A static force analysis may then be done to determine the detailed design of the parts. This may be followed, as necessary, by a quasi-static analysis and a detailed dynamic analysis to determine operating forces, dynamic stresses, maximum velocities and accelerations, vibration modes, etc.

In order to perform the kinematic design of a new linkage, a designer of the linkage must know how to select the types and number of parts, their connectivity, their sizes, and geometries. These are difficult problems for several reasons:

a) A single linkage topology can have many qualitatively distinct ranges of operation. An infinitesimal change in one parameter value can cause the linkage to move from one behavior operating region into another behavioral region with very different characteristics.

b) Equations of motion are quite complex, even for the simplest linkage. Synthesis—which involves inverting the description of the device's behavior—is thus very difficult.

c) A designer must create a linkage which not only has particular motion properties, but also meets other constraints (e.g., the linkage must be readily manufacturable, meet spatial constraints, etc.).

d) Design problems are usually over or under constrained; they are rarely exactly constrained.

The kinematic design of linkages has been the focus of research for over a hundred years. For example, in Burmester, *Lehrbuch der Kinematic*, A. Felix, Leipzig (1888), a method of performing kinematic designs was proposed. In Burmester, a series of geometric theorems were used to determine linkage behavior. Others utilizing similar techniques include Erdman et al., *Mechanism Design*, Prentice Hall, Englewood Cliffs, N.J. (1984), and Hall, *Kinematics and Linkage Design*, Wavelength Press (1986).

Synthesis techniques based on Burmester's theory have many limitations that limit their practical use by many designers. The theory is generally limited to 4-bar and 6-bar planar mechanisms and can economically handle only 4 to 5 "precision points," or points on interest in the mechanism's path. The number of and types of constraints that can be accommodated by Brumester Theory is limited; for example, it is generally difficult to constrain the positions of the ground pivots to specific areas in space. If a problem is overconstrained (e.g., a user may need to specify more than 5 precision points) Burmester Theory is generally not useful because it has not been possible to find a close, but not exact, solution. Finally, the techniques require a fair amount of expertise and mathematical sophistication on the part of the users.

In some domains, structured synthesis techniques make it possible to create whole designs from a functional specification automatically. These techniques tend to work in situations where some subset of the following problem features are present:

a) The space of possible design primitives is finite and parameterizable in some discrete or simple fashion, as in digital circuit design systems and structural design programs. A structured synthesis technique for circuit design is described in, for example, Kowalski, "The VLSI Design Automation Assistant" (1984).

b) A discrete temporal abstraction suffices to describe behavior, transforming a problem with continuously varying parameters into a problem with a finite set of discrete parameters, as in VLSI circuit design. See, for example, Mead et al., "Introduction to VLSI Systems" (1980).

c) The continuously varying parameters of the problem are well-behaved, allowing for such techniques as monotonicity analysis, which effectively partition the parameter-space into a small number of easily characterized regions. See, for example, Cagan et al., "Innovative Design of Mechanical Structures From First Principles" (1988).

Unfortunately, these techniques do not work well in all design domains. In the mechanical engineering domain, for example, engineered objects may have equations of motion that are quite complex, highly non linear, and difficult to comprehend. Trying to understand these descriptions well enough to synthesize new designs is an extremely difficult task. Thus, much design proceeds by the designer building and/or simulating devices, analyzing the designs, and gaining intuition about their behavior over the course of design modification. As experience in the domain is gained, the design cycle is shortened, because the designer has a better idea of what will and will not work for a given problem.

Relying on one's own or on others' experience is presently the most prevalent means of designing mechanisms. Often, designers repeatedly construct the same sort of mechanisms and do not view their domain as linkage design. These designers develop their own terminology, design criteria, and solution methods; Burmester theory and other linkage synthesis techniques are unknown to them. An example of this phenomenon is found in the automobile industry. This industry employs suspension designers, window crank designers, hood mechanism designers, etc., but few of these people have experience in the general problem of linkage design.

Experience with one narrow segment of linkage design does not confer the designer with any special competence at designing other types of mechanisms. When the suspension designer must create a different type of linkage, it is a frustrating, time-consuming task. The analytic tools are hard to use, the design space is too large and convoluted to keep track of easily, and the designer's intuition gained from previous problems often proves useless. Further, because of the complexity and non-continuous nature of the device behaviors, the traditional expert systems paradigm of coupling prototypical examples with a set of design modification operators is not well suited to synthesizing mechanisms, both from the perspective of efficiency and of modelling what human designers do.

In an attempt to overcome these problems, the ADAMS program (Automatic Dynamic Analysis of Mechanical Systems) and IMP (Integrated Mechanisms Program) have been used to simulate mechanical systems. In general, both of these programs use some initial configuration of a mechanical system and project or simulate the position, velocity, acceleration, static, and dynamic forces in the system in response to an applied force by stepping through differentially-small time increments. The ADAMS and IMP programs are described, along with a wide variety of other systems, in Shigley et al., *Theory of Machines and Mechanisms* (1980), which is incorporated herein by reference for all purposes.

A variety of problems arise in the use of the ADAMS program and other similar programs. For example, it is often found that the user has over-constrained the system at which point the simulator ignores certain constraints which have been applied by the user, without his or her knowledge. Programs like ADAMS are specialized for the dynamic analysis of mechanisms, although they claim to be useful for kinematic analysis as well. In a dynamic simulation of a mechanism, mass and interia terms allow the simulation to stay on a single branch of the solution space (there are multiple solutions to both the dynamic and kinematic equations). In a kinematic simulation, there is no mass or interia information, so the simulator exhibits a tendency to "bounce" back and forth between different branches of the solution space, unless the step size used is extremely small.

Further, in kinematic optimization it is often desirable to "re-assemble" a mechanism at a few selected points (the points of interest), rather than simulating a whole cycle of the mechanism. This substantially reduces computer usage and the time necessary to create a design. ADAMS and other similar programs cannot reliably reassemble a mechanism at a few selected points, because when the mechanism is assembled, the mechanism is just as likely to assemble in one configuration as in the other (assuming kinematic assembly only). In a kinematic simulation, ADAMS attempts solves this problem by calling a "dynamic solver" when necessary. The use of a dynamic solver precludes the ability to assemble the mechanism at a select set of points in a reliable and repeatable fashion. The ADAMS program and others are, therefore, incapable of assembling a mechanism at a particular driving input and a particular configuration.

Kota et al., "Dwelling on Design," *Mechanical Engineering* (August 1987) pp. 34–38 describe a method of performing kinematic synthesis (MINNDWELL) in which a user creates a dwell mechanism by manually or semi-automatically designing an output diad (2-bars) to add on to a four-bar mechanism selected from a catalog. No optimization is performed on the dwell mechanism. Further, by using a catalog only, without any form of optimization, the scope of problems which may be solved is extremely limited; to solve a large variety of problems the catalog would be unmanageably large.

In order to optimize a broad range of mechanical linkages various statistical methods have been proposed including simulated annealing, continuation methods, and gradient based optimization. In simulated annealing, an error function is determined as a function of one or more parameters. The error function is minimized by selecting two values of the parameter, determining the error function for the values, and comparing the values of the error function. If the second value of the parameter produces a lower error function, this value of the parameter is selected. If the second value parameter produces a higher value of the error function it may be selected depending on the step and Boltzman probability distribution. Simulated annealing is described in Van Laarhoven et al., "Simulated Annealing: Theory and Applications," D. Reider Pub. Co. (1987).

From the above it is seen that an improved method of performing kinematic analysis is desired.

SUMMARY OF THE INVENTION

A method and apparatus for performing kinematic analyses are disclosed. Before performing detailed analysis of the system using, for example, exact linkage geometry, the motions of the mechanisms links subject to abstract classes of forces are determined, and the configuration of one or more transitions is determined. The method is independent of the exact numerical values of the mechanism's link lengths. The simulation method uses as input a topological description of a linkage (links, joints and joint types, and their connectivity), and an assumed abstract force or set of forces applied to a joint or set of joints. Using the method, the linkage's instantaneous movements subject to the applied forces(s) can be restricted to certain qualitatively distinguishable ranges. Given these ranges of movement, it is possible to calculate the next qualitatively distinct state or set of states to which the mechanism may progress. The set of all legal transitions from one qualitative state to another qualitative state forms a directed graph, herein called an "envisionment." A particular path through the envisionment describes a particular qualitative behavior that a designer intends a mechanism to have.

Each state in the envisionment can only be satisfied if certain geometric constraints hold. By picking a particular path through a mechanism's envisionment, the geometric constraints are used to restrict the possible values of the link lengths to the set of values that satisfy the conjunction of the constraints associated with each state in the envisionment. The negation of constraints associated with states which have been explicitly marked as undesirable can also be used to further restrict the range of parameter values. Thus, by specifying a particular mechanism behavior qualitatively, suitable ranges of parameter values for dimensional synthesis can be determined.

Based on the qualitative analysis (or, alternatively, input from a conventional linkage "catalog"), the linkage is optimized using an improved general purpose optimizer. The method recognizes that a vector objective function is being utilized. In particular, the optimization method uses information about the pattern of changes in the error of each of the individual constraints that make up the error function. A step size for each parameter in the parameter space is determined. Depending how an error function is changing, the optimization method scales its step size and slightly modifies the direction of the step.

In some embodiments, an iterative kinematic solver is used in the optimization. However, in preferred embodiments, a closed form generator is used. The closed form generator generates a non-iterative solution technique.

The closed form generator creates assembly functions for a mechanism. Knowledge of geometry and topology is encoded in the form of rules that are used to "prove" by geometric construction that a mechanism of particular topology can be assembled. When the "proof" is complete, it is run as a procedure to assemble the mechanism. The proof by geometric construction uses a small amount of up-front computer time, but once the proof is complete, run time performance becomes essentially linear in mechanism size rather than cubic.

The method is highly efficient in terms of computer usage and much more stable as compared to prior art systems.

BRIEF DESCRIPTION OF THE DRAWINGS

FIG. 1 provides a general flow chart of the kinematic analysis method and apparatus described herein.

FIG. 2 illustrates a user input screen useful in kinematic synthesis.

FIGS. 3a and 3b illustrate screens showing the optimization process display and a selection menu, respectively.

FIGS. 4a, 4b, and 4c illustrate a single link in a linkage, along with the coordinate system used herein.

FIG. 5 illustrates a 4-bar linkage.

FIGS. 6a to 6d illustrate possible transition states between two links.

FIGS. 7a to 7c illustrate the possible transition states of a 4-bar linkage.

FIG. 8 illustrates the optimization of a linkage.

FIG. 9 illustrates a 3-bar linkage used in illustration of the closed form kinematic analysis method.

FIG. 10 illustrates an automobile suspension.

FIGS. 11a to 11f illustrate the qualitative kinematics methods as it is applied to a 5-bar linkage.

DETAILED DESCRIPTION OF THE INVENTION

CONTENTS

I. General
II. Kinematic Solver
III. Closed Form Generator
  A. Subsystem System
  B. Subsystem Utilities
  C. Subsystem Representation
  D. Subsystem Closed-Form
    1. File Match
    2. File Engine
    3. File 3D-Rules
    4. File 3D-Find
  E. Subsystem Geometry
  F. Subsystem Run-Time
    1. File Primitives
  G. Subsystem Simulation
  H. Subsystem Demo
  I. Application to Optimization
IV. Optimization Method
  A. File Optimization-Spec
  B. File OS-Functions
  C. File Constraint-Definitions
  D. File Optimizer
  E. File Lorenberg-Marquardt-Optimizer
V. Qualitative Kinematics
  A. File Kempe
  B. Files Crosshair-Blinker and Slider-Blinker
  C. Files Pivots, Bar, Angles, Slider
  D. Files Menus and Labels
  E. Files Flavors
  F. File Constraint-System
  G. File Constraint-System-2
  H. File Constraints
VI. Catalog Generation and Selection
  A. File Unisim
  B. File Newpsil
  C. File 1Base
  D. File Graph
  E. File Getpath
  F. File Fourier
  G. File Catalog-Linkages
  H. File Catalog

I. General

A flow chart of the main components of the system disclosed herein is provided in FIG. 1. The designer may first select a mechanism from a catalog 9 via retrieval language 11. The mechanism is optimized with an object-oriented, general-purpose optimizer 10 coupled to a kinematic solver 12. A designer interacts with the system through control panels 14 and views the results of simulations and optimization runs through animated output 16.

The constraints for a given linkage optimization problem are entered in either graphical or textual form via constraint language 18. The Linkage Assistant (TLA) simulator translates the symbolic constraint descriptions into numerical penalty functions to be used in optimization, and maintains a mapping back to the symbolic descriptions for later display. The effect of each constraint on the problem solution is displayed both graphically and textually via constraint display 20.

For many problems, the kinematic solution can be made substantially faster through the use of closed-form generator 22 for kinematic solutions. In a preferred embodiment, a qualitative analysis 13 is performed in lieu of a catalog selection prior to performing detailed numerical analysis. The qualitative analysis procedure defines how the structure will respond to an applied force (qualitatively) and how the structure will pass through various landmark states. TLA may, in some embodiments, be provided with both a qualitative analysis mechanism and a catalog selection of the type known to those of skill in the art.

FIG. 2 shows a control panel for an optimizer, in the process of optimizing a crane design. The problem constraints are shown in the left-most window, labeled "Constraints." A bar graph notation is used to show the relative importance (i.e., what fraction of the total error each constraint contributes) of the different constraints toward achieving a solution. It will of course be apparent that the particular display mechanisms used herein for illustration could readily be replaced by other display mechanisms. For example, pie charts, numerical displays, or color displays (which show "hot spots") could readily be utilized. The middle window, "Information," displays the values of the linkage parameters and other related information. The right-most window is the control panel, which allows the user to simulate the mechanism, to start and stop optimization, and to modify the problem constraint.

A display of the linkage is shown in FIG. 3a. The window in the left shows the initial state of the optimization. In the example shown therein, it is desired that the path of the mechanism pass through points "p0" and "p1" as well as moving in a straight line between height, and position of the mechanism, as shown in the "Constraints" window of FIG. 2. The window on the right of FIG. 3a shows the mechanism after optimization.

A designer may provide an initial guess for the optimization (for example, an existing mechanism that will be incrementally modified), or a guess can be generated directly from the design constraints. In the latter case, problem features may be extracted from the problem specification and used to index into the catalog. Alternatively, the designer may not have a good idea of what constraints to specify, and may choose to browse through the possible paths that the class of mechanism can trace. The path browser interface to the catalog is shown in FIG. 3b. The window on the left is a page from the catalog. Each curve shown is the "average" of a family of related mechanism paths. Each curve family can be inspected. For example, selecting the bottom middle curve on the left-hand window results in the 12 similar mechanism paths of that family being displayed in the right-hand window. Thus, the hierarchical nature of the browser allows the user to find quickly the kind of path required for a particular problem.

In one embodiment, the code for TLA is written in Common LISP, using CLOS (Common LISP Object Standard), and HYPERCLASS for object-oriented substrates (Languages well known to those of skill in the art). CLOS is used to represent linkages comprised of links, joints, markers, different optimizers, optimization specifications (which describe the problem constraints and optimization strategy), and the various constraints used in the problem specification. CLOS is most preferred because of its efficiency in slot accessing, and because it can be compiled efficiently; both are important concerns in the numerically intensive areas of kinematic modelling. HYPERCLASS allows for fast and easy construction of the user interface.

Details of the kinematic solver, the optimization method, the closed form generator, and the qualitative analysis procedure are individually discussed below.

II. Kinematic Solver

The kinematic solver 12 used herein could be an iterative kinematic solver of the type known to those of skill in the art such as the ADAMS solver. In a preferred embodiment a closed form simulation is provided along with an iterative solver. In preferred embodiment, the closed form simulation method is used whenever possible and the iterative kinematic solver is used only for problems or portions of problems which cannot be solved by the closed form kinematic solver.

III. Closed Form Generator

Traditional kinematic solvers often employ some root-finding algorithm (such as Newton-Raphson) on the set of equations defined by joint constraints, which define how the various links are relatively constrained and may be used in the method described herein (see, for example, Turner, et al., "Optimization and Synthesis for Mechanism Design," *Proceedings of AUTOFACT*-88 (1988), which is incorporated herein by reference). These equations are solved numerically, not analytically. However, these solvers are iterative in nature, and have two major drawbacks: they are slow; and they are often unable to distinguish which branch of a solution they are following. The algorithms typically run in time proportional to the cube of the number of joints in the linkage. Many kinematics problems can be solved in closed form (i.e., analytically), even though they are traditionally solved iteratively.

Therefore, in a preferred embodiment, a closed form generator 22 is used to generate a closed form (non-iterative) procedure to assemble a mechanism before it is simulated or optimized. Alternatively, when it is not possible to generate a closed form procedure, the method generates a procedure which uses a mix of closed form and iterative solution techniques. The result is that the kinematic solver requires little or no iteration, permitting the system to run faster than prior art systems. Further, it is possible to reduce or eliminate chaotic behavior in the solution of the system and may result in an explicit representation of which root of an equation is desired (and, hence, the physical manner in which the mechanism is to be assembled).

In general, the method herein provides for the automatic creation of "assembly functions" (alternatively referred to herein as an assembly procedure) for computer simulation and optimization of mechanisms. An assembly function is a function which assigns values to the position and orientation state variables for the bodies that comprise the mechanism, subject to a set of constraints (e.g., the driving inputs of the mechanism, limits on motions, etc.).

Since only a limited number of arithmetic operations are performed for a single mechanism, and since numbers in data structures used in conjunction with the closed form generator may be reset before each assembly, it is possible to use single precision arithmetic in conjunction with the method herein. This results in significant time savings in performing simulations and is difficult to achieve in the use of traditional kinematic solvers such as ADAMS. Traditional kinematic solvers require double precision arithmetic to avoid accumulation of error over a large number of calculations.

The closed form simulation system uses a knowledge-based approach to kinematic assembly. The two forms of knowledge that are required for this approach are geometric knowledge and knowledge of topology. Topological information describes the connectivity of the mechanism. Geometric knowledge is used to determine how to solve constraints, as well as how to generate new constraints that represent partial knowledge about components of the mechanism.

The geometric constraints describing the relative motion between various joints in a mechanism have been known since the late nineteenth century in, for example, Reuleaux, *The Kinematics of Machinery*, MacMillan and Co. (1876). This knowledge is encoded herein in the form of rules that are used to prove by geometric construction that a mechanism of a particular topology can be assembled, given certain driving inputs. These proofs use a set of high-level lemmas each of which has a procedural implementation that solves a specific set of constraint interactions. When the proof is complete it is run as a procedure to assemble the mechanism.

An example problem is used below to compare the traditional and the knowledge-based approaches to kinematic assembly. The simplest possible assembly task is to put together a three-bar truss. The truss, shown in FIG. 9, has three links, a, b and c, and three revolute joints $J_1$, $J_2$ and $J_3$. A revolute joint allows rotational, but not translational relative movement. By considering this a two-dimensional problem, each link need have only three degrees of freedom, denoted by $x_i$, $y_i$, and $\theta_i$, where $x_i$ and $y_i$ designate the location of a point in space and $\theta_i$ represents an angle of a joint from some fixed reference. The symbols a, b and c are used to denote the lengths of the links, as well as their names. The constraint equations describing the truss are shown below, where the $k_i$'s are constants, and where a function value of zero indicates that a constraint is satisfied:

$$f_1 = x_a - k_1$$

$$f_2 = y_a - k_2$$

$$f_3 = \theta_a - k_3$$

$$f_4 = x_a - x_b$$

$$f_5 = y_a - y_b$$

$$f_6 = x_b + b \cos \theta_b - (x_c + c \cos \theta_c)$$

$$f_7 = y_b + b \sin \theta_b - (y_c + c \sin \theta_c)$$

$$f_8 = x_c - (x_a + a \cos \theta_a)$$

$$f_9 = y_c - (y_a + a \sin \theta_a)$$

Equations $f_1$, $f_2$ and $f_3$ state that link a is grounded (i.e., its position and orientation are known). $f_4$ and $f_5$ describe the constraints imposed by joint $J_1$. Link b is free to rotate, as long as one end of it remains mains coincident with the point $(x_a, y_a)$ on link a. $f_6$ and $f_7$ describe the constraints imposed by joint $J_2$, while $f_8$ and $f_9$ describe the constraints imposed by joint $J_3$. These constraints cannot easily be solved by the "one-pass" method in the prior art (e.g., Sutherland et al.). Therefore, a relaxation technique is used. Solving the equations by the Newton-Raphson method involves calculating step sizes for each parameter, updating the parameter values, and iterating until the error is sufficiently low. If $\vec{p}$ is the vector of parameters $(x_a, y_a, \theta_a, x_b, y_b, \theta_b, x_c, y_c, \theta_c)$, then the step vector $\delta\vec{p}$ is calculated by:

$$\left[\frac{df_i}{dp_j}\right][\delta p_j] = [-f_i]$$

Each value in $\vec{p}$ is updated as follows:

$$p'_i = p_i + \delta p_i.$$

When the total error $\epsilon_i f_i$ is sufficiently low, the relaxation process is complete. One problem with this technique is that there are two solutions to the assembly problem; the one shown in FIG. 9, and the mirror image of FIG. 1 about link a. Using Newton-Raphson, there is no way to guarantee which solution will be obtained. Another notable observation is that the Jacobian matrix used in this solution technique is quite sparse:

$$\left[\frac{df_i}{df_j}\right] = \begin{bmatrix} 1 & 0 & 0 & 0 & 0 & 0 & 0 & 0 & 0 & 0 \\ 0 & 1 & 0 & 0 & 0 & 0 & 0 & 0 & 0 & 0 \\ 0 & 0 & 1 & 0 & 0 & 0 & 0 & 0 & 0 & 0 \\ 1 & 0 & 0 & -1 & 0 & 0 & 0 & 0 & 0 & 0 \\ 0 & 1 & 0 & 0 & -1 & 0 & 0 & 0 & 0 & 0 \\ 0 & 0 & 0 & 1 & 0 & -b\sin\theta_b & -1 & -1 & 0 & c\sin\theta_c \\ 0 & 0 & 0 & 0 & 1 & b\cos\theta_b & 0 & 0 & -1 & -c\cos\theta_c \\ -1 & 0 & a\sin\theta_a & 0 & 0 & 0 & 1 & 1 & 0 & 0 \\ 0 & -1 & -a\cos\theta_a & 0 & 0 & 0 & 0 & 0 & 1 & 0 \end{bmatrix}$$

Therefore, the set of equations may be solved using substitution to reduce the sparsity. Consider the following steps (new constants $k_i$ are introduced as needed):

Step 1. Rewrite $f_4$ and $f_5$, using $f_1$ and $f_2$:

$$f_4 = k_1 - x_b$$

$$f_5 = k_2 - y_b$$

Step 2. Rewrite $f_8$ and $f_9$, using $f_1$, $f_2$ and $f_3$:

$$f_8 = x_c - (k_1 + a \cos k_3) = x_c - k_4$$

$$f_9 32\ y_c - (k_2 + a \sin k_3) = y_c - k_5$$

Step 3. Rewrite $f_6$ and $f_7$, using the results of Step 1 and Step 2:

$$f_6 = k_1 + b \cos \theta_b - (k_4 + c \cos \theta_c) = k_6 + b \cos \theta_b - c \cos \theta_c$$

$$f_7 = k_2 + b \sin \theta_b - (k_5 + c \sin \theta_c) = k_7 + b \sin \theta_b - c \sin \theta_c$$

The original problem is now reduced to solving two equations in two unknowns, $\theta_b$ and $\theta_c$. The equations are nonlinear, so there can still be an ambiguity as to which solution is the "right" one.

The rewrite steps performed above are not blind syntactic manipulations of equations; each step has a geometric interpretation Step 1 can be satisfied by the process of translating link b so that point $(x_b, y_b)$ is coincident with point $(x_a, y_a)$ Likewise, Step 2 can be satisfied by the translation of link c so that point $(x_c, y_c)$ is coincident with the other end of link a. The as-yet-unconstrained ends of links b and c must lie on circles of radius b and c, respectively, centered their corresponding fixed ends. The location of $J_2$ can be found by intersecting these circles. Note that two circles intersect in at most two points, which are the two solutions that Newton-Raphson might produce. The assembly of the truss by geometric construction may, therefore, be summarized as follows:

(1) Note that link a is grounded (2) Translate link b to satisfy the coincidence constraint of joint $J_1$.

(3) Translate link c to satisfy the coincidence constraint of joint $J_3$.

(4) Intersect a circle of radius b centered at $J_1$ with the circle of radius c centered at $J_3$ to find the location of $J_2$.

(5) Rotate link b about $J_1$ until its free end is coincident with $J_2$.

(6) Rotate link c about $J_3$ until its conincident with $J_2$.

When this kind of reasoning is extended from two dimensions to three, there is no longer a simple mapping between state variables denoting a link's degrees of freedom and the solution of the constraint equations. For example, a rotational axis in three-dimensional space defines a complex set of relations between the rotational parameters of an object. Constraining the orientation of a link to a rotational axis does not necessarily fix any of the rotational state variables, but it makes later solution easier when other constraints are determined. By reformulating the kinematic assembly problem from algebraic equations to geometric constraints, a more usable understanding of the problem may be had.

One important aspect of solving these problems efficiently and easily lies in solving for the mechanism's degrees of freedom, rather than trying to solve for its state variables. Describing the state of a rigid body is through its degrees of freedom is more natural and flexible.

A rigid body in 3-space has six degrees of freedom. These can be specified by the use of six state variables as in an algebraic formulation. The state variables define a mapping between the local coordinate system of the rigid body and the global coordinate system of the world. The six state variables may be denoted $<x,y,z,\theta_x,\theta_x,\theta_z>$, where the sub-tuple $<x,y,z>$ denotes the position of the origin of the local coordinate system in global coordinates, and the sub-tuple $<\theta_x,\theta_x,\theta_z>$ denotes the rotation of the axes relative to the global coordinate system. Fixing the value of a state variable of a rigid body implies removing one degree of freedom from the body. However, fixing a degree of freedom in a body does not imply determining one of its state variables. Pinning down a degree of freedom may instead introduce a complicated set of relations between several state variables. Consider the following Suppose a particular point p is constrained on a body B to be fixed in space. This removes three degrees of freedom from the body (it is still free to rotate about p). However, this constraint does not allow us to determine any of the state variables of B. If p were at $<0,0,0>$ in B's local coordinates, then $<x,y,z>$ would be fully known. But in general, p could be at any position in B's local coordinates, so $<x,y,z>$ is constrained to lie on a sphere centered at p. Since a sphere is a surface with two degrees of freedom, this constraint accounts for one of the degrees of freedom that was removed. The other two degrees of freedom contribute to relations between the rotational and translational state variables. If the point $<x,y,z>$ is placed at some position (u,v) on the aforementioned sphere, this new point and p together define an axis of rotation for B; that is, B now has only one rotational degree of freedom remaining. The axis of rotation could be at an arbitrary angle with respect to B's local coordinate system, so it defines a complex relation between $\theta_x,\theta_y,\theta_z$. Thus, fixing point p on body B has not determined any of the six state variables, but rather has specified a set of complicated nonlinear constraints between all six state variables.

Pinning down degrees of freedom is substantially easier than attempting to derive the complex relations between the state variables of all links in a mechanism. In fact, there is a body of literature concerning graphical analysis of mechanisms, dating from the late nineteenth century; some textbooks still introduce kinematic analysis using graphical methods.

In a mechanism, a joint between links A and B causes points on link B to be constrained relative to link A's coordinate system (and conversely). The geometric constraints describing the relative motion between various joints used in mechanisms were investigated by Reuleaux in 1876. The loci of possible positions for as-yet unconstrained points on links are relatively simple surfaces and curves, such as planes, spheres, cylinders, circles, lines, etc. A joint attached to links A and B must satisfy some constraints relating to the loci of possible motions from link A and B. Thus, by intersecting the geometric constraints of link A and B, more information is derived concerning the exact location of the joint. As joints are located, they further restrict the degrees of freedom of the links they connect. In this way, increasingly more specific information about the positions and orientations of the mechanism's links may be derived.

Example

A second example is provided in FIG. 10 in which a simple automobile suspension 100 is illustrated. The suspension includes ground 102, upper control arm 104, lower control arm 106 and pin 108. The driving input on the mechanism is $\theta$, the angle between the lower control arm and ground. For purposes of the discussion below, grounds 102 are represented by markers R1 and R2, the left end of the upper control arm is represented by marker UCAR1 and the right end is indicated by marker UCAS1, the left end of the lower control arm 106 is indicated by marker LCAR1 and the left end is indicated by LCAS1, and the upper and lower ends of king pin 108 are indicated by markers KPS1 and KPS2, respectively (S indicating spherical joint and R indicating revolute joint).

For each marker there can be knowledge of alignment, orientation, and/or position. Initially, there is no knowledge of any of these items. The angle of the lower control arm is designated as the input. Each joint imposes constraints (which are stored in a database) between the two markers that participate in that joint. For example, a spherical joint imposes the constraint that the two markers be coincident, while a revolute joint imposes the constraint that the two markers be coincident and that their z-axes are aligned.

To start, the method works its way around the linkage and fills in knowledge in a "table" which arises from givens of the system. To fill in the table, the TLA system will have to postulate that certain actions have been carried out that will ensure the inferences are valid. These actions will then be turned into a program to assemble the linkage.

The method is iteratively applied to fill in Table 1:

TABLE 1

| | R1 | R2 | UCAR1 | UCAS1 | LCAR1 | LCAS1 | KPS1 | KPS2 |
|---|---|---|---|---|---|---|---|---|
| Alignment? | | | | | | | | |
| Orientation? | | | | | | | | |
| Positon? | | | | | | | | |

The method goes through cycles of deductions. The cycles include steps of choosing any applicable inference, generating an operation to be performed on the linkage, recording newly known information, and testing whether the process is complete. In the present case, the process begins a cycle in which, since the ground "link" is fully known, its position, orientation, and alignment are known. Therefore, the first inference which is chosen is that since the markers R1 and R2 are grounded, their position, orientation, and alignment are known. The newly recorded information is reflected in Table 2 below. This first inference is stored for later uses.

TABLE 2

| | R1 | R2 | UCAR1 | UCAS1 | LCAR1 | LCAS1 | KPS1 | KPS2 |
|---|---|---|---|---|---|---|---|---|
| A? | | | | | | | | |
| O? | | | | | | | | |
| P? | | | | | | | | |

Since a significant amount of information is not yet known, the process continues. In a second cycle the inference which is chosen is that marker R1 is known and shares a position with UCAR1. Provided that the upper control arm is translated so that markers UCAR1 and R1 are coincident, the position of marker UCAR1 can be known. This requires an action: "Translate the upper control arm to make UCARI coincident with R1." A similar cycle can be carried out for LCAR1, after which the knowledge table can be updated as shown in Table 3.

TABLE 3

| | R1 | R2 | UCAR1 | UCAS1 | LCAR1 | LCAS1 | KPS1 | KPS2 |
|---|---|---|---|---|---|---|---|---|
| A? | | | | | | | | |
| O? | | | | | | | | |
| P? | | | | | | | | |

The next cycle uses the "knowledge" that since markers UCARI and R1 are joined at a revolute joint, their x axis (extending out of the page) must be aligned. At this point the program of "actions" looks like:
1. Cache markers on ground link.
2. Translate upper control arm to make UCAR1 coincident with R1.
3. Translate lower control arm to make LCAR1 coincident with R2.

As can be seen in Table 3, the z axis of R1 is already known, so the action that must occur to align the axes is to rotate the upper control arm to align the axes. This rotation must be about the point in space occupied by marker UCAR1, since rotation about any other point would cause its position (previously marked as shown) to be changed. A similar line of reasoning allows the alignment of the z axes of marker R2 and marker LCAR1. Table 4 illustrates the state of knowledge at this point:

TABLE 4

| | R1 | R2 | UCAR1 | UCAS1 | LCAR1 | LCAS1 | KPS1 | KPS2 |
|---|---|---|---|---|---|---|---|---|
| A? | | | | | | | | |
| O? | | | | | | | | |
| P? | | | | | | | | |

With the new actions added, the program of actions is now:
1. Cache markers on ground link.
2. Translate upper control arm to make UCAR1 coincident with R1.
3. Translate lower control arm to make LCAR1 coincident with R2.
4. Rotate upper control arm about UCAR1 to make the z axis of UCAR1 align with the z axis of R1.
5. Rotate lower control arm about LCAR1 to make the z axis of LCAR1 align with the z axis of R2.

It can also be seen that the alignment and orientation of the spherical joints KPS1, KPS2, LCAS1, and UCAS1 are not necessary because the only constraints on spherical joints are that their markers be coincident; there are no constraints on the relative alignment or orientation of the two markers. Accordingly, Table 4 can be modified as shown in Table 5 where "X" means that the system does not care whether the value is found or not because it is not needed:

TABLE 5

| | R1 | R2 | UCAR1 | UCAS1 | LCAR1 | LCAS1 | KPS1 | KPS2 |
|---|---|---|---|---|---|---|---|---|
| A? | | | | X | | X | X | X |
| O? | | | | X | | X | X | X |
| P? | | | | | | | | |

The next inference uses knowledge of the driving input $\theta$ to set the relative orientation of markers LCAR1 and R2. These markers are already aligned. For the driving input constraint to be satisfied, the lower control arm must be rotated about the z axis of LCAR1 until the x axis of LCAR1 makes an angle of $\theta$ with the x axis of R2. Now marker LCAR1 has a position and an orientation (a marker having an orientation implies the marker also has an alignment, since an alignment is a prerequisite to orienting the marker). Thus, the marker has no more degrees of freedom, implying that the link it is attached to must be in its final place for this assembly. Whenever a marker on a link has both a position and an orientation, then its associated link may be marked as "known." Thus, the next action is to cache the markers on the lower control arm. This means all markers on the lower control arm have known positions, alignments, and orientations. Table 6 reflects the new state of knowledge.

TABLE 6

|    | R1 | R2 | UCAR1 | UCAS1 | LCAR1 | LCAS1 | KPS1 | KPS2 |
|----|----|----|-------|-------|-------|-------|------|------|
| A? |    |    |       | X     |       | X     | X    | X    |
| O? |    |    |       | X     |       | X     | X    | X    |
| P? |    |    |       |       |       |       |      |      |

The program of actions now looks like:
1. Cache markers on ground link.
2. Translate upper control arm to make UCAR1 coincident with R1.
3. Translate lower control arm to make LCAR1 coincident with R2.
4. Rotate upper control arm about UCAR1 to make the z axis of UCAR1 align with the z axis of R1.
5. Rotate lower control arm about LCAR1 to make the z axis of LCAR1 align with the z axis of R2.
6. Twist lower control arm about z axis of LCAR1 to make x axis of LCAR1 make an angle of $\theta$ with the x axis of R2.
7. Cache markers on link lower control arm.

Provided that the kingpin is translated so that markers LCAS1 and KPS2 are coincident, the position of marker KPS2 can be known. This requires an action: "Translate kingpin to make KPS2 coincident with LCAS1." Table 7 shows the state of knowledge at this point:

TABLE 7

|    | R1 | R2 | UCAR1 | UCAS1 | LCAR1 | LCAS1 | KPS1 | KPS2 |
|----|----|----|-------|-------|-------|-------|------|------|
| A? |    |    |       | X     |       | X     | X    | X    |
| O? |    |    |       | X     |       | X     | X    | X    |
| P? |    |    |       |       |       |       |      |      |

The program of actions now looks like:
1. Cache markers on ground link.
2. Translate upper control arm to make UCAR1 coincident with R1.
3. Translate lower control arm to make LCAR1 coincident with R2.
4. Rotate upper control arm about UCAR1 to make the z axis of UCAR1 align with the z axis of R1.
5. Rotate lower control arm about LCAR1 to make the z axis of LCAR1 align with the z axis of R2.
6. Twist lower control arm about z axis of LCAR1 to make x axis of LCAR1 makes an angle of $\theta$ with the x axis of R2.
7. Cache markers on link lower control arm.
8. Translate the kingpin to make KPS2 coincident with LCAS1.

It is now noted that there is a constraint on UCAS1, i.e., it must lie on a circle with its center on R1. This constraint comes from restrictions on link movement imposed by the revolute joint that connects R1 and UCAR1. This constraint is stored along with the information shown in Table 7, as shown in Table 8 (which includes an entry for "constraint," which is part of the structure of the table and has been deleted above for simplicity):

TABLE 8

|            | R1 | R2 | UCAR1 | UCAS1  | LCAR1 | LCAS1 | KPS1 | KPS2 |
|------------|----|----|-------|--------|-------|-------|------|------|
| A?         |    |    |       | X      |       | X     | X    | X    |
| O?         |    |    |       | X      |       | X     | X    | X    |
| P?         |    |    |       |        |       |       |      |      |
| Constraint |    |    |       | Circle |       |       |      |      |

It can now be noted that KPS2 and LCAS1 are coincident markers on a spherical joint. Therefore, KPS1 must lie on a sphere around the marker KPS2. This information is added to Table 8, as shown in Table 9:

TABLE 9

|            | R1 | R2 | UCAR1 | UCAS1  | LCAR1 | LCAS1 | KPS1   | KPS2 |
|------------|----|----|-------|--------|-------|-------|--------|------|
| A?         |    |    |       | X      |       | X     | X      | X    |
| O?         |    |    |       | X      |       | X     | X      | X    |
| P?         |    |    |       |        |       |       |        |      |
| Constraint |    |    |       | Circle |       |       | Sphere |      |

The next inference/deduction chosen is to intersect the constraints of UCAS1 and KPS1 since they are constrained markers on the same joint. Since there are two possible intersection points the program must obtain additional input from the user which will indicate whether the joint should be assembled in the configuration shown in FIG. 10 or an "other" possible manner. After this intersect procedure is conducted, the position of UCAS1 and KPS1 are known. Table 9 can now be amended as shown in Table 10:

TABLE 10

| R1 | R2 | UCAR1 | UCAS1 | LCAR1 | LCAS1 | KPS1 | KPS2 |
|---|---|---|---|---|---|---|---|
| A? |   |   | X |   | X | X | X |
| O? |   |   | X |   | X | X | X |
| P? |   |   |   |   |   |   |   |

The program of actions is now:
1. Cache markers on ground link.
2. Translate upper control arm to make UCAR1 coincident with R1.
3. Translate lower control arm to make LCAR1 coincident with R2.
4. Rotate upper control arm about UCAR1 to make the z axis of UCAR1 align with the z axis of R1.
5. Rotate lower control arm about LCAR1 to make the z axis of LCAR1 align with the z axis of R2.
6. Twist lower control arm about z axis of LCAR1 to make x axis of LCAR1 makes an angle of $\theta$ with the x axis of R2.
7. Cache markers on link lower control arm.
8. Translate kingpin to make KPS2 coincident with LCAS1.
9. Intersect the circle (centered at R1 whose normal is the z axis of R1 and whose radius is the distance from UCAS1 to the z axis of R1) with the sphere (centered at KPS2 whose radius is the distance between KPS1 and KPS2). Rotate upper control arm about z axis of R1 so that UCAS1 is at the intersection point. Rotate kingpin about KPS2 so that KPS1 is at the intersection point.

There is now enough information to determine that the upper control arm link is completely known (namely, two positions and an alignment). Thus, the next action is to cache all the markers, i.e., compute the global position of all the markers on the link on upper control arm. This means that the orientation of UCAR1 is now known. Table 10 can now be completed as shown in Table 11:

TABLE 11

| R1 | R2 | UCAR1 | UCAS1 | LCAR1 | LCAS1 | KPS1 | KPS2 |
|---|---|---|---|---|---|---|---|
| A? |   |   | X |   | X | X | X |
| O? |   |   | X |   | X | X | X |
| P? |   |   |   |   |   |   |   |

6. Twist lower control arm about z axis of LCAR1 to make x axis of LCAR1 makes an angle of $\theta$ with the x axis of R2.
7. Cache markers on link lower control arm.
8. Translate kingpin to make KPS2 coincident with LCAS1.
9. Intersect the circle (centered at R1 whose normal is the z axis of R1 and whose radius is the distance from UCAS1 to the z axis of R1) with the sphere (centered at KPS2 whose radius is the distance between KPS1 and KPS2). Rotate upper control arm about z axis of R1 so that UCAS1 is at the intersection point. Rotate kingpin about KPS2 so that KPS1 is at the intersection point.
10. Cache markers on upper control arm.
11. Cache markers on kingpin.

This set of actions is now compiled and stored as a program that may be used iteratively to solve the mechanism's marker locations for different values of driving inputs.

Not all mechanisms may be simulated using this method. Linkages exist for which techniques like relaxation or continuation are the only recourse. However, a majority of linkages of interest to real designers may be simulated using the new approach. The closed form approach to linkage simulation has significantly better computational properties than traditional simulation algorithms for the following reasons:

The algorithm is substantially faster than existing methods. Although the proof by geometric construction has a complexity which is polynomial in the size of the mechanism, the complexity of the The link kingpin has only two markers, neither of which has orientation or alignment. There is not enough information to fully determine its position. In fact, it can be seen that the kingpin is free to rotate without affecting its performance in the context of this linkage. This is known in the literature as a passive degree of freedom. TLA recognizes this situation and marks the kingpin as being fully known. (In a real auto suspension, the kingpin would be connected to the steering linkage; this connection would give the kingpin three markers, and then it could be located in space.) The kingpin markers may now be cached.

The final program of actions is shown below:
1. Cache markers on ground link.
2. Translate upper control arm to make UCAR1 coincident with R1.
3. Translate lower control arm to make LCAR1 coincident with R2.
4. Rotate upper control arm about UCAR1 to make the z axis of UCAR1 align with the z axis of R1.
5. Rotate lower control arm about LCAR1 to make the z axis of LCAR1 align with the z axis of R2.

assembly procedure it derives grows linearly with mechanism size. Thus the run-time performance of the program is linear in the size of the mechanism rather than cubic. The storage required by the assembly procedure is also linear in mechanism size, as opposed to the quadratic dependence exhibited by traditional assembly methods.

The branches of the solution space are described by a vector of "configuration variables." In this way, a particular branch of the solution may be specified for mechanism assembly, avoiding the problem of ambiguous assembly.

Redundant information can be accomodated easily. Since constraints on the mechanism are being solved sequentially, there is no need to balance the number of constraints with the number of unknowns (as in relaxation techniques).

A variety of other analysis tasks may be solved using generalizations of the knowledge-based kinematic assembly technique. Some of these include:

Finding the instant centers of rotations of the various links in a mechanism. The instant center of rotation is the point in space about which the link can be considered to rotate at a given particular instant. In three dimensions, the instant center is defined by a screw axis.

Determining kinematic velocities and accelerations, i.e., how a link moves or accelerates with respect to the movement of another part of the mechanism.

Determining mechanical advantage and torque ratios. These are measures of the "leverage" that is generated by the mechanism.

Determining Jacobian matrices in closed-form for use in optimization and sensitivity analysis.

Appendix 1 provides source code (in common LISP) for implementing the closed-form kinematics method disclosed herein. The code has been used on a Symbolics LISP machine and a Sun Workstation, but it will be apparent to those of skill in the art that the method could be adapted to any one of a variety of programming languages (e.g., pascal) and used on any one of a variety of hardware systems (e.g., IBM, DEC, etc.). Appendix 2 provides a worked-out example which provides the closed form results for an automobile suspension. The file spatial-Four-Bar defines the spatial four bar linkage which is used in the example.

The method approaches the assembly of a linkage as a matter of geometrical theorem-proving. To find a way of assembling the linkage is to construct a proof that the linkage can, in fact, be assembled. The proposition that a certain linkage can be assembled, given that certain information is provided about it, is referred to herein as an assembly theorem. Given a linkage and told what initial information will be provided about it, the TLA system attempts to prove the corresponding assembly theorem. As it does so, it derives a procedure for assembling the linkage given that initial information.

This assembly procedure is stored away for future use. It is very fast, operates in a fixed set of data structures, and can be called repeatedly. Since the assembly theorem's proof does not depend on any of the numerical values of a given linkage, such as the exact locations or sizes of the links and joints, the user can vary any or all of these values at will without having to derive a new assembly procedure. The system checks automatically to ensure that the assembly theorem does not depend on the numerical values of the linkage. For example, the assembly theorem's proof might depend on three points on a certain link not being colinear. A change in the link's structure that brought these three points onto a common line would require the system to locate a new proof of the assembly theorem, if in fact one exists. Such situations are not common.

An assembly procedure takes several inputs. It takes a fully specified linkage, including the sizes and shapes of all its links, the locations of the various joints on these links, and the types of the various joints. (The attached code provides for revolute, prismatic, spherical, universal, cylindrical, and planar joints.) It also takes a number of "input parameters," that is, the values of some of the parameters of certain of the linkages's joints, such as the angle between the two links that are attached by a certain revolute joint or the displacement of a certain prismatic joint. Finally, an assembly procedure must often be supplied with a number of binary configuration parameters to resolve qualitative ambiguities in the assembly of the linkage such as mirror-image pairs of possible ways of assembling portions of the linkage.

The TLA system can be usefully divided into four major parts, each of them organized into a number of subsystems. Each subsystem is further divided into a number of files.

The first part consists of relatively task-independent utility routines (in the subsystem Utilities), data structures and library functions for 3-D geometry (in the subsystem Geometry), together with the task-specific representations of linkages, links, joints, and so forth and the common operations upon them (in the subsystem Representation).

The second part is the code in the subsystem Closed-Form that takes as input a qualitative description of a linkage and a specified set of input parameters and produces as output an assembly procedure. The "computation" in this part of the system is entirely symbolic.

The third part is the code that is used in assembling particular linkages. The computation in this part of the system, by contrast, is heavily numerical. In addition to the procedures that compute the positions and orientations of the various elements of a linkage (in the subsystem Run-Time), this part of the system also includes routines for graphically displaying linkages and tracing their motion (in the subsystems Window and Display).

The fourth and final part is an open-ended set of routines that ask for assembly procedures to be constructed and then actually use them for various useful ends such as simulating a linkage's motion (in the subsystem Simulate), exploring the consequences of varying a linkage's parameters (in the subsystem Demo), and then actually adjusting those parameters to optimize particular properties of the linkage (in the subsystem Optimization, which is discussed in Section IV below.

The TLA system employs a number of software techniques that might not be wholly familiar. For example, object-oriented programming is utilized. TLA is written in Lisp because of the programming environments that are available for rapid prototyping of symbolic systems in Lisp. Little of this code should be difficult to translate to a language such as Pascal. Some of the code will not translate directly, though, because it is written using an object-oriented extension to Lisp called PCL. Object-oriented programming allows particular procedures, known as methods, to automatically dispatch to different routines depending on the types of their arguments. PCL also supports a reasonably sophisticated model of data types in which types can be arranged in a hierarchy of more abstractly and more concretely specified structures. Object-oriented programming in general and PCL in particular are described in the PCL Manual, available from Xerox. Other unusual techniques are included with the discussion of the code below, along with details of each subsystem.

A. Subsystem System

Subsystem System comprises two short files that are the first to be loaded and define some parameters for the remainder of the TLA system. It has two files, TLA-System and Global-Variables.

The file TLA-System is what the Symbolics Genera environment refers to as the "system definition" for the system named TLA. This system definition, established using the Defsystem form, permits the several files making up the TLA system to be compiled and loaded all at once in a reasonable fashion. The system definition also makes explicit the decomposition of the TLA system into the subsystems described herein.

The file TLA System is specific to the Symbolics Genera environment. A similar file could readily be prepared by those of skill in the art for other LISP implementations (e.g., Lucid Common Lisp) due to lack of standards for system definition files in Common Lisp.

B. Subsystem Utilities

Subsystem Utilities comprises a disparate set of domain-independent utility routines, ranging from simple arithmetic routines to moderately elaborate extensions to the syntax of Lisp and PCL.

Subsystem Utilities comprises seven files:
Defmethod-Coercing;
Utilities;
Domacros;
Matrix;
Selectp;
Square-Arrays; and
Hardcopy-Patch.

The file Defmethod-Coercing contains an extension to the syntax of the PCL language to allow the user to specify automatic type coercion of method parameters. Most commonly this is used to allow a PCL method to specify that some parameter can be any sort of number to automatically coerce the number to a specific type (e.g., integer or single-float) before running the code in the body of the method.

The file Utilities contains code for manipulating symbolic structures representing bits of Lisp-like code, together with some simple numerical and debugging facilities.

The file Domacros contains some extensions to Lisp syntax for simple control structures for iterating over lists, such as applying some procedure to every element of a list or finding the largest element in a list. These forms are clear and convenient, but the coding cliches they capture are easy enough to write without any special syntax.

The file Matrix contains a collection of standard library routines for manipulation matrices, such as matrix multiplication and inversion. The code in the file Transform uses some of these routines to implement the standard operations on 4×4 matrix transforms.

The file Selectp contains an extension to Lisp syntax called Selectp which is very useful for writing compilers and other symbolic programs. Selectp is not very heavily used in the rest of the TLA system and is never essential. The file Square-Arrays contains the datastructure definitions and simple utility routines for 2×2 and 3×3 arrays. The file Hardcopy-Patch is a routine for making hardcopy from Lisp Machine color monitors.

C. Subsystem Representation

The TLA system models linkages and their internal structures using a set of datastructures built up out of instances of PCL classes. The files in Subsystem Representation define these PCL classes. This file describes some of the important representational concepts. The individual files here that document the respective files in Subsystem Representation (Representation, Marker, Link, Joint, Tracer, Linkage, and Parameterize) go into more detail about how this functionality is implemented on the level of Lisp and PCL code.

Some of the classes defined in Subsystem Representation, Linkage and Link, have a clear physical significance in that they represent definite physical structure. Others, Marker and Tracer, only mark locations on these structures and do not correspond to any piece of hardware.

The final class, Joint, is more ambiguous. In physical reality a joint is likely to be a set of mating features in two links such that, when fitted together, they restrict the relative motion of the two links. TLA, though, represents a joint simply in terms of its joint type (revolute, prismatic, spherical, cylindrical, universal, or planar) and the two places, represented by markers, at which the joint joins its two links.

Of these classes, the two most significant classes are Link and Marker. The code in Subsystem Closed-Form, which constructs the assembly procedure for a linkage with given input parameters, makes constant reference to links and markers and only makes peripheral, though of course necessary, use of linkages and joints. Tracers are used for display purposes, to trace out the path followed by some marker in the course of a kinematic simulation.

The notion of marker is important in the TLA system. A marker is a "spot" on a link. The marker has a fixed position and orientation in the link's local coordinate system. As the link translates and rotates in space, the marker translates and rotates along with it. The locations of the markers on a given link are defined by the user when defining a linkage class using the Define-Linkage-Class form (in file Parameterize) and they stay fixed forever, or until the user redefines that linkage class. (A linkage class is a linkage without its particular numerical values for global location and position and so forth.)

Although one may place a marker anywhere on a link, typically one chooses locations of particular physical significance. In practice, the vast majority of the markers on links are placed where joints attach to links. Other markers, placed explicitly by the user, might have ornamental function as well. In the Suspension demo, for example (in Subsystem Demo, file Suspension), such ornamental markers are specified in the Define-Linkage-Class for the linkage class Suspension to give the links called Upper-and Lower-Control-Arm something like the familiar shapes they have in real automobile suspensions.

All links and most markers have a transform by which they can be located and oriented in global coordinates. That is to say, each of these links and markers has a slot in its instance where such a transform belongs, and it is the job of the assembly function to actually compute this transform as it positions and orients the various components of a linkage in 3-space. A marker also has a slot to keep track of its position in the local coordinate system of its link.

Some markers need orientations and some do not, depending on whether the rule system will ever have occasion to make inferences about their orientations. The following discussion illustrates the use of position and orientation for markers. It also illustrates how joint constraints are described in terms of marker position and orientation relations.

Consider the case of two links, A and B, joined by a cylindrical joint J. Each link will have a marker, Ma and Mb, respectively, marking the place where the joint J attaches to the link. What inferences can the TLA system make about this situation? The two markers do not necessarily occupy the same location, as they would if the joint were a "coincident" joint, that is, a revolute, spherical, or universal joint. Instead, a cylindrical joint, like a prismatic or planar joint, is a "displaced" joint. (A planar joint differs from the other two in that it can be displaced in two dimensions. This representational problem is discussed in Subsystem Closed-Form.)

The two markers must lie on a particular line, the line along with the cylindrical joint can be displaced. To represent this fact, the system adopts the convention that the z axis of each marker's own local coordinate system lies along this line of displacement. If we believe the two markers, Ma and Mb, to actually lie along this line, then, since the joint J is a "coaligned" type of joint, inference can be made that the two markers' z axes are aligned. This inference, which is made at compile time, corresponds to an actual operation on the respective links A and B at run-time. The assembly procedure will actually call a procedure named Align-Z-Z-Axes, passing it A, B, Ma, and Mb. Although Align-Z-Axes procedure is defined in terms of the two markers, it actually operates on the links A and B themselves, rotating them so as to preserve the locations of Ma and Mb while causing their z axes to come into alignment. This is a typical step in the assembly of a linkage.

Suppose, now, that the joint in question, J, is not a cylindrical joint but a prismatic joint. All of the reasoning described so far goes through just the same, but now an additional inference is possible. Whereas a cylindrical joint is simply coaligned, a prismatic joint is also "cooriented." In other words, since the two links comprising a prismatic joint, unlike the links comprising a cylindrical joint, cannot rotate relative to one another around the line of displacement, it may be inferred that the x axes of their two markers are also aligned. The compiler will make this inference and will add to the assembly procedure a call on a procedure named Align-X-Axes. The Align-X-Axes procedure is very similar to the Align-Z-Axes procedure except, that it aligns the x axes of the two markers instead. The Align-X-Axes procedure also has an easier job in that it assumes that the z axes are already aligned, so that aligning the x axes too necessarily involves only rotations around the markers' z axes.

In the Subsystem Representation, the file Representation contains the Defclass forms defining the classes Link, Marker, Alignable-Marker, Joint, Tracer, and Linkage. The file Marker contains basic facilities for making, computing with, and displaying markers, including routines for supporting useful abstractions concerning the markers' positions and orientations. The file Link contains basic facilities for making, computing with, and displaying links. The file Joint contains basic facilities for making and displaying joints. Joints do not take part in any very complicated computations, since almost all the actual inference and assembly computation is defined in terms of markers. Displaying joints, however, is a fairly elaborate matter, and the bulk of this file consists of code that interfaces with the facilities in Subsystem Display, specifying various ways in which joints might be drawn. The file Tracer contains basic facilities for making and displaying tracers. A tracer's Display method must remember where the tracer was last displayed so that it can trail a line behind itself as it moves. The file Linkage contains code for supporting linkages. Since most of the real work is done with the components of a linkage, rather than with the linkage's class instance itself, the code here is principally concerned with initialization, getting the linkage into the desired consistent state before the compilation of an assembly function for the linkage begins.

The file Parameterize is by far the most complex in Subsystem Representation. It implements the Define-Linkage-Class form, which constructs linkage classes (that is, linkages that have not yet been assembled in any particular way) by calling the procedures that make new linkages, links, joints, markers, and so forth. Define-Linkage-Class has a fairly complicated syntax that permits linkages to be flexibly specified in terms of user-provided parameters. Industry standard description languages, such as the ADAMS input language, convey the same information, and one skilled in the art may easily translate between such languages.

D. Subsystem Closed-Form

The job of the code in subsystem Closed-Form is to take a linkage and a set of input parameters and to produce an assembly procedure. It is, in a certain sense, a linkage compiler. The resulting assembly procedure calculates the various positions and orientations of the linkage's components directly without any need for iterative relaxation. In this sense, it is a "closed form" calculation, thus the name of this subsystem. Compiling a linkage is a complex job because there is no one easy way to assemble a linkage. Instead, the linkage compiler must work opportunistically, noticing which aspects of the linkage allow necessary information about the various links' positions and orientations to be computed from known information.

The compiler's job is, in terms of logical inference, proving step-by-step that the linkage can be assembled and keeping track of what operations would be required to perform the assembly, finally turning this sequence of operations into an assembly procedure. The inference process can, in turn, be thought of as a matter of placing labels on a drawing of the linkage. When the compiler is first set running, the only labels on the linkage are those marking the position and orientation of the ground link, together with those marking the fact that the input parameters are known (that is, that their exact values will be known when the assembly procedure is first set running). The rest of the inference process involves adding additional labels to the linkage until all the links have been labeled with indications that their positions and orientations are known.

The way in which inference is carried out can be one of several methods. For instance, each inference step could be implemented as a procedure, and the whole set of inference steps embedded in a simple loop. The loop could be expanded into a more complicated but more efficient control code. However, in a preferred embodiment, the knowledge used by the system is encoded as a set of rules, and a rule system is used to guide the inferences. The choice of a rule system implementation is purely for the sake of illustration; other implementations would capture the same functionality. Each rule in the TLA system has the form "if certain links have these labels and do not have these labels, then give the links these new labels and add these operations to the assembly procedure." At present the TLA system rules are as follows:

Rules for inferring marker constraints:
link-is-known→link-markers-cached
link-markers-cached
markers-constrained-to-circles
markers-constrained-to-circles-around-two-points
markers-constrained-to-cylinders
markers-constrained-to-lines
markers-constrained-to-spheres Rules for constructing displaced marker constraints:
vector-displace-frontwards
vector-displace-backwards Rules for intersecting and reducing constrained markers:
intersect
intersect-uniquely
reduce Rules for propagating constraints across coincident joints:
coincident-joint-markers-share-position
coaligned-joint-markers-share-alignment
twist-two-coincident-markers
universal-joint-markers-with-aligned-third-have-opposite-twist Rules for propagating constraint across displaced joints:
provisionally-translate-and-align-displaced-joint-markers
translate-a-relatively-positioned-displaced-joint-marker
orient-a-displaced-joint-marker Rules
only-two-spherical-markers→link-is-known-1
only-two-spherical-markers→link-is-known-2
three-marker-positions→link-is-known
two-marker-positions-and-one-alignment→link-is-known
one-positioned-and-oriented-marker→link-is-known
one-positioned-and-one-oriented-marker→link-is-known
one-positioned-marker-and-one-aligned-marker-with-linear-constraint→link-is-known These are described in more detail in the section describing the file 3D-Rules.

These rules suffice to cover a large number of cases. A few more rules will be required to properly treat all the common types of joints but can readily be added by those of skill in the art. But in practice a well thought-out rule set will asymptotically cover the vast majority of the linkages that actually come up.

Most of the code in subsystem Closed-Form implements the system which supports these rules, the "rule system." The TLA rule system bears some relation to known A-I type systems.

A rule system has five important parts:
the data base;
the rules themselves;
the pattern compiler;
the rule engine; and
the termination test.

The database is a datastructure that always contains some set of "Propositions." It is these propositions that implement the metaphor of "labels" on a linkage. A proposition is a Lisp list that will always look like:

*(Link-Has-Marker Link-13 Marker-9).*

The symbol "Link-Has-Marker" is known as the "predicate" and the symbols "Link-13" and "Marker-9" are known as its "arguments." Every predicate takes a fixed number of arguments. The predicate Link-Has-Marker takes two arguments, but other predicates in the TLA system take anywhere between one and eight arguments. The arguments will always be Lisp symbols or list structures. Note that, for clarity, the arguments are the names of Link-13 and Marker-9, not the PCL instances representing the link and marker themselves.

At any given time the database might have several dozen propositions in it. All but a few of these propositions pertain to the specific linkage under consideration and state various facts about it.

Propositions can enter the database in exactly three ways: by being asserted as premises independent of any linkage, by being asserted as premises specifically about the linkage being compiled, or by being asserted as the consequences of a rule that has fired. Propositions are only added to the database; they are never removed from it (other rule systems allow propositions to be removed from the database, but the TLA system does not require this because information about the linkage once inferred will never become false.)

It is conceptually convenient to distinguish two different classes of predicates, closed and open. Closed and open predicates are treated exactly the same by the system, but the system uses them to encode different kinds of information.

The three closed predicates which are independent of particular linkages are:
Intersectable (declares that the system can intersect two shapes);
Intersectable-Uniquely (likewise, without a configuration variable); and
Reduceable (declares that two shapes can be reduced to a shape of lesser dimensionality).

The two closed predicates that concern input parameters are:
Relative-Twist (an input parameter for, e.g., revolute joints); and
Displacement (an input parameter for, e.g., prismatic joints).

The closed predicate using basic structural information is:
Link-Has-Marker (identifies a marker and which link it is on).

The closed predicates which declare types of joints (notice the joint itself is not named) are:
On-Coincident-Joint (names two markers on a coincident joint);
On-Displaced-Joint (likewise, for displaced joints);
On-Coaligned Joint (likewise, for coaligned joints);
On-Cooriented-Joint (likewise, for cooriented joints);
On-Universal-Joint (likewise for universal joints); and
On-Spherical-Joint (likewise, for spherical joints).

The closed predicates which declare exceptional conditions that might otherwise confuse the rule system:
Colinear-Markers (used to declare that three markers are colinear); and
On-Alignment-Axis (declares that one marker lies on another's axis).

All of these closed predicates convey information that is not going to change during the course of a compilation.

The open predicates all of which encode items of partial knowledge that is being incrementally inferred by the rule system as it runs are:
Link-Is-Known;
Link-Markers-Cached;
Link-Has-Positioned-Marker;
Link-Has-Aligned-Marker;
Link-Has-Oriented-Marker; and
Link-Has-Constrained-Marker.

It is important to understand what kind of information propositions using these predicates carry. It might be asserted into the database. for example. that

*(Link-Is-Known Ground-Link).*

What does this mean? It means, approximately, that the position and orientation of the Ground-Link are known. At the moment when this proposition is asserted into the database, during the running of the rule system, none of this information is really known, since none of the components of the linkage have been assigned any quantitative values at all. These quantitative values only arrive when the assembly procedure is being run. What the compiler is doing, in effect, is to simulate the execution of the assembly procedure it is building. If the compiler's initialization procedure asserts (Link-Is-Known Ground-Link)

into the database before commencing to run any rules, that is because the Ground-Link is going to have its proper global position and orientation stored on it before the assembly procedure begins execution. Moreover, suppose that at a certain point a rule runs and asserts into the database the proposition:

(Link-Has-Positioned-Marker Link-1 Marker-3).

This will mean, approximately, that upon Link-1 is a marker called Marker-3 whose position (but not necessarily its orientation) is known. As with the Link-Is-Known proposition, Marker-3 will not have any numerical values stored on it at all while the rule system is running. What the proposition means, though, is that this marker will indeed have the proper position information stored on it at an analogous moment during the execution of the assembly procedure. A more complex example would be:

(Link-Has-Constrained-Marker Link-2 Marker-7 :Circle . . . ).

What this proposition means is that a certain amount of information has been gathered about the possible locations of Marker-7, namely that it must lie on a certain circle. The arguments that are here suppressed with an ellipsis will provide symbolic forms—that is, bits of code —by means of which the assembly procedure will be able to actually compute the identity of this circle. Knowing that a marker lies on some circle does not, in itself, permit assembly of anything. But this information, combined with some other information, might allow a definite determination of where the marker must lie, at least within a small, finite set of possibilities.

Once the rule system acquires and combines enough partial information about the links to fully determine their positions and orientations, it terminates and turns the list of accumulated forms into the final assembly procedure. More specifically, this happens when Link-Markers-Cashed has been asserted of every link.

An example of a rule is provided below:

```
(Defrule Coincident-Joint-Markers-Share-Position
  (:Condition (And (On-Coincident-Joint ?m1 ?m2)
                   (Link-Has-Positioned-Marker ?l1 ?m1)
                   (Link-Has-Marker ?l2 ?m2)
                   (Not (Link-Has-Positioned-Marker ?l2 ?m2))
                   (Not (Link-Has-Positioned-Marker ?l2 ?m3))))
  (:Assertions (Link-Has-Positioned-Marker ?l2 ?m2))
  (:Forms (Translate ?l2 ?m2 ?m1))
  (:Explanation
     "Since link ~A has a positioned marker ~A,
      we can infer the position of coincident marker ~A on
      link ~A, and then translate the latter accordingly."
```

```
      ?l1 ?m1 ?m2 ?l2))
```

This rule has five parts: its name, a condition with five clauses, a single assertion to add to the database, a single form to add to the assembly procedure, and a template for constructing an English explanation of that step in the assembly. The rule does not mention any specific links or markers. Instead, it uses variables (here written as ?l1, ?m1, etc., even though in the code they appear as #?l1 and #?m1) to abstract away from particular individuals. As with any kind of programming, the variables here have been given useful mnemonic names: ?l1 is a link with marker ?m1; ?l2 is a link with marker ?m2; and the rule fails to match if any marker becomes bound to ?m3.

The rule system will periodically check to see whether this rule's condition applies to the database as it stands at that moment. If so, it will apply (or "fire") the rule. When a rule fires, that means that the pattern matcher has discovered a set of "bindings" for all the variables in the condition (or almost all—see the explanation of Not clauses below) for which all the desired (or "positive") propositions can be found in the database, for which all the undesired (or "Not" or "negative") propositions cannot be found in the database, and for which this rule has not previously fired. The firing of a rule has two consequences.

First, the system constructs a version of each of the parameterized propositions under :Assertions in which the variables have been replaced by their values, and then it asserts each of these new propositions into the database.

Second, the system constructs a version of each of the parameterized forms under :Forms in which the variables have been replaced by their values, and then it adds each of these new forms to the end of the assembly procedure that is under construction. Normally a rule will produce only one form. Many produce no forms at all.

The meaning of the rule Coincident-Joint-Markers-Share-Position itself, expanding a bit on its "Explanation, is something like this: "Suppose you have a coincident joint (such as a revolute joint) which is made of two markers m1 and m2 which reside on two links 11 and 12, respectively. Suppose further that m1's position in global coordinates is currently known and that the position in global coordinates of no marker on 12, whether m2 or any other, is currently known. Then we can infer that the position of m2 actually is known. And when the assembly procedure is being executed, marker m2 can be caused to occupy its correct global position by translating link 12 so that marker m2 comes to occupy the same position in global coordinates as marker m1."

Notice the dual forms of reasoning here. Inferences about knowledge are being made at compile time as the rules run, while forms are being generated which, at execution time, will actually change the world to carry this knowledge into effect. The complex symbolic process of deciding what inferences to draw happens once, at compile time. The straightforward numerical process of calculating positions and orientations happens each time a linkage is assembled. The effort that has been expended at compile time, though, assures that this execution-time calculation involves little or no wasted effort. This "compiler" provides that all the reasoning is made explicit in rules written by the designer and propositions asserted into the database. This is the sense in which the TLA system can be considered "knowledge-based."

One thing to notice about this rule is that its firing causes it to no longer be applicable. That is, since the rule can only fire when ?m2 is not positioned and since the rule itself causes ?m2 to become positioned, once the rule fires it will, as it were, put itself out of work. This is a good thing; progress is being made.

Another thing to notice is that this rule is capable of being applied in several places within the same linkage. In particular, this rule will most likely fire once for every coincident joint in every linkage.

Here is another rule that further illustrates these points:

```
(Defrule Three-Marker-Positions→Link-Is-Known
    (:Condition (And (Link-Has-Positioned-Marker ?1 ?m1)
            (Link-Has-Positioned-Marker ?1 ?m2)
            (Link-Has-Positioned-Marker ?1 ?m3)))
    (:Check (Not (Colinear-Markers? ?m1 ?m2 ?m3)))
    (:Assertions (Link-Is-Known ?1))
    (:Explanation
        "Since link ~A has three known markers ~A, ~A,
        and ~A, we can infer that it is known (provided the
        markers are not colinear)."
        ?1 ?m1 ?m2 ?m3))
```

This rule expresses a simple proposition, that once three markers on the same link have been moved into their correct positions, the link must itself be in its correct position—provided, that is, that the markers are not colinear. The system assumes that any three markers on a link are not colinear. Just in case, it adds to the assembly procedure a check to make sure. If this check fails, the user will have to compile the linkage again, this time asserting the proposition that the three markers in question are colinear, thus preventing this rule from firing.

Another thing to notice about this rule is that the rule system assures that the variables ?m1, ?m2, and ?m3 will all be bound to different markers. The way in which this works is described in the documentation for the file Match.

A final thing to notice about this rule is that it does not generate any forms. It does not have to, since it has "discovered" that this link of the partially assembled linkage is (that is, will be at the analogous moment during the execution of the assembly procedure) already in the desired state. The three markers will have been moved into place by previous operations in the assembly procedure, so that the link itself will have come to rest in its final, correct position. The rule itself need merely declare this fact by asserting a proposition to this effect into the database so that other rules might take advantage of it.

Subsystem Closed-Form comprises six files:
Engine;
Match;
3D-Rules;
3D-Find;
Pcode; and
Debug-Closed-Form.

These are discussed in greater detail in the subsections that follow.

1. File Match

The file Match contains the pattern matcher for the TLA rule system. The job of the pattern matcher is to determine whether the condition specified by a given rule matches the database, and if so how. Consider this rule:

```
(Defrule Link-Markers-Cached
    (:Condition (And (Link-Markers-Cached ?1)
            (Link-Has-Marker ?1 ?m)))
    (:Assertions (Link-Has-Positioned-Marker ?1 ?m) ... ))
```

(The other two assertions specified in the actual rule in the file 3D-Rules are omitted here for simplicity.) Suppose the database has the following propositions in it:

(*Link-Has-Marker Link*-1 *Marker*-5);

(*Link-Has-Marker Link*-2 *Marker*-7);

(*Link-Has-Marker Link*-2 *Marker*-8); and (*Link-Markers-Cached Link*-1).

In this case, the pattern matcher ought to conclude that the rule's pattern matches the database in just one way, with $?1 = Link\text{-}1; ?m = Marker\text{-}5.$ And so the following proposition ought to be asserted:

(*Link-Has-Positioned-Marker Link*-1 *Marker*-5).

Now, suppose that later on the following proposition also comes to be asserted:

(*Link-Markers-Cached Link*-2).

Then the rule's pattern will match the database in two more ways, with $?1 = Link\text{-}2; ?m = Marker\text{-}7$ $?1 = Link\text{-}2; ?m = Marker\text{-}8$ And so the following two propositions ought to be asserted:

(*Link-Has-Positioned-Marker Link*-2 *Marker*-7)

(*Link-Has-Positioned-Marker Link*-2 *Marker*-8)

Matching a rule's condition against the database takes some care. Notice, for example, the difference in status between the two instances of the variable ?1 in our example rule's condition:

```
(And (Link-Markers-Cached ?1)
        (Link-Has-Marker ?1 ?m))
```

The first instance of ?1 is free to bind itself to any argument to Link-Markers-Cached that appears in the database. The second instance of ?1, though, must have this same binding. Thus, when the pattern matcher is looking up propositions in the database that might satisfy the second clause, it must also enforce the variable bindings that have resulted from the first clause. The variable ?m, though, is free to bind itself to anything it likes, so long as it appears in a Link-Has-Marker proposition after the appropriate value for ?1.

A rule can also have negative clauses, as in:

```
(And (Link-Has-Oriented-Marker ?1 ?m)
     (Not (Link-Has-Positioned-Marker ?1 ?m))
     ...)
```

Here, a set of bindings for ?1 and ?m is legal only if the database contains a Link-Has-Oriented-Marker proposition of the correct form and does not contain a Link-Has-Positioned-Marker proposition of that form. A Not clause can also contain variables that have not previously appeared, as in:

```
(And (Link-Has-Positioned-Marker ?1 ?m1)
     (Not (Link-Has-Positioned-Marker ?1 ?m2))
     ...)
```

This says, "Link ?1 has exactly one positioned marker, ?m1." The variable ?m2 is, in logical terms, existentially quantified: there cannot exist a binding for ?m2 for which the second clause matches the database. Note that ?m1 and ?m2 must have different bindings, a condition ensured by the pattern matcher itself.

The process of matching a rule's condition against the database, then, is reasonably complex. All of the steps in the operation, though, are reasonably simple and easily understood. One looks up a predicate in the database, gives a variable a new binding to the next item along in some stored proposition, checks that an already bound variable's binding matches the next item along in some stored proposition, declares that a match has succeeded or failed, and so forth.

These operations occur non-deterministically. That is, the pattern matcher is often faced with choices, such as which of the possible values to assign to a variable, among the options available in the database. If a condition has several variables, several choices will need to be made, and all the successful combinations of choices need to be discovered.

It is important that the pattern matching process be as rapid as possible and that it allocate little or no new storage while it is running. At the same time, the pattern matcher can take advantage of some properties of the TLA rules. For example, variables can only appear at the "top level" of list structure. The following would be an illegal clause in a TLA rule:

(Link-Has-Marker ?1 (Next-To ?m)).

Likewise, as has been mentioned, propositions are only asserted into the database and are never removed.

The way the pattern matcher works is to compile a rule's condition into a bit of code in a special language. This language, called p-code (i.e., "pattern code," and also the name used by Pascal for its compiler's machine-independent intermediate language), looks like a machine language. It has no iteration constructs and no arithmetic. The instructions it does have are tied closely to the task and to the way the database is organized.

For the rule condition:

```
(And (Link-Markers-Cached ?1)
     (Link-Has-Marker ?1 ?m))
```

The p-code is:

```
1: Start Link-Markers-Cached
2: Fan ?1
3: Start Link-Has-Marker
4: Check ?1
5: Fan ?m
6: Succeed
```

(To see this code for newly compiled rules, remove the semicolon from the definition of Defrule in the file Engine, on the line where it calls the Print-Pcode procedure on the newly compiled rule.)

This is a particularly simple example, but it illustrates a number of important ideas. The device that executes this code (implemented by the procedure Execute-Rule) has a number of internal registers, which are notated by double Asterisks:

- Next = The next instruction to execute.
- Vertex = A pointer into the database.
- Bindings = An array of the variables' current bindings.
- Database = The whole database.
- Rule = The rule being run.
- Success? = Has this rule asserted anything new yet?

The first three of these variables are the most important. The various p-code instructions have their effect primarily through operating on these variables, Next, Vertex, and Bindings.

The Start instruction sets Vertex to point at the top-level database entry for the specified predicate.

The Fan instruction non-deterministically chooses one of the values arrayed at the current point in the database tree and binds it to the specified variable by changing its slot in the Bindings array. It then changes Vertex to point at the options, if any, below the chosen value in the database. It also stores the rest of the options in a record structure called a "choice point" for when control is returned to the instruction later on.

The Check instruction checks to make sure that one of the options at the current place in the database indicated by Vertex corresponds to the value of the specified variable as indicated in the Bindings array. It then moves Vertex to point at the options, if any, below this value in the database. If the value being checked is not found at the current database vertex, then control is returned to the previous nondeterministic choice points.

The Succeed instruction indicates that all the clauses have been matched. It calls the Emit-Bindings procedure and passes it the rule and the accumulated bindings. It then restores control to the last place in which a nondeterministic choice was made, if any, so that the other possible choices might be explored.

When a Fan instruction has explored all of the options available to it, it returns control to the previous nondeterministic choice before it. If there are none, then the rule finishes running. In the case of this example, there are two Fan instructions, one for the variable ?1 and another for the variable ?m. For each value of ?1, the system cycles through all the possible values of ?m. Once all the values of ?m have been explored, another value for ?1 is chosen and the cycle repeats. When all the values for both variables have been explored the rule finishes. This might sound like a lot of work, but each of these instructions is at most a few lines of code. All the necessary information is always immediately at hand in the double-asterisked global variables, so the calculations are always very simple.

When the patterns get more complicated, the pattern compiler sorts them into a simple branching structure. Consider, for example, this pattern:

```
And (Link-Is-Known ?1)
    (Link-Has-Marker ?1 ?m1)
    (Link-Has-Marker ?1 ?m2))
```

The p-code for this pattern will look like:

```
 1: Start Link-Is-Known
 2: Fan ?1
 3: Branch 4,8
 4: Start Link-Has-Marker
 5: Check ?1
 6: Fan ?m1
 7: Succeed 3
 8: Start Link-Has-Marker
 9: Check ?1
10: Fan ?m2
11: Distinguish ?m1, ?m2
12: Succeed
```

In instruction 7, "Succeed 3" means that success is only provisional. The branch at instruction 3 must also check that the code that begins at instruction 8 also succeeds. The p-code will call Emit-Bindings at the Succeed in instruction 12, if control ever actually reaches there.

Note the Distinguish instruction at 11. It is checking to make sure that ?m1 and ?m2, which the compiler infers to be of the same type (i.e., markers), have different values. If they do, then control proceeds to instruction 12. If they do not, then control fails back to the choice point at instruction 10.

Although the flow of control within the compiled patterns can get a little complicated, it is always easily determined where control should go next. Succeed instructions give control to the previous branch point, if any, except for the very final Succeed instruction, which calls Emit-Bindings and then gives control to the previous choice point, if any. Failures, such as a failed Check instruction or a Fan with no more choices to make, give control to the previous choice point, if any. Unlike many other languages with nondeterministic and other non-standard control schemes, no variable bindings ever need to be saved and restored, nor does the transfer of control ever involve any complex searching. The only thing that does not happen in unit time is a Check instruction, which must sort through the options at the current database, which rarely number more than five, to see if the value being checked is present.

The pattern compiler has a number of other instructions for relatively special circumstances. Negative clauses need their own instructions with generally opposite semantics from the others. For example, the pattern

```
(And (Link-Is-Known ?1)
     (Not (Link-Has-Marker ?1 ?m)))
``` would compile this way:

```
1: Start Link-Is-Known
2: Fan ?1
3: Start Link-Has-Marker
```

```
4: Check-Not ?1
5: Fan ?m
6: Fail
```

In instructions 4-6, everything is backwards. The failure to find a database choice corresponding to the currently bound value of ?1 is a success now, not a failure. If the Check-Not instruction finds this value at the current database vertex, it proceeds on to instruction 5. If it does not find the value, it succeeds back to the previous branch, which in the context of this rule means that the pattern matcher succeeds altogether. The Fan Instruction at 5 works normally, but it is followed by a Fail instruction rather than a Succeed instruction. Any value the Fan instruction finds is cause for failure. (The Fan instruction will surely find some values, since any Link-Has-Marker proposition that appears in the database will always have two arguments.)

A few more instructions have not been discussed:

Check-Only-1, Check-Only-2, etc. are an efficiency device. The user can specify that a given rule need only ever consider a given binding of one or more of its variables once, since it can be assured that the rule will do all the firing it is ever going to do with those values the first time through. It is not clear how much effort this saves, but it is not difficult to implement. The author of the rules specifies which variables are "once-only" using the :Once-Only keyword to Defrule.

Check-Constant and Check-Constant-Not are like Check and Check-Not except that they check for the presence or absence of a prespecified constant value that appears literally in the rule's condition, as in

```
(Link-Has-Constrained-Marker Link-3 Marker-7
    :Circle ... )
``` where:Circle is not a variable but rather a keyword constant.

Each of the compiler's instructions, together with a routine for making them, is defined in the file Match. The largest and most important components of the file Match are the "dependency analysis" that produces the branching structure of the compiled code, the instructions themselves, the mechanism for executing the compiled patterns, and the pattern compiler itself.

The procedure Index-Into-Lookup-List inserts new propositions into the same sort of database structure as Knit-New-Assertions, except that Index-Into-Lookup-List expects a fully specified proposition, such as is generated by the initialization routines, and does not take care to instantiate variables. The procedure Assert-Proposition itself is primarily used by the Setup-Database method in 3D-Find.

The variables involved in a rule are kept track of in the list *Variables*. Each variable has an associated number (for purposes such as looking up bindings in the Bindings array) and this number is computed as the variable's position in this list.

The dependency analysis takes the linear series of clauses in a rule's condition and produces a tree structure. Any path from the root to a terminal of this tree structure will encounter some subset of the clauses in the same order in which they appeared in the original rule. Sometimes the tree will just have one path along which all the clauses appear. The tree will have more of a branching structure when there are many variables, only a couple of which appear in any given clause. The reason for computing this branching structure is so that a failure of, for example, a Check instruction will return control to a choice point that actually concerns one of the relevant variables. This is a matter of efficiency, not of correctness, since a brute force combinatorial search of all possible bindings of all the variables would have the same effect.

The principal constraint on the dependency analysis is that if clause A binds a variable (i.e., mentions it for the first time, giving rise to a Fan instruction) and if a later clause B also uses that variable (giving rise to a Check or a Check-Not instruction), then B must appear below A in the resulting tree structure. The algorithm works by simply enforcing any instances of this condition it sees, splicing any such B into the tree structure below each of the clauses that bind its variables. A beneficial consequence of this algorithm is that all of the Not clauses will be terminals in this tree structure, since any variables first mentioned in a Not clause cannot be mentioned by any other clauses. The compiler depends on this property of the dependency analysis in the semantics of its instructions.

The compiled p-code uses two kinds of record structures, branch points and choice points. Every Branch instruction has a branch point that connects to the instructions being branched among and to the next branch up the hierarchy (i.e., the tree structure made by the dependency analysis), as well as the value of Vertex when control last passed through this choice point. See the instructions Branch and Succeed.

Every Fan instruction has a choice point that keeps track of the other possible choices it might make, along with the next choice point up the hierarchy, if any, the variable being bound, and the next instruction to execute once this variable has been given a new value. Notice the duality of the p-code control scheme: success operates through branch points and failure operates through choice points.

Each instruction is defined using the specially defined form Definstruction. An instruction, as it happens, is implemented through an ordinary Lisp procedure, and Definstruction expands into a simple Defun. The Definstruction form is thus mostly for documentation.

There are four different Check-Only-n instructions, according to the number of variables being checked. This is just to move some slight amount of work from the instructions themselves to the compiler and is not particularly necessary.

The Make-Distinguish-Instructions procedure goes to some effort to determine which variables must actually be distinguished. Since every variable inherits a type from the argument position in which it first appears, this method assures that only variables of the same type need to be explicitly distinguished. Furthermore, only certain declared types (principally links and markers) must actually be distinguished, this having been specified in the 3D-Rules file along with the declarations of types and predicates.

Note that Fan and Branch instructions are given their choice and branch point records at compile-time. Neither these records nor anything else, aside from the internal structure of the growing database, is constructed at run-time.

Note also that a number of instructions call the Fail instruction as a subroutine. This works fine since Fail, in addition to being an instruction, is a procedure like any other.

The Succeed instruction must branch on whether it has a stored Previous-Branch. This could have been determined at compile time, leading to two different Succeed instructions, one which always transfers control to another branch point and another, used at the very end of a p-code program, which always calls Emit-Bindings and then calls Fail to transfer control to the previous choice point.

The Fail instruction is the most complex. If one fails without a previous choice point, meaning that this is the very first choice point in the p-code program, then the Fail instruction calls Declare-Instruction-Failure, which transfers control back out to the program that is executing the rule. If there is a previous choice point, then the next option at that point, if any, is chosen and control passes to the next instruction along. Lacking any choices, control passes up the hierarchy to the previous choice point, if any. Note that, when this happens, Fail is calling itself recursively. The Fail instruction is thus climbing up a chain of choice points looking for one that still has outstanding options.

Since instructions are simply symbolic Lisp forms which call the instructions as regular procedures, executing them is a simple matter. One could avoid actually calling Lisp's Eval procedure by simply writing a routine that dispatches on the instruction name. In this case the instructions would be distinct record structures rather than plain list structures as in Lisp code. The job of Execute-Rule is to initialize all the globals, repeatedly run instructions until one of them signals completing by throwing to the label Done, and then returning the value of Success?, which is T or Nil according to whether the rule has managed to assert anything new into the database.

The pattern compiler itself, like all compilers, is a reasonably complicated program. Much of its work consists of keeping track of variables. One needs to keep track of which variables the compiler has encountered, for two reasons. The first is that the compiler needs to distinguish a variable's first occurrence from its subsequence occurrences, both so that it can generate a Fan rather than a Check instruction and so that it can generate Distinguish instructions in the right places. The second reason is that the Once-Only feature needs to generate a Once-Only instruction as soon as all of the variables mentioned in the rule-author's :Once-Only form have become bound. The Register-Bound-Variable routine does this bookkeeping.

The top-level procedure of the pattern compiler is Compile-Rule. It initializes the compiler's data structures, calls the dependency analysis to sort the clauses into a tree structure which is made out of structures called "clause records," calls Compile-Clause-Records to actually compile the clauses, and places all the resulting information into the appropriate slots in the rule's record structure.

The procedure Compile-Clause-Records takes a clause record, the top one in the tree, and returns an instruction, the first one to be executed. Just as the top clause record points at the other clauses, the first instruction points at the next instruction, which in turn points at the next, and so forth. Since compilation of clauses works differently for positive and negative clauses, Compile-Clause-Record simply dispatches according to the clause's type.

Both a positive and a negative clause's instructions begin with a Start instruction for the clause's predicate. The routine Compile-Positive(or Negative)-Terms then iterates down the clause's argument positions, accumulating more instructions for each. A constant argument occasions a Check-Constant or Check-Constant-Not instruction. A variable, though, occasions a more complex analysis. If the variable has occurred before, a Check or Check-Not instruction results. If the variable is being bound for the first time, though, things are more complicated. A choice point must be constructed for the Fan instruction that will be required. Appropriate Distinguish instructions must be made, along with the Fan instruction itself. In the case of a positive clause, a Check-Only clause might be necessary. Finally the whole collection is wired together and the Fan instruction is returned.

The most subtle point here concerns the registration of variables. The recursive call on Compile-Positive(or Negative)-Terms, or on Compile-Inferiors (which generates a Branch if the clause record has more than one immediate inferior in the tree structure), cannot occur until the new variable has been registered and it has been determined whether it is a newly bound variable and whether Check-Only instructions will be required. This is why Compile-Positive-Terms goes to the trouble of storing the Previously-Bound-Variables and the Do-Once-Check? on separate variables before constructing the Later-Terms.

2. File Engine

The file Engine contains the machinery for the rule engine. This code does not determine whether a given rule applies to the database, but it does create new rules, manage the database itself, implement policies about what rules to try running when, and actually sets the rules running. The file Engine interacts strongly with the file Match, which contains the pattern matcher itself.

The Set-Verbosity procedure is used to control how much debugging information the TLA system produces while it is running. It is called with one of the keywords defined in *Verbosity-Precedence*. The form (With-Verbosity <keyword> ...) may be wrapped around a block of code that generates debugging information to specify the conditions under which it will be run.

The procedure Set-Dispatch-Macro-Character is used to extend the Lisp syntax so that an expression such as #?x expands into a list structure that looks like (*var* x). It is the latter form that the code will recognize as a variable for purposes such as building a pattern matcher.

A rule is a record structure with at least a dozen slots. The first several slots are read more or less straight out of the Defrule form that defined the rule. Others are set by the compiler. Most will be explained in the context in which they are used.

A couple of these slots, Prior-Rules and Prior-To, participate in a protocol by means of which a user can declare that, for whatever reasons, certain rules must be run before others. The code that implements this protocol occurs at the end of file Engine.

All of the predicates used in the database must be declared near the top of the file where the rules are defined. Each predicate's arguments must also be declared to have certain types. One defines the types with Deftlatype (so named to distinguish it from the much more general Common Lisp type system's Deftype) and predicates with Defpredicate. The types and predicates for the TLA system are declared at the start of the file 3D-Rules. The code makes a certain amount of effort to check that the rules obey the predicate and type declarations, just as a debugging aid, but these checks are not thorough.

The termination test works through procedures which are placed on the property lists of predicates. When the rule system asserts a new proposition, it checks for such a procedure and if one is present it is called. (In AI jargon this is called "procedural attachment.")

The Defrule form takes apart the clauses it is given and inserts these into a new or recycled structure of type Rule. The only complex operations here are those to compute the values of the slots Run-Safely? and Critical-Predicate, both of which are involved in the rule engine's heuristic scheme for deciding what rule to run next. Briefly, to run a rule "safely" means that it can only fire once each time it is run, even though its pattern might match the database in several ways. It is advisable to run a rule safely when one of its assertions might cause the other possible matches to fail. Otherwise the extra firings might be erroneous. This is not a pleasant feature, but it is also not a required one. The notion of a critical predicate, another optional efficiency feature will be explained later in this file.

The Emit-Bindings procedure is called by the pattern matcher once it has discovered a set of bindings for a rule's variables for which its pattern matches the database. The job of Emit-Bindings is to determine whether any of the propositions the rule wishes to assert into the database are actually novel. If not, nothing is done. If the rule actually has a novel proposition to assert, then its asserted propositions are entered into the database, the termination test is run, its forms are added to the growing assembly procedure, any run-time checks it requires are also added to the assembly procedure, and an explanation is generated. (Note that the operation mechanism is not currently used for anything in the attached code.)

The Knit-New-Assertion procedure has the job of determining whether a given proposition being asserted by a rule is already in the database and to wire it into the database if not. The proposition itself is never actually constructed since the Knit-New-Assertion procedure has all the information it needs in the asserted pattern and in the variable bindings.

The database itself is organized in a way that looks obscure but that greatly accelerates the pattern matching process. One way to organize the database would be a simple unordered list of all the propositions. Pattern matching would proceed by matching each clause of each pattern against each proposition in the database, accumulating the variable bindings of the successful matches. Since patterns can have half a dozen clauses and databases can have dozens of entries, and since a given pattern might be matched against the database dozens of times in the course of an assembly procedure's compilation, this would be inefficient.

Alternatively, the database groups the propositions by their predicate. All propositions of the form (Link-Is-Known <link>) would be gathered into one list, all propositions of the form (Link-Has-Oriented-Marker <link> <marker>) into a second list, and so forth. The pattern matcher could then save itself a great deal of work by only trying to match clauses, like (Link-Is-Known #?1), against propositions which share their predicates, like (Link-Is-Known Link-13).

The TLA system's database extends this idea to the proposition's arguments as well. Suppose the database contains the four propositions:

(*Link-Is-Known Link*-13)

(*Link-Has-Oriented-Marker Link*-9 *Marker*-4)

(*Link-Has-Oriented-Marker Link*-9 *Marker*-5)

(*Link-Has-Oriented-Marker Link*-2 *Marker*-3)

Then the database would look something like this:

```
(Nil (Link-Is-Known (Link-13 . T))
     (Link-Has-Oriented-Marker (Link-9 (Marker-4 . T)
                                       (Marker-5 . T))
                               (Link-2 (Marker-3 . T))))
```

The (x . y) notation is how Lisp notates a single cons node, a record structure that contains two pointers. The symbol T is a conventional way of saying "True" or "Yes" in Lisp. In general, a database is either (<entry> . T) or (<entry> <database> ... <database>).

Each <entry> is just one of the elements of the list representing a proposition, such as Link-Is-Known or Marker-5. A proposition can also contain more complex list structures, particularly when building up the symbolic expressions by which the locations of marker can be computed by the assembly procedure. In this case, the <entry> would be one of these symbolic expressions.

Each database defines a set of paths from the top level down to one of the T symbols. In the case just described, these paths correspond to the four propositions in the database. At each point along the path, one will have determined the values of the first few entries in the propositions list structure, but the last few entries will remain undetermined. The symbol T indicates that one has reached the end of a path and thus determined a complete proposition.

The motivation for organizing the database in this way becomes clearer in the explanation of the pattern matcher. Each pattern matching operation descends the tree-structured database, following the various paths and accumulating variable bindings. When the pattern matcher runs into a T in the database, it has successfully matched one clause of the pattern. Once all the clauses have been matched, the accumulated bindings can be sent to Emit-Bindings to complete a firing of the rule.

The next section of the file Engine defines the machinery for declaring the order in which rules ought to run. It does not matter what order the rules run in, except that it is more efficient if run according to the method herein. In reality it is sometimes necessary to declare that one rule cannot run without some other rule being attempted first. This can happen, for example, when one rule generates forms that are much more expensive to execute than those of another. In this case, the user can call the Declare-Prior procedure, passing it the names of the two rules.

The rule engine keeps the rules sorted into an array called *Predicate-Rule-Registry*. Each predicate is assigned a number as it is declared, and thus to each predicate there corresponds an entry in this array that contains a list of rules. The idea behind this scheme is that a good policy about choosing rules is to try out a rule that depends on a predicate for which a proposition has recently been asserted into the database.

Consider, for example, this simple rule:

```
(Defrule Link-Is-Known = = > Link-Markers-Cached
  (:Condition (And (Link-Is-Known #?1)))
  (:Assertions (Link-Markers-Cached #?1))
  (:Forms (Cache-Markers #?1))
  (:Explanation
    "Since link ~A's transform is known, we can locate
    all its markers."
    #?1))
```

If no links are yet known, there is no use firing this rule since the clause (Link-Is-Known #?1) is not going to match anything in the database. If a proposition such as (Link-Is-Known Link-13) is asserted into the database, though, then that is a good time to try running this rule. Once the rule has been run, though, it is no longer worth trying to run it again until another proposition that uses the predicate Link-Is-Known is asserted.

Every rule has a "critical predicate," which is the predicate that is likely to be the best for applying this policy to the rule. The critical predicate of a rule will always be a predicate that appears in the rule's pattern. For the rule Link-Is-Known→Link-Markers-Cached, the critical predicate is Link-Is-Known, an obvious choice since that is the rule's pattern's only predicate. For this reason, this rule (that is, the record structure that implements it) will be found in the entry of the array *Predicate-Rule-Registry* that corresponds to the predicate Link-Is-Known. The critical predicate for a rule ought to be an open predicate—i.e., one for which assertions can be made once the rule system has started running—and it should ideally be the predicate corresponding to the last proposition to be asserted among the ones that will match the pattern. There are no guarantees about this, and the complex bit of code in Defrule that selects a critical predicate for a newly defined rule can only guess. Fortunately, it does not matter if one guesses wrong. As with this whole "scheduling" scheme, all that is at stake is efficiency. The rule system takes something like three times as long to run without its efficiency devices as it does with them. The pattern compiler and the tree-structured database organization add another factor of about five relative to the simplest pattern matcher one could imagine.

The mechanism for keeping track of declared rule orderings includes two pages of straightforward code for manipulating partial orderings. Its goal is to construct in each entry of the *Predicate-Rule-Registry* array a list of rules that obeys the explicitly declared priorities and also tries to correspond to the order in which the rules were declared.

The rule engine itself maintains a status for each of the predicates, either :Waiting, :Inactive, or Never. A predicate whose status is :Never has never had any propositions using it asserted. A predicate whose status is :Waiting has had a proposition asserted since the last time its rules were run. A predicate whose status is :Inactive has not had any propositions asserted since the last time its rules were run. The rule engine, the procedure Run-Rules-Internal and its associated procedure Run-Rules-From-Array, always tries to run the rules for :Waiting predicates. When none remain it tries the rules for :Inactive predicates. When the termination test finally succeeds it returns :Success. If it has tried all the rules without any of them managing to assert anything but the termination test has not yet succeeded then it returns :Fail.

The file Engine also provides a second, much simpler way of running the rules, called Old-Run-Rules. Calling this instead of Run-Rules is much slower, but it ought to run correctly even if the more complex machinery of critical predicates, orderings, and statuses is broken or incompletely implemented.

3. File 3D-Rules

The file 3D-Rules contains the type and predicate definitions, the linkage-independent database assertions, the rules, and the ordering declarations among the rules that are used by the TLA system.

The three most important ideas employed by these rules are partial knowledge, incremental assembly, and the distinction between a marker's having been positioned, aligned, or oriented. Let us consider these in turn before turning to the code in the file 3D-Rules.

The rules in the TLA system conduct an exercise in theorem proving. They work corporately to try to prove the proposition that the linkage in question can be assembled. The proof that a linkage can be assembled proceeds by inferring the global-coordinates positions of all the link's markers. Sometimes one has enough information at hand to immediately pin down a marker to a particular location in space. Usually, though, one can only proceed step-by-step, inferring only the marker's orientations or some locus of points in space where it might be located. Many of the predicates used by the rule system express these types of partial knowledge about markers. The rule system cannot complete its work until it has achieved complete knowledge about the links and markers, but along the way several kinds of partial knowledge must be expressed and combined. We will see how this works out in practice.

The concept of incremental assembly is both a metaphor for the proof-construction process and a literal description of how the assembly procedure will operate. At the beginning of either process, the various links in a linkage are all "piled up" in a corner, neither attached to one another nor oriented in any sensible way. The assembly process proceeds by moving one after another of the links into place. Very often a link will receive a provisional location, only to be moved into its final location later on. The provisional location of a link might move one of the link's markers into its final location; any further movement of the link would be sure to pivot around this marker so as to keep it in its proper place. The provisional position of one of the links in a prismatic joint might set up the joint with zero displacement, only to move the link along the joint's line of motion once the correct displacement is inferred later on. The assembly procedure can, as a debugging and demonstration feature, be single-stepped, so that this incremental assembly process can be observed in progress.

The final goal of the assembly procedure is to give every link and marker its proper location, and some of the kinds of partial knowledge that can be had about a marker concern its position in global coordinates—the predicates Link-Has-Positioned-Marker and Link-Has-Constrained-Marker. But the inference process that figures out how to assemble the linkage also makes important use of partial knowledge about markers' orientations. One
can have two kinds of partial knowledge of a marker's orientation. To say that Link-Has-Aligned-Marker is to say that the marker in question has two of its orientation components correctly assigned, specifically that the transform relating the link's internal coordinate system to the global coordinate system has the property that the z axis of the local coordinate system of the marker in question has the correct global orientation. The marker's position and the orientation of its x axis might be unknown, but all future operations will keep the marker's z axis pointed the right way. (Keep in mind that the relationship between a marker's internal coordinate system and the internal coordinate system of the marker's link is fixed throughout the computation.) To say that Link-Has-Oriented-Marker implies that the marker's entire orientation has been determined. In particular, both its z and its x axes (and, therefore, its y axis) are pointing in the correct directions and will remain pointing in those directions for the rest of the assembly process. The physical significance of these items of partial knowledge will depend on the type of joint, if any, in which the marker participates.

These three concepts, partial knowledge, incremental assembly, and alignment vs. orientation, are used in the following descriptions of the code in the file 3D-Rules.

The type declarations made with Deftlatype are principally for self-documentation and error-checking. The Deftlatype form takes the name of a type. a predicate for checking whether an object is an instance of the type, and an optional indication that variables of this type should be bound to distinct values, as enforced by Distinguish instructions in a rule's p-code. Right now the three distinct types are links, markers, and reckoners. Reckoners are used to prevent certain kinds of rules from generating useless loops.

Some of the types specify symbolic forms used to compute various quantities, such as points, lines, radii, and centers of motion (explained later). In general, one can define a separate type for every argument position of every predicate that feels like it is, or represents, a distinct type of entity. One could also go to the opposite extreme and define a small number of highly inclusive types. Defining a proper set of types is good practice, though, and not much effort.

The type definitions must occur before the predicate definitions, and both must occur before the rules.

The Defpredicate form takes the name of a predicate, a keyword indicating whether it is open or closed, and a series of type names, one for each of the predicate's argument positions. Most of these are self-explanatory. Note that when the same type name occurs more than once in the declaration of a predicate, that just means that the predicate has several arguments of the same type, not that those arguments need to have identical values.

Most of the predicates describe particular kinds of joints in terms of the markers that lie on them. Every joint connects two different links, and the joint is represented using one marker on each link. The rather exotic names of the joint types declared here, such as on-cooriented-joint, correspond to the types of inferences that can be made about such joints and the markers and links that make them up. Choosing good joint types, as with all design or representations, makes for compact and minimally redundant rules.

The calls on Initialize-Predicate-Rule-Registry and Initialize-Global-Rule-Ordering in the file 3D-Rules are there to clear out the system's internal datastructures for keeping track of rules and their properties and relationships on occasions when the entire rule set is being compiled or recompiled. If one only wishes to recompile a single rule, it is not necessary to call these initialization procedures or to recompile the whole file.

The procedure Initial-Assertions is called by the rule system as it is starting up and asserts into the database a collection of propositions that are used by the rules but are independent of particular linkages. These propositions, as it happens, all concern the ways in which partial information about the possible locations of markers can be combined. There are two major kinds of combination, reduction and intersection. The difference is that reduction reduces the dimensionality of the constraints on two markers' locations without determining exact positions for them, whereas intersection reduces the dimensionality of the partial information to zero, thus determining the markers' locations up to some small, finite number (in the current rules, always one or two) of possibilities.

A version of intersection, called unique intersection, occurs when the location of the markers in question can be reduced to a single possibility, thus avoiding the need to provide the user with a mechanism (configuration variables, which look like Q0, Q1, Q2, ... ) for specifying which possible intersection point to use.

Each Intersectable and Intersectable-Uniquely proposition makes a certain promise, that the run-time procedure will be able to actually compute the intersection of the two shapes in question. To each of these propositions there corresponds an Intersect method in the Primitives file of subsystem Run-Time. A set of intersection procedures is implemented that is big enough to cover the vast majority of common cases; one might consider implementing more of them, particularly for cylinders, if it becomes necessary to do so.

Note that each Reduceable proposition provides three procedures for computing the locations of various critical aspects of the partial location constraint on the markers, whereas the Intersectable propositions provide no such information. The reasons for this are evident in the Reduce and Intersect rules. The Reduce rule does not generate any forms, since not enough information will have been accumulated to actually locate anything in space. All the Reduce rule can do is to build up symbolic expressions that the Intersect rule can later use in determining where the markers actually are. The Intersect rule, for its part, can simply generate an Intersect form with these symbolic expressions as its arguments and let the Intersect form actually move the markers (and thus the links they reside on) at run-time. We will return to these rules.

The first rules revolve around the predicate Link-Markers-Cached. As a linkage is assembled, all of the global positions calculated for each marker are considered provisional until the link upon which the marker rests has been officially placed in its final position and orientation. When this happens, the assembly procedure will call the procedure Cache-Markers, passing it the newly installed link, and this procedure will assign each of the link's markers its official global position.

The next several rules draw conclusions about partial constraints on the possible locations of markers. One might know that a marker lies on some particular circle, or sphere, or line, without knowing exactly where it is located. The rules that draw such conclusions apply simple ideas from geometry. The rule Markers-Constrained-To-Circles-Around-Two-Points, for example, draws its conclusions when some link has two (and no more) markers whose positions (and nothing else about them) are known. In such a case, all the other markers on the link can be inferred to lie somewhere on a circle whose axis is the line passing through the two already-positioned markers.

Note that among the Markers-Constrained-To-rules, the rule about spheres is exceptional in that it refers to the type of joint upon which one of the markers (the one located at the center of the sphere) is located. This acknowledges the fact that spherical position constraints only come up in particular physical contexts, those involving joint types, such as spherical and universal joints, which do not constrain their component links to share any axis of motion. Also note that not all of the Markers-Constrained-To- rules have been fully debugged.

The rules Vector-Displace-Frontwards and -Backwards are subtle. Each of them generalizes across kinds of position constraint (circles, lines, spheres, and so forth) and propagates these position constraints among markers that share links whose orientations are known. For example, suppose that the orientation (but perhaps not the position) of link A is known, and suppose that marker M on link A is known to lie on some circle. Then a certain conclusion can be drawn about any other marker N on link A, namely that marker N also lies on a circle. Marker N's circle can be obtained by displacing marker M's circle by the vector from M to N. The only difference between the Frontwards and Backwards versions of the rules is that in one case it is marker M whose orientation is already known whereas in the other case it is marker N.

The rules about vector displacement illustrate the use of "reckoners." Reckoners are more or less arbitrary symbolic tags that appear as the last argument of Link-Has-Constrained-Marker propositions. The purpose of a reckoner is to keep rules such as these from getting themselves into infinite loops. Infinite loops can happen in rule systems in more ways than are immediately obvious, but a simple example will convey the general idea. Suppose that marker M is known to lie on some circle and that, as a consequence, marker N is inferred to lie on some other circle. What is to stop the same line of reasoning from now working backwards, inferring that marker M lies on some new vector-displaced circle?

Watching from the outside, it is known that this new inference is redundant, since it merely rephrases the original circle constraint in a contorted twice-vector-displaced form. The equivalence between the two ways of describing the circle will not be obvious to the rule system, though, nor is it at all easy to write a rule that can detect such equivalences in general.

The solution is to tag each position constraint with a symbol describing the provenance of the knowledge. The rule Markers-Constrained-To-Spheres, for example, reckons the sphere it specifies in terms of the (name of the) marker that lies at the sphere's center. If the Vector-Displace-Frontwards rule, for example, propagates that spherical constraint to some other maker, the new displaced spherical constraint will inherit the same reckoning maker.

Both of the Vector-Displace- rules can thus avoid redundant inferences by making sure that the marker for which they would like to derive a new position constraint does not already have a position constraint with the same reckoner. This trick is not entirely satisfactory (as we will see in the context of the Reduce rule), but it does work.

The partial position constraints used by these rules also make use of the concept of "center of motion." Although the position constraints focus on the possible locations of markers, all the actual action is in the positions and orientations of the markers' links. To move a marker into its proper location or to align or orient a marker is actually to change the link, not the marker itself. The link comes to acquire its final location through a number of such motions. As has already been mentioned, all of the incremental motions of a link except the first are rendered tricky by the fact that any previously achieved states of the link's markers must be preserved by the new motion. For example, a link might have to pivot around a marker whose position is already known.

The spheres and lines and circles and so forth which specify partial position constraints on markers have a physical significance. If the rule system infers some marker to lie on some circle, at run-time the assembly procedure will have moved that marker's link so as to give the marker a provisional location somewhere on that circle. Once enough other information becomes available, perhaps in terms of another partial position constraint, the marker will be moved into its final location. In order to perform this operation correctly, the Intersect method has to be told what about the link needs to be preserved. In the most common case, it is satisfactory to swing the link about so that a marker in the center of the circle stays in place. In complex cases, though, some other marker's position needs to be maintained. This happens most commonly when the circle in question has been constructed by the Reduce rule by, for example, the intersection of a sphere and a plane. In such a case, the circle is not likely to have much of a physical significance; at least its center is not likely to correspond to any marker.

The rules concerning intersection and reduction of partial position constraints are the most important rules in the TLA system. Their job is to combine partial position constraint and to generate the forms, often very complicated ones, that navigate links in geometrically complex ways toward their final locations. The difference between intersection and reduction, as has been mentioned, is one of dimensionality. If the two shape constraints intersect in a zero-dimensional locus (i.e., a finite number of points) then one performs an explicit intersection operations. Otherwise one reduces the two constraints to a constraint of lower dimensionality that can then be combined with yet further constraints later on. Each reduction will decrease the dimensionality of the constraint by at least one, and each constraint is at most two-dimensional, so any given marker will have to endure at most one reduction before a proper intersection can take place.

Some things to notice about the rules Intersect, Intersect-Uniquely, and Reduce. First, they generalize across shapes, retrieving all the necessary shape-specific information from the relevant Intersectable, Intersectable-Uniquely, or Reduceable propositions in the database. Second, they take care not to run on markers whose positions have already been determined. Third, they avoid redundant work by combining information across joints, rather than by combining both constraints on each of the joint's markers. Finally, they only operate across coincident joints (such as revolute or universal joints), for which the two markers in question are actually constrained to occupy the same global location.

The Reduce rule is carefully constructed to avoid infinite loops. The problem is that there are two possible routes through which a redundant line of reasoning might proceed, corresponding to each of the two shape constraints. Accordingly, the Reduce rule constructs its reckoner by hashing the reckoners of the two constraints it is combining into a new, rather odd-looking symbol. This procedure will fail every once in a great while on account of the simplicity of the hashing procedure. If this should happen, it can be fixed by changing the name of one of the relevant markers or by writing a more elaborate hashing procedure.

The next few rules implement forms of inference that operate across coincident joints. Coincident joints are important because they allow partial information about one marker to be transferred to another marker on a different link. The simplest of these rules, Coincident-Joint-Markers-Share-Position, constrains the two markers to rest at the same location. In practice, this means that one of the markers has a known position and the other marker's link gets translated so that the second marker also occupies that position. The rule Coaligned-Joint-Markers-Share-Alignment is analogous, this time for alignment rather than position.

The rule Twist-Two-Coincident-Markers is for the special case where one of the input parameters sets the relation between the x axes of two markers that share a coincident joint—most often this means the angular displacement of a revolute joint or cylindrical joint.

The rule Universal-Joint-Markers-With-Aligned-Third-Have-Opposite-Twist is a special-purpose rule for getting the links that share a universal joint to be twisted in the same way. Mathematically, this means that the markers in the joint get twisted in opposite directions, since the markers' z axes both point away from the joint.

The next few rules are for propagating information across displaced joints—prismatic, cylindrical, and planar joints. (Planar joints do not work yet, since they have two degrees of freedom instead of one. This is easily repaired.) The rule Provisionally-Translate-and-Align-Displaced-Joint-Markers uses a subtle strategy to implement the constraint that the markers making up a displaced joint must share an alignment. The rule generates a form to translate the second link so that the second marker lies atop the first, even though it is unlikely that this is the correct, final location for the second link. Once the markers have gotten a common alignment, some other rule will then have to move the second link to its final location. Notice that this rule does not claim to have derived a position for the second marker, only an alignment.

The rule Translate-a-Relatively-Positioned-Displaced-Joint-Marker implements input variables that specify the displacement of a prismatic or cylindrical joint. Once the two markers making up the joint have been given a common alignment by the rule Provisionally-Translate-and-Align-Displaced-Joint-Markers, this rule can give them the proper displacement, whereupon both markers can be said to have their final position.

The rule Orient-a-Displaced-Joint-Marker is analogous to the rules Coincident-Joint-Markers-Share-Position and Coaligned-Joint-Markers-Share-Alignment, except that it operates on the "twist" of a marker, that is, the orientation of its x axis, given that its z axis has already been oriented properly. This rule can only operate on joints which actually force their markers to share an orientation; these joints are known, not surprisingly, as cooriented joints. Note the pattern: for every type of inference that can be drawn about some class of joints, the rule system defines a predicate for that joint class and the database initialization routine in the file 3D-Find generates the appropriate propositions before the rule system is set running. This scheme lets the rules be defined as compactly as possible.

The final set of rules allows the system to conclude that it has inferred enough about a link, and will have moved it around enough during the execution of the assembly procedure, so that the link has attained its final position and orientation in global coordinates. Note that none of these rules generates any forms. No forms are necessary because the necessary work has already been done by previously generated forms. These rules merely register that this work has been done and, in so doing, license further inferences by other rules which might generate further forms.

The various rules for inferring that a link is known all implement simple lemmas of geometry. A link is known if three markers have known positions, if two markers have positions and one of them has been aligned, and so forth. Some of these rules are tied to particular joint types and others are not.

In each of these rules, we have seen the same ingredients. Some partial information is known about some markers on some links. Some negative clauses specify conditions under which the inference in question is not necessary or would be redundant. Some assertions into the database record new information that can be inferred from the specified conditions. And some symbolic forms describe the computations, if any, that will have to be performed during the execution of the assembly procedure to bring the inferred conditions into being in the linkage that is being incrementally assembled. Judicious choices about representation have made these rules reasonably compact and comprehensible. Other rules will presumably be required, but can readily be supplied by one of skill in the art based on the existing rules.

4. File 3D-Find

The code in the file 3D-Find implements the interface between the TLA linkage compiler and the outside world. Given a linkage, it is responsible for setting up and calling the rule system and for constructing the final assembly procedure from the forms that the rules accumulate as they run.

The list *3D-Rules* contains the names of all the rules that the rule system will use. These rules are defined in the file 3D-Rules. When adding a new rule to the system, it should be added to *3D-Rules*.

The method Setup-Database takes a linkage and initializes the rule system's database. This involves several operations. First it clears the database, removing anything that might have been left in it from previous runs of the rule system. Then it reinitializes the internal state of the rule system's termination test and asks the procedure Initial-Assertions (in the file 3D-Rules) to assert the necessary linkage-independent propositions into the database. It then declares the ground link of the linkage to be known and asserts Link-Has-Marker for each marker of each link. The most complex part of the job concerns asserting propositions declaring the types of the various joints. This is the only use that the rule system makes of the objects representing the joints. It can add up to a significant number of propositions. If the taxonomy of joints changes, say because of the addition of an abstract representation, this code will have to be extended or revised to reflect the new joint types.

The rule system accumulates its forms and configuration variables in a series of variable that are reset by Reset-Globals at the beginning of each compilation.

The Push-Form procedure is called by the procedure Emit-Bindings in the file Engine when a rule fires successfully. It adds a new form to the assembly procedure. In doing so, it wraps a call to the procedure Execute-Form around the new form. Execute-Form does not do anything special itself, but the code later on in 3D-Find that manipulates the forms on their way to becoming a compiled assembly procedure will use the Execute-Form calls to build various debugging and self-documentation code into the assembly procedure.

The procedure New-Configuration-Variable simply makes a new Lisp symbol in the series Q0, Q1, Q2, . . . It is called by the rules themselves, using the :Set feature of Defrule, when a new configuration variable is called for.

The procedure Find-Closed-Form is the top-level procedure of the code in 3D-Find. Given a linkage, a ground link, and a set of input parameters, it tries to find an existing assembly procedure for it. If it finds none, it runs the rule system. This involves setting up the various global variables, initializing the rule system's rule scheduler, asserting propositions about the various input parameters into the database, and calling the procedure Run-Rules. If Run-Rules returns:Failure, the procedure Find-Closed-Form complains and returns a partial assembly procedure. If Run-Rules returns Success, Find-Closed-Form compiles an assembly procedure and returns it. It is possible that little or no distinction should be drawn between success and failure here, since failure to construct an assembly procedure could simply mean that the linkage is underconstrained. The right policy to adopt depends on the context in which the system is to be used, in particular when and how partially constrained linkages arise.

The Examine-Inputs procedure is responsible for parsing the specifications of input parameters and asserting descriptions of them into the database. Right now this procedure only covers a portion of the parameters one could imagine specifying for various kinds of linkages. Planar and spherical joints, for example, may also be incorporated. Anything beyond simply Relative-Twist or Displacement inputs would require more rules to be written. Note that this procedure asserts two propositions for each input parameter, according to the direction from which the rule system "approaches" the joint in question. In practice, one of the markers will very often be on a ground link, and in this case only the version of this proposition in which this marker appears first will actually be used, but it does not hurt to assert them both.

The next section of the code is responsible for manipulating the rule system's accumulated forms and making a proper assembly procedure out of them. The top-level procedure here is Tidy-Lambda. Tidy-Lambda has four jobs:

replacing marker and link names with the corresponding objects;

replacing scratch structure forms with actual structures;

flattening nested code, as in calls to Intersect; and adding code to optionally generate explanations and the link.

These functions are implemented by Substitute-Bindings, Insert-Scratch-Structures, Flatten-Forms, and Add-Debug-Forms, respectively. It is important that the operations be performed in this order. What Tidy-Lambda returns is a symbolic "lambda form," which the procedure Find-Closed-Form will feed to the compiler to make an actual compiled Lisp procedure. Actually compiling the procedure is not at all necessary; it just provides a small speed increase on the Lisp Machine and spares us having to write a proper interpreter for the assembly procedures. Such an interpreter would simply iterate over the forms in the assembly procedure, dispatching on their procedure names, and calling the respective procedures with the specified arguments. Alternatively, an ordinary LISP interpreter could be used.

Of the manipulations performed on the assembly procedure, the only complicated one is the flattening operation performed by Flatten-Forms. Flatten-Forms expects the forms it receives to have calls to Execute-Form wrapped around them and it reconstructs these calls when it is done with its work. The actual work is performed by the procedure Flatten-Form and its helper Flatten-Form-Internal. Flatten-Form-Internal takes an assembly procedure form and returns two values, an assembly procedure form produced by stripping out the input form's internal structure, and a list of assembly procedure forms produced by flattening out this internal structure. This code relies on the convention that all procedures invoked by the assembly procedures take as their last argument a scratch structure into which the result is to be stored. Each form is replaced by its scratch structure, which then serves to communicate results from the flattened-out procedure call to the procedure argument where this result is to be used. One could optimize the assembly procedures considerably by looking for duplicate operations among the flattened-out forms and sharing their scratch structures.

The Add-Debug-Forms procedure has a number of cases depending on the type of assembly procedure form it encounters. All these forms ought to have Execute-Form's around them, but Add-Debug-Forms will compensate if they do not. If they do, Add-Debug-Forms will take the Execute-Form apart and insert some debugging code. Note that all this debugging code is conditionalized on the state of a debugging flag (on a Lisp machine, this is simply the state of the mode lock key). Some other form of conditionalization could equally easily be used on another machine. Note also that some of the forms are declared as non-displaying, meaning that they don't change the state of the linkage being assembled, so there is no use producing explanations or redisplaying any numbers or the linkage itself.

The procedure Debug-Query is used in the demonstration of the assembly procedure's step-by-step operation. It could be much more sophisticated in the context of a real debugging or development tool.

E. Subsystem Geometry

The files in Subsystem Geometry implement domain-independent datastructures and procedures for 3-D geometry. Most of the other subsystems use 3-D very heavily. Notable among these is Subsystem Window, which displays linkages on the user's screen, and Subsystem Run-Time, which supports the assembly procedures as they are running. An important exception is Subsystem Closed-Form which does not do any 3-D geometry at all. It merely compiles the assembly procedures and its operation is wholly symbolic.

The TLA system's geometry code relies heavily on object-oriented programming. All of its geometrical entities—positions, vectors, transforms, lines, planes, and so forth—are implemented using PCL objects, defined using Defclass, and PCL methods, defined using Defmethod. Although the use of object-oriented programming has been a great convenience in the development of TLA, and despite the extensive use of PCL syntax in the code, the finished product does not rely on the semantics of objects and methods in any profound way and, therefore, the method could readily be adapted to other languages.

Subsystem Geometry comprises five files:
Positions-and-Vectors-1;
Positions-and-Vectors-2;
Transform;
Geometry; and
Analytic-Forms.

The division between Positions-and-Vectors-1 and -2 is arbitrary. These two files implement some very simple and nearly identical geometrical structures: 3-Tuples, Positions, Eulers, and Vectors.

The file Transform implements the standard $4 \times 4$ matrix transform representation of a 3-dimensional coordinate system, together with all of the necessary domain-independent operations on these transforms, such as composition and transformation of a vector in one coordinate system to its alter ego in another.

The files Geometry and Analytic-Forms implement datastructures for lines, points, and planes, together with all of the textbook domain-independent 3-dimensional geometric operations necessary to execute assembly procedures. Examples include the distance from a point to a line and the center-point of the circle defined by intersecting two spheres.

The files Geometry and Analytic-Forms are alternative versions of all of these functions; only one of them should be loaded at a time.

F. Subsystem Run-Time

Subsystem Run-Time contains the code necessary to execute an assembly procedure. More precisely, it contains the necessary TLA-specific code that implements the procedures that are called by the assembly procedures and generates textual explanations of the operations these procedures perform. Running an assembly procedure also requires the geometrical code in subsystem Geometry and probably some of the utility code in subsystem Utilities as well. The assembly procedures are not inherently very complicated, though, and should it be necessary it should be easy to circumscribe exactly what code must be loaded to execute one of them.

The file Primitives contains the procedures that are called by the assembly functions. These procedures make heavy use of the 3-D geometry facilities in subsystem Geometry.

The file Explain contains the facilities for generating explanations. Explanations can be directed to the screen or to an editor buffer. (It would be a simple matter to direct them to a file as well.) This involves code for interfacing with the Symbolics window system (which, unfortunately, must use the Symbolics Flavors object-oriented programming scheme) and the Symbolics text editor Zwei. It also involves code for formatting the text into a screen or editor buffer of a specified width.

1. File Primitives

The file Primitives contains the procedures that are called by the assembly functions. These procedures make heavy use of the 3-D geometry facilities in subsystem Geometry. More specifically, these procedures come in three classes:
Primitives;
Reduction functions;
Other functions; and
Pure Geometry functions (in the file Geometry).

Primitives change things and functions do not. Functions compute things and return them as values. When these returned values are structures (not numbers or binary values), these functions almost always take "scratch structures" as arguments. The result is stored in the scratch structure instead of being constructed afresh. The goal is to avoid building any new structure while running an assembly function.

Most of the procedures, primitives and functions alike, employ a special representation of 3-dimensional shapes that is also employed by the rules (in subsystem Closed-Form, file 3D-Rules). This representation is known as position-line-radius format. Every shape the system deals with (points, lines, planes, circles, spheres, and cylinders) can be represented using a position, a line, and a radius, and sometimes with only some subset of these.

A point is just a position. The TLA system's code tends to use point and position interchangeably.

A line is just a line. The position and radius are ignored.

A plane is a position and a line. Both the position and the line lie in the plane. The position does not lie on the line. (It would probably be better for the line to be normal to the plane.)

A circle is a position, a line, and a radius. The position is the center of the circle. The line passes through the center of the circle and is perpendicular to the plane in which the circle lies. The radius is the radius of the circle.

A sphere is a position and a radius. The position is the center of the sphere and the radius is the radius of the sphere.

A cylinder is a line and a radius. The line is the cylinder's axis of rotation and the radius is the cylinder's radius. The system does not actually use cylinders for anything at present.

The reason for representing 3-D shapes in this way, rather than by defining a class of datastructure for each shape, is so that the rules can be written in a way that generalizes over the shapes rather than having separate rules for each shape, or perhaps even each pair of shapes that one might ever intersect.

The primitives are:

Cache-markers: Record markers' global positions once the global position of their link has become known.

Intersect: Adjust two links so that certain specified markers end up at the same global location, given that certain information is already known about where the markers might already be in space, in terms of shapes of possible loci for them (lines, spheres, etc.).

Intersect-Uniquely: Like Intersect, except that the result does not need to be disambiguated using a binary configuration variable. For example, the intersection of two circles is ambiguous in a way that the intersection of two lines is not. In either case, of course, the circles or lines could be exactly coincident, in which case an error is signaled, or they could fail to intersect at all, in which the assembly fails. The difference between an error and a failure is described below.

Translate: Move a link so that a particular one of its markers rests on top of a particular other marker.

Translate-With-Displacement: Link Translate, except displace the link being moved along the axis of the specified maker by the specified distance.

Superimpose: Another name for Translate.

Align-Z-Axes: Rotate a link so that a particular marker's z axis aligns with a particular other marker's z axis.

Align-X-Axes: Rotate a link so that a particular marker's x axis aligns with a particular other marker's x axis, given that their z axes have already been aligned. This primitive also takes an optional argument in case the x axes should have a non-zero angular displacement ("relative twist").

Align-Universal-Axes: A form of Align-X-Axes for universal joints. It ensures that the two markers are twisted in symmetrically opposite ways.

The reduction functions are:

Circle-Center-From-Spheres: Given two spheres represented in position-line-radius format, return the center point of the circle defined by their intersection.

Line-Between-Spheres: Given two spheres represented in position-line-radius format, return the line between their two center points.

Circle-Radius-Between-Spheres: Given two spheres represented in position-line-radius format, return the radius of the circle defined by their intersection.

Circle-Center-From-Sphere-and-Plane: Given a sphere and a plane represented in position-line-radius format, return the center point of the circle defined by their intersection.

Line-Between-Sphere-and-Plane: Given a sphere and a plane represented in position-line-radius format, return the line normal to the center of the circle defined by their intersection.

Circle-Radius-From-Sphere-and-Plane: Given a sphere and a plane represented in position-line-radius format, return the radius of the circle defined by their intersection.

Line-Between-Planes: Given two planes represented in position-line-radius format, return the line defined by their intersection.

These following functions are not in the file Geometry because they either use the position-line-radius format to represent shapes or because they make explicit reference to markers as opposed to geometric constructs.

Global-Axis-Line: Given an alignable marker, construct and return the line in global coordinates along which its z axis lies.

Plane-From-a-Position-and-a-Line: Given a position and a line which lie in some plane, construct and return that plane.

Plane-Normal-From-a-Position-and-a-Line: Given a position and a line which lie in some plane, construct and return a line normal to that lane.

Plane-From-a-Circle: Given the center point and radius of a circle, construct and return the plane in which the circle lies.

Vector-Displace-Line: Given a line and two markers, construct and return a second line which is the first line translated by the vector difference between the two markers.

Vector-Displace-Position: Given a position and two markers, construct and return a second position which is the first position translated by the vector difference between the two markers.

In its simplest version, executing an assembly procedure is just a matter of calling the series of primitives it specifies. Things get more complicated, though, when something goes wrong. Things can go wrong in two different ways, errors and failures. An error occurs when one of the primitives, especially one of the Intersect methods, discovers a pathological condition from which the computation cannot recover. This is unusual.

More common is an assembly failure, which occurs when one of the primitives, again especially one of the Intersect methods, discovers that the linkage cannot be assembled with the specified set of parameters. Most often this occurs when two markers that need to be made coincident to assemble some joint cannot be brought into proximity because the links to which they are attached are already attached to other things which are too far apart.

When a primitive discovers an assembly failure, it calls the Signal-Assembly-Error form which is defined near the beginning of the file Primitives. If one is debugging the system, it can be arranged for this form to simply blow up and enter the debugger. In normal operation, though, the Signal-Assembly-Error form uses a nonlocal control feature of Lisp called Throw to return control back to the entry level of the assembly procedure. The error values are then returned by the assembly procedure.

When assembly error causes the assembly procedure to exit abnormally, several items of information are returned:

error-p: The value T indicates that an error in fact occurred.

error-name: A Lisp keyword that identifies the type of error.

string: A Lisp string that describes the error in English.

fatal-p: Usually Nil, but T if the problem is completely fatal.

q: the name of the configuration variable, if any, that was to be used in disambiguating the computation that encountered the error.

The code that receives this information might abort the program. It might decide to attempt another assembly with different parameters or it might simply record that the error occurred and move on to its next task.

G. Subsystem Simulation

The files in subsystem Simulation use assembly procedures to simulate the motion of a linkage under continuous variations in their input parameters. The files come in two groups. The files Data-Structures, Setup, and Simulate make up a new and straightforward simulator that works. The files Simulation-1, -2, and -3 make up a number of older simulators that probably don't work any more but that support a broader range of functionality and could probably be fixed if this functionality is needed. Only the first set of files will be documented in any detail here.

The file Data-Structures defines a set of global variables, each of which has a name surrounded by *asterisks*, that contain the structures that the simulator uses. It also defines some procedures for loading useful sets of values into these global variables before setting the simulation running.

The file Setup contains procedures for setting up a new simulation: getting ahold of the desired assembly procedure, initializing the window where the evolving linkage will be displayed, and what the best initial values for the linkage parameters are.

The file Simulate contains a procedure called Assemble for calling the assembly procedure and a procedure called Simulate that actually runs the simulation, together with a few support routines.

H. Subsystem Demo

Subsystem Demo contains several files for demonstrating the TLA system in action.

The file Test contains Define-Linkage-Class forms that define four planar linkage classes: Four-Bar, Crank-Slider, Six-Bar, and Dwell. It also defines global variables with names like *Four-Bar* and *Six-Bar* that are bound to typical instances of these linkages.

The file AAAI-Demo contains code that produces a reasonably clean demo of various planar linkages in action. This involves setting up the window, asking the user which demonstrations to run next at each point, drawing labels on the screen at appropriate moments, and so forth. This file also contains code that can exhaustively attempt to assemble all configurations of a linkage.

The file Graphics-Tests has two halves. The first half is a series of simple examples and utility routines for testing the graphics routines with which linkages are drawn on the screen. The second half is a useful debugging routine for displaying all the local and global positions of the markers in a linkage.

The file Suspension defines an automobile suspension. It contains a Define-Linkage-Class for Suspension, defines a number of drawing procedures, and finally provides the procedure Wiggle-Suspension to simulate and animate the suspension as it moves across some rough terrain.

The file Front-End defines an entire automobile front end, consisting of two suspensions hooked together. The point of this demonstration, apart from its being interesting in its own right, is that assembling a whole front end takes only twice as long as assembling a single wheel's suspension. The file contains a Define-Linkage-Class for Front-End, defines a number of drawing procedures, and initially provides the procedure Wiggle-Front-End to simulate and animate the front end as it moves across some rough terrain and the procedure Super-Wiggle, which calls Wiggle-Front-End repeatedly, asking it to display the front end from a series of perspectives.

The file Explore defines a facility for exploring the parameter space of a given linkage. Two parameters are displayed as the axes of a grid. The grid starts out grey, but as the program tries assembling various versions of the linkage, the grid squares turn either black (indicating that an assembly failure occurred) or white (indicating that the assembly procedure succeeded in assembling the linkage). The user can guide the search by moving the mouse to desired locations in the parameter space.

The file Script provides a couple of procedures that are useful in demonstrating the system. It assembles a suspension and Piece-by-Piece assembles it a step at a time with debugging information, so that one may observe how an assembly procedure operates.

The file Spatial-Four-Bar defines the spatial four bar linkage which is used in the automobile suspension example.

I. Application to Optimization

The above-described system could readily be adopted by those of skill in the art to compose Jacobian matrices in closed-form. This would allow more accurate solutions when performing optimization tasks. Further, the approach could be extended to include tolerances, kinematic forces, velocities, accelerations, and mechanisms with higher pair joints, such as gears and cams. Finally, by determining the loci of the motions of some of the parts of a mechanism, it should be possible to reduce the complexity of performing dynamic analyses by further constraining the dynamic system's formulation.

Deriving closed-form expressions for Jacobian matrices may, in some embodiments, be posed in terms of instant centers of rotation. It is not sufficient to differentiate all of the algebraic code that is called in an assembly procedure in order to compute a derivative. This code depends implicitly on other state variables in a link's transform. Differentiation without taking this into account may yield incorrect results. An alternative is to use instant centers of rotation. A differential change in a parameter can be viewed as differentially altering the position of a joint. Instant centers can then be used to find analytic expressions for the magnitude and direction of the movements of other parts of a mechanism.

IV. Optimization Method

The optimizer 10 used herein could be an optimizer of the type readily known to those of skill in the art such as a conjugate gradient method (e.g., Fletcher-Reeves or Polak-Ribiere) or a variable—metric method (e.g., Davidon-Fletcher-Powell), however, in a preferred embodiment, the optimization is carried out as described below.

Optimization of a mechanism is the iterative alteration of the parameters of the design in order to improve the design. Generally stated, the goal of optimization is to minimize some function that measures the difference of the actual behavior of the mechanism from its functional specification desired behavior. This function is referred to herein as the error function, E, and the vector of mechanism parameters is denoted as $\bar{p}$. Therefore, the goal of the optimization method is to find the value of $\bar{p}$ that minimizes E. The method disclosed herein is primarily with reference to optimization of the motion of a mechanism with respect to some desired motion, but it will be apparent to those of skill in the art that optimization of other parameters such as mechanical advantage, transmission angle, torque ratios, etc. can be handled in a similar manner.

FIG. 8 illustrates the path 30 traced by a part of a mechanism in a first configuration. It is desired to have the mechanism trace a path through points 32, 34, 36, and 38. The equation $f(\bar{p})$ describes the curve 30 with parameter vector p. Using a trial-and-error method, an engineer might change a parameter $p_j$ to be $p_j + \Delta p_j$. The new curve, $f(\bar{p}; p_j \rightarrow p_j + \Delta p_j)$ is shown as a dashed curve 40 in FIG. 8.

This new curve is closer to the desired specification. It may be assumed that the error function E is composed of sums of squares of difference terms $d_i$, i.e.:

$$E = \sum_i d_i^2.$$

If E' is the expected error after stepping the "right" amount in parameter $p_j$, the "right" step $\delta_j$ is calculated by first describing E':

$$E' = \sum_i \left( d_i - \delta_j \frac{\Delta d_i}{\Delta p_j} \right)^2.$$

which, solving for $\delta_j$ yields:

$$\delta_j = \frac{\sum_i d_i \frac{\Delta d_i}{\Delta p_j}}{\sum_i \left( \frac{\Delta d_i}{\Delta p_j} \right)^2} \qquad \text{IV(1)}$$

If the error function were truly linear, the above step would solve the problem in a single iteration. However, the error function is in general non-linear, so this method is applied iteratively in order to arrive at a solution. This formulation also assumes a sum of squares form for the error function. Other forms of error functions could readily be accommodated by those of skill in the art.

If a step is taken in each dimension in parameter space before the $\delta$ for the next dimension is calculated, the result is a finite-difference form of uni-variate optimization. If $\delta_j$ is calculated for all j, and a composite step is taken, the result is a finite-difference form of the steepest descent algorithm. The magnitude of the step is controlled by a constant $\delta$, so that Equation IV(1) becomes:

$$[\delta_j] = \gamma \left[ \frac{\sum_i d_i \frac{\Delta d_i}{\Delta p_j}}{\sum_i \left( \frac{\Delta d_i}{\Delta p_j} \right)^2} \right] \qquad \text{IV(2)}$$

The above algorithm has the known problem that if E has a minimum at the bottom of a long, narrow valley, the algorithm will "zig-zag," taking a very large number of very small orthogonal steps before reaching the minimum. This may be taken into account by considering more than one parameter change at a time. Therefore, the "right" step for all parameters, $\delta$, may be computed simultaneously. If all parameters are accounted for, E' is described by:

$$E' = \sum_i \left( d_i - \sum_j \delta_j \frac{\Delta d_i}{\Delta p_j} \right)^2.$$

The difference between this formulation and the one of Equation IV(1) is the summation over j of $\delta_j$'s effect on the error. A composite step direction $\delta$ is found by solving the matrix equation:

$$\left[ \sum_i \frac{\Delta d_i}{\Delta p_j} \frac{\Delta d_i}{\Delta p_k} \right] [\delta_k] = \left[ \sum_i d_i \frac{\Delta d_i}{\Delta p_k} \right] \qquad \text{IV(3)}$$

In order for the "right" step to be the true optimal step, the dependencies of the mechanism's error function on the parameters must be linear. If the functions were linear, then Equation IV(3) would reduce to a generalized least squares fit. In actuality, the equations are highly nonlinear; thus, iterative stepping is necessary until the system converges. The above method works much better than the steepest descent method because it recognizes that interdependencies exist between each parameter's influence on the error function. "Zig-zag" is not eliminated through use of the equation, but is reduced.

In the limit as $\Delta p \rightarrow 0$, Equation IV(3) becomes a differential equation. Now $\delta$ is found by solving the matrix equation:

$$\left[ \sum_i \frac{dd_i}{dp_j} \frac{dd_i}{dp_k} \right][\delta_k] = \left[ \sum_i d_i \frac{dd_i}{dp_k} \right] \quad \text{IV(4)}$$

The model of optimization illustrated in Equation IV(4) is referred to elsewhere herein as the Linear-Interdependent, or LI model.

As more fully described below, a method of varying smoothly between the extremes of LI model and steepest descent is provided herein. In a most preferred embodiment, the Marquardt method is applied in the context of the LI model.

In order to use steepest descent, a constant $\delta$ needs to be set to a reasonable value. The value of $\delta$ will depend on the smoothness of the error function, E. If E is quite bumpy, $\delta$ will need to be large. Consider also the step $\delta$ taken in the LI model. The magnitude of this step is about right when E is varying smoothly (i.e., linearly), and is too large when E is bumpy. Given these insights, Equation IV(4) can be modified as follows:

$$\left[ \gamma(j,k) \sum_i \frac{dd_i}{dp_j} \frac{dd_i}{dp_k} \right][\delta_k] = \left[ \sum_i d_i \frac{dd_i}{dp_k} \right] \quad \text{IV(5)}$$

where $$\gamma(j,k) = \begin{cases} 1 + \lambda & \text{if } j = k \\ 1 & \text{otherwise} \end{cases}$$

In the attached code, and in preferred embodiments, since the above error function E is known to be a quadratic, a value of $\delta$ as follows is utilized:

$$\gamma(j,k) = \begin{cases} a + \lambda & \text{if } j = k \\ a & \text{otherwise} \end{cases}$$

where a is less than or equal to 1 and in preferred embodiments is between 0.4 and 0.6 and in most preferred embodiments is about 0.5. This results in significantly fewer steps in regions of parameter space which closely resemble quadratic bowls.

Note that if $\delta$ is very large, the terms off the major diagonal of the left-hand side of Equation IV(5) become negligible, and Equation IV(5) reduces to Equation IV(4), steepest descent. If $\delta$ is very close to unity, then Equation IV(5) reduces to Equation IV(4).

The model illustrated by Equation IV(5) is referred to herein as LI*. The procedure for optimizing using LI* is now described. First, $\lambda$ is initialized to a small value, say $10^{-3}$, and E is computed. The following steps are then performed:

1. Solve Equation IV(5) for $\delta$, and evaluate o the new error, E'.

2. If E' is small enough, exit the optimization because the problem is nearly optimized.

3. If $\lambda$ is too large (i.e., on the order of $10^6$ to $10^8$ in some machines), exit the optimization. Either the error is at a minimum, or the method is not functioning because the contours of E are hideously curved.

4. If $E' \geq E$, increase $\lambda$ by a large factor (say 10), and go back to Step 1 because the step size is too large.

5. If $E' < E$, decrease $\lambda$ by the large factor because the problem is "behaving" well and it may be possible to take larger steps. The new value of E will be E'.

6. Go back to Step 1.

In a preferred embodiment, in Step 5 $\lambda$ is decreased by a large factor if $E' < bE$ where $b \leq 1$ and, in preferred embodiments is between 0.5 and 1 and in most preferred embodiments is about 0.9.

Therefore, an optimization technique is provided that scales itself smoothly between the LI model and the steepest descent model.

Traditional optimization techniques, like conjugate gradient and variable metric methods, assume a scalar objective function. The gradient of this function is calculated and used in determining the direction in which to step. Line minimizations are used to determine the magnitude of the step. In the LI* model of optimization, it is recognized that a vector objective function is being used. A collection of individual constraints make up the error function (e.g., the four target points of FIG. 8). Instead of using a gradient to determine the step direction, a Jacobian composed of the gradients of each individual constraint with respect to each parameter is used. Thus, the LI* model can examine the pattern of error changes, not just the magnitude of the error change.

Since the LI* model uses better information in choosing its step direction, it is more efficient in problems where there are more than a few constraints that comprise the error function. This has been determined to be the case empirically. Comparisons of different optimizations algorithms were done on a variety of test cases. Each test case involved the optimization of a four-bar linkage in which the path of the mechanism was desired to pass through several target points. The number of points varied from four to eleven. Each optimizer was run until it reached a level of error that was attainable by all of the optimization techniques. The number of iterations required to reach that level of error was recorded. The results of the test are summarized in Table 12.

TABLE 12

Comparison of Optimization Techniques
(Number of iterations on four-bar linkages)

| Method | Test Case Number | | | | |
|---|---|---|---|---|---|
|  | 1 | 2 | 3 | 4 | 5 |
| Davidon-Fletcher-Powell | 12 | 21 | 12 | 21 | 22 |
| Polak-Ribiere | 15 | 17 | 9 | 14 | 9 |
| Linear-Interdependent | 6 | 9 | 7 | 6 | 17 |
| LI* | 4 | 11 | 1 | 2 | 2 |

In the absence of closed-form Jacobians, the Jacobian matrix must be calculated using finite differences. Once way to calculate derivatives is to use finite differences with an iterative kinematic solver. Because the solver has some convergence tolerance, the finite difference step must be made substantially larger than the number of links multiplied by the joint convergence tolerance. Otherwise, non-repeatability in the assembly process will add an unacceptable amount of noise to the Jacobian values. A closed from kinematic solver allows the use of smaller finite difference step because of the accuracy and repeatability of the assembly process. A more accurate determination of Jacobian matrices is with the use of a closed-form Jacobian generator.

In a preferred embodiment, the mechanism to be optimized is modeled using a closed-form kinematic solver. However, not all mechanisms may be solved in closed form. Therefore, it is necessary in some cases to perform optimization where the mechanism is modeled using a traditional iterative kinematic solver. Several improvements to existing methods of performing mechanism optimization help to improve the stability and reliability of the optimization process.

Traditionally, optimization of mechanisms has been done on a case-by-case basis. In other words, a special routine would be written for optimizing a particular type of linkage. The method described here allows an arbitrary mechanism described in a generalized language to be optimized. Once such general language is given in Appendix 1. However, any general language, including industry standards like the ADAMS input format, may be easily incorporated by one of skill in the art. A method is provided for specifying which parameters of the mechanism are to be used as design variables in the optimization. This is specified textually, as described in Appendix 1. One skilled in the art may also make use of a menu-based approach for incrementally specifying optimization variables. Optimization variables include link lengths, joint marker locations and orientations, and tracer point locations and orientations.

For optimizing a linkage to pass through a set of target points (or to pass as closely as possible to the points), there are a few ways of setting up the optimization problem. FIG. 8 shows the coupler curve (30) of a linkage and four target points (32, 34, 36, 38). One way of formulating the optimization problem is to assign a variable to each linkage parameter that is permitted to vary, plus one variable for the value of the linkage's input that minimizes the distance from the tracer point of the linkage to a particular target point. Thus, the total number of variables over which the optimization will proceed is the number of free parameters in the mechanism plus the number of target points. The optimization objective is a function of all of the variables.

The optimization problem as it is formulated in one embodiment herein uses a two-stage process in which the distance of the tracer point to the target point is calculated by using another optimization step to determine the minimum value of the separation between the tracer point and the target point. In this formulation, the main optimization step has an objective which is a function of only the mechanism's free parameters. The other optimization step uses only the values of the linkage's input that minimize the distance of the tracer point from each target point. The two optimization steps are interleaved repeatedly. Since the second step only minimizes a function of one variable (the linkage's input), the second step optimization method can be something simple and efficient, such as Brent's method. An important feature of this problem formulation is that there is an explicit representation of the coupler curve of the mechanism.

Each target point may be specified as having a certain kind of constraint. For example, the path generation constraint stipulates that the distance of the target point to any point on the coupler curve is to be minimized. The path generation with timing constraint stipulates that the distance of the tracer point for a specific value of the linkage's input and the target point is to be minimized. The motion generation constraint stipulates that both the position and orientation of the tracer point must match as closely as possible the position and orientation of the target point. This constraint can be specified with or without timing, as in the case with path generation. This concept can be extended beyond target points. For example, the mechanical advantage of the linkage at a particular value of the linkage's input may be stipulated to have some minimum value. The length of a link may be constrained to lie within a certain range, etc. The vector of all of the constraints comprises the objective function used by the optimizer (if a traditional optimizer is used, the sum of the constraints defines the scalar objective function). A weight may be specified for each individual constraint to allow for the adjustment of the relative importance of each constraint to the problem solution.

During the optimization, the optimizer may sometimes reach a "saddlepoint," an area in parameter space with a ridge of nearly zero slope. In such a case, the derivative one or more optimization variables may be extremely small compared to the remaining ones. If the optimization used all the gradient values to calculate a step, then the step would be excessively large in the directions where the gradient was excessively small. This condition can be detected and the user of the optimization method warned of the problem. In this way, the user may adjust those design parameters for the next optimization step. Alternatively, this process may be performed automatically, by specifying a maximum ratio between the smallest gradient and the rest. If a gradient value exceeds this threshold, the corresponding optimization variable is fixed for the next optimization step.

Whether an iterative or closed-form kinematic solver is used, it may be the case that the optimizer has computed a step which alters the linkages parameters so that it can no longer be assembled near each of the target points. In this case the step is retracted, and the step is scaled back to a fraction of its previous value. The new, scaled-down step is then tried. If that also fails, then the process is repeated until the mechanism can be assembled.

For some mechanisms, some links in a mechanism may not be able to completely rotate. This may be determined by the inability of the mechanism to be assembled for some range of input values. This range will be bounded on either side by what is known in the literature as a locking position, or one where two links are pulled tight and cannot be further separated. The operating range of the mechanism can be determined by searching for the limits of assemblability and noting them for use in the optimization. The limits need to be determined after each step of the optimization method.

It may also be the case that the mechanism is very close to the point where it can no longer be assembled. It may be close enough that when a small step in one parameter is made to compute a derivative by the finite difference method, the mechanism cannot be assembled. In this case a value is assigned to be derivative that makes it extremely undesirable to move in that direction (e.g., a large magnitude in the direction opposite to the one which causes non-assemblability).

In iterative kinematic solvers, it may be the case that the linkage simulation branches from the desired solution to an undesirable solution. This can be detrimental if it occurs during optimization. In order to alleviate this condition, the timings of the target points are recomputed after each step in the following manner:

1. The entire path of the mechanism is recomputed by simulating the mechanism at some relatively large number of regularly spaced values for the linkage input.
2. For each target point, the closest point in Step 1 is used as a starting point for a search for the value of the linkage input which minimizes the distance of the tracer point to the target point. A method such as Brent's method may be used.

In calculating the values of derivatives by the finite difference method, it may sometimes be desirable to recompute the optimal value for the linkage input (using a method like Brent's) for the finitely differenced value of the linkage parameter. Usually this level of precision is not needed until perhaps the final one or two iterations of the optimizer. Since it is a very expensive operation, a switch allows the user of the system to control whether or not this computation is performed.

By keeping a record of all the optimization variable changes and constraint changes, it is possible to allow a user of the system to go back to any step of the optimization and to begin again from that point. This is useful if the user wishes to explore other options, such as adding or subtracting some optimization variables, or altering the weights of the constraints. These records of optimization steps are kept in a textual file that may be examined by the program or by a user of the system.

Appendix 1 also contains source code relating to the optimization method. The code is contained in the subsystem "TLA-Optimization." Each file is discussed individually below.

A. File Optimization-Spec

This file defines a class called optimization-spec, and defines related support functions. An optimization-spec defines an optimization problem and all of the parameters, constraints, etc., that are included in the problem. This is a general-purpose specification that also allows any optimization method to be used.

B. File OS-Functions

This file provides functions for efficiently building and accessing Jacobian matrices.

C. File Constraint-Definition

This file defines a form called DEFINE-CONSTRAINT-FUNCTION. This form allows a user to define a mapping from a symbolic constraint to a numerical penalty function.

D. File Optimizer

This file defines the class optimizer and several utilities. The utilities include default methods for initializing an optimizer and for taking an optimization step, plus exit predicates that are used to halt the optimizer.

E. File Levenberg-Marquardt-Optimizer

This file defines a specialized class of optimization and the Levenberg-Marquardt diagonal multiplication technique. Other specialized optimizers could be defined in a similar manner.

V. Qualitative Kinematics

As described above, it is preferable to perform a qualitative simulation of a mechanism before performing a detailed optimization. The qualitative simulation is used to determine numerical expressions for bounds in the parameter space that yield a desired behaviour (e.g., that a particular link be allowed to rotate a full 360° with respect to some other link).

A link 1 is shown in FIGS. 4a, 4b, and 4c. The link has revolute joints 3a and 3b at its end points. Each joint is provided with a local coordinate system, labeled north (N), east (E), south (S), and west (W). The local coordinate systems are normalized so that N is collinear with the link and points outward.

A force F is assumed to be applied to the link at joint 3a. Force F may result from, for example, the movement of an adjacent link or may be applied from the "outside." In the example illustrated in FIG. 4, the force is in the northeast (NE) quadrant. This force will be qualitatively representative of (or an abstraction of) all forces in the NE quadrant. Two forces are applied to joint 3b (labeled F1 and F2). F and F1 are added for analysis purposes and do not impact the solution for the mechanism behavior because they "cancel out", i.e., F1 and F2 are equal and opposite, so they cancel and add no net force to the system. However, forces F and F1 form a couple, and can be replaced by a rotational moment, shown as M in FIG. 4b. Moment M contributes a movement in direction E of joint 3b, while the force F2 contributes a movement in directions S and W of joint 3b. Thus, applying force F in the NE quadrant of joint 3a's coordinate system results in possible movements in the south half-plane of joint 3b's coordinate system as shown by markings 5 in FIG. 4c.

Propagation of forces in other qualitatively different directions may be similarly deduced. The propagation rules for the binary link with two revolute joints are as follows:

TABLE 13

| Propagation Rules | |
|---|---|
| Force on 3a | Movement on 3b (due to transmitted force) |
| N | S |
| S | N |
| E | E-W (East or West) |
| W | E-W (East or West) |
| NE | S-halfplane |
| NW | S-halfplane |
| SE | N-halfplane |
| SW | N-halfplane |
| G (Ground) | E-W (East or West) |

Similar tables may readily be derived by one of skill in the art for prismatic joints.

The above propagation rules for a link are now applied to a linkage. FIG. 5 shows a four-bar linkage 6. The four bars are 7a, 7b, and 7c and the implicit grounded bar 7d. Joints of the linkage are numbered 9a, 9b, 9c and 9d. Joints 9a and 9d are grounded. In a digital computer system, the linkage may be represented as a graph whose nodes are the joints of the linkage and whose arcs are the links of the linkage.

To propagate the effects of an applied force throughout a linkage, the above propagation rules are applied to each link in the mechanism in a "round-robin" fashion. The rules for each link are first listed in some arbitrary order as list R1, R2...Ri. The links are listed in some order L1, L2 . . . Lj. The following qualitative simulation method is then applied:

(1) For each link in Lj, go through R until an applicable rule is found, i.e., a rule in which some direction of movement of the joint matches the "force" on the table of propagation rules. (There may be more than one.)

(2) Apply the rule. If the rule does not alter the restriction on movement of the relevant joint go on to the next rule. By "restriction" it is intended herein to mean the set of possible motions for a joint. For example, in Table 13 a "N" force applied to joint 3a results in a "S" restriction on joint 3b. If there are no other rules, go back to (1).

(3) If no rule alters a joint's restriction (i.e., no rule changes the possible motions for a joint), then the propagation algorithm has settled and the result is that the remaining restriction taken collectively denote the possible movements of the linkage.

Reactive restrictions are also applied to each joint in the system. In most commonly encountered linkage systems, certain restraints may be imposed on the system (such as grounding of a link) which prevent movement of one or more links in certain directions. Joints connected to ground restrict the movements of joints that are adjacent to them; restrictions on the adjacent joints can lead to restrictions on further joints, and so on. The forces responsible for the restriction of movement are called reactive forces, and the set of permitted potential movements left after the reactive forces are accounted for are called the reactive restriction (referred to herein as R). Consequently, joint 9b is permitted to move only in the E or W direction. Generally if, a joint is grounded its adjacent joint can only move in E or W.

The above-described steps (1), (2) and (3) are then preceded by the steps of:

(a) Determining the reactive restriction, i.e., determining the set of potential movements permitted by grounding and the like. R is then set to the reactive restriction.

(b) Using F+R as the initial set of forces, calculate the results using the algorithm of steps (1), (2) and (3), that is, using F and R, determine the potential range of movement of each joint. When two restrictions apply to a joint, only the intersection of the two restrictions can be utilized.

Alternatively, the reactive restriction can be applied as an additional restriction ("G") in the list of propagation rules, as shown in Table 13.

Utilizing the above method, it is also possible to determine what "landmark" states the mechanism can move into. "Landmark" states are those in which a pair of joints are as "stretched out" or "bent in" as possible. For example, referring to FIGS. 6a, 6b, 6c and 6d, applying force F to the system in FIG. 6a will eventually lead to the configuration shown in 6b, in which the two links are as stretched out as possible (at a 180° angle). Similarly a transition from 3c to 3d can occur, where the links are as bent in as possible (0°). Any linkage configuration where one or more of the pairs of bars in the system are at a landmark value is called a landmark state for that linkage. Similar transitions exist for prismatic (sliding) joints.

To determine the next landmark state, the results of the above-described method are first used to determine the instantaneous motions of each joint. These motions are then used to determine whether angles between bars are increasing or decreasing. In FIG. 5, the applied force F results in the movement M of joint 9c. The inside angle at joint 9b is decreasing, the inside angle at joint 9c is increasing, the inside angle at joint 9d is decreasing, and the inside angle at joint 9a is increasing.

Thus, the next possible landmark states will be characterized by one or more of the following events:
angle a-b goes to 0°;
angle b-c goes to 180°;
angle c-d goes to 0°; or
angle d-a goes to 180°.

Some combinations of these will be physically impossible; pruning rules derived from simple geometric analysis can be used to determine which combinations should be eliminated because they are not physically possible.

After applying pruning rules, only three next states are possible for the mechanism of FIG. 5 under applied force F. These are shown in FIG. 7. Either:

(a) the angle at joint 9c becomes 180° (b and c pull tight) (FIG. 7a);

(b) the angle at joint 9a becomes 180° (FIG. 7b); or (c) both (a) and (b) occur simultaneously (FIG. 7c).

From these three next states, it is possible to simulate behavior of the linkage by applying new forces. Each of these states may result in several possible next states. In this way, all possible landmark states of the mechanism may be found, as well as the set of transitions between them. Given this set of landmark states, it is now possible to determine a path through the landmark states. This path is called the "envisionment."

If a, b, c, and d represent the lengths of links 7a, 7b, 7c, and 7d, respectively, the following geometric constraints must exist for the states shown in FIGS. 7a to 7c:

for the state shown in FIG. 7a, $a+d>b+c$ by the triangle inequality;

for the state shown in FIG. 7b, $a+d<b+c$ by the triangle inequality;

for the state shown in FIG. 7c, $a+d=b+c$ collinearity;

Note that for all of the states shown in FIGS. 7a to 7c, if $p=(a+b+c+d)/2$ and the links form a closed loop then:

$$a<p$$

$$b<p$$

$$c<p$$

$$d<p$$

To physically be able to achieve a behavior described by a path through a set of states in the envisionment, all constraints must be consistent for any path through the envisionment. Therefore, when postulating a set of next states from one state in the envisionment, any new state which has a constraint that is inconsistent with the path that it terminates may be removed from the envisionment.

Once a designer performs the above qualitative simulation of a mechanism, a path (or paths) through the envisionment will describe the qualitative behavior that is desired. The set of constraints for that path (or the disjunction of the sets of constraints for multiple paths) places restrictions on the numerical values for link lengths that the linkage may have in order to operate in the desired behavior range(s). Detailed numerical analysis of the system may then be performed in a much more efficient manner with optimization having constraints that were derived to keep the mechanism in its desired behavioral range.

It should be noted that the above method can be useful in determining if a particular mechanism will act as a linkage or a truss. This can be readily determined before a "force" is applied to the mechanism. All of the joints of a truss will be found to be completely constrained, i.e., grounding and the like will impose constraints on the mechanism such that there is no possible range of motion. For example, in a triangular mechanism in which 2 of the joints are grounded, it is found that the apex of the triangle is constrained to move only in an E-W direction by the first grounded member and only in an opposing E-W direction by the second grounded member. Hence, there is no possible range of movement and the mechanism will act as a truss.

It is apparent that the above method has been described with reference to a 2-dimensional system, but the method could readily be extended by one of skill in the art to a 3-dimensional system by extending the coordinate system from:

north, east, south, west to:

north, east, south, west, up, down.

Appendix 3 provides source code for one embodiment of a qualitative kinematics method. The code is in Symbolics ZetaLisp, a language well known to those of skill in the art. The code implements simulation of instantaneous movements in response to a qualitative force or forces but does not create a full envisionment. A program for building envisionments could readily be created based on this disclosure by one of skill in the art.

Selected portions of the code are described in greater detail below.

A. File KEMPE

This is the system definition file for Kempe. It describes the files which comprise the system, and shows the order in which they must be loaded. The Kempe system is written on top of a graphics system called VEGA, which was jointly developed by Schlumberger and Stanford University. A public domain version of VEGA is available from Stanford.

Both VEGA and Kempe are written in Symbolics ZetaLisp, using the Flavors object-oriented programming system. However, it should be noted that one skilled in the art could easily translate this code to CommonLisp and the CommonLisp Object Standard (CLOS) so that it could run on a variety of platforms.

Most of the code is concerned with user interface. The only code which performs the qualitative simulation is found in files CONSTRAINT-SYSTEM, CONSTRAINT-SYSTEM-2, and CONSTRAINTS.

B. Files CROSSHAIR-BLINKER and SLIDER-BLINKER

These files define functions that constrain the mouse on a Symbolics Lisp Machine to behave in certain ways. File CROSSHAIR-BLINKER defines functions which change the shape of the mouse into a large set of crosshairs. File SLIDER-BLINKER defines functions which force the mouse to slide along a specified line. These files are for the graphical user interface to Kempe.

C. Files PIVOTS, BAR, ANGLES, SLIDER

These files define the primitives which make up the data structures of linkages created by a user. The files define the slots of the data structures, as well as the way in which they respond graphically to the mouse.

For example, in file PIVOTS, the pivot (also known as joint) datastructure is defined. A pivot has a local position (xpos, ypos) and a global, or "world" position (wxpos, wypos). It also has a set of angles. Functions are provided for drawing pivots, for highlighting themselves when selected ("blinking"), and for adding and deleting angles.

Similarly, file BAR defines datastructures and graphics for bars (also known as links) of a linkage. File ANGLES provides datastructures for managing the North-East-South-West local coordinates of a joint and the angles of overlap between multiples of such local coordinate systems on the same joint. Slider defines pivots for sliding joints.

D. Files MENUS and LABELS

These files define the menu and command interfaces for the Kempe system. File MENUS defines which menus pop up, depending on what the mouse was over when a mouse button was clicked. Each menu entry specifies what text appears on the menu and what function gets called to execute the menu operation.

The file LABELS alters the default characteristics of the VEGA system to make it distinct looking for Kempe. It also defines a set of textual commands (some of which overlap with the menu functionality) to be used in VEGA's command processor.

E. File FLAVORS

This file is a "hook" that allows for future component flavors to be added to the pivots, angles, and bars. This allows for adding functionality without having to recompile large numbers of files or rename flavor definitions.

F. File CONSTRAINT-SYSTEM

This file defines the form DEFCONSTRAINT that is used for describing various constraints in the system. The constraint method is implemented here. The method initializes a global variable (called *theory*) for a given problem. Function CONSTRAIN-MOTION implements the intersection of restrictions (in the code a restriction is called a motion-list).

G. File CONSTRAINT-SYSTEM-2

This file has two major parts. The first part defines the functions that graphically display the results of a constraint propagation session. The second part (from the definition of CP onwards) defines the functions that apply the constraints. These are divided into two sets: Static constraints, which only involve reactive restrictions, and dynamic constraints, which involve applied forces.

H. File CONSTRAINTS

This file contains the definitions of the actual constraints used in Kempe. The constraints are written procedurally, but could also be implemented in tabular form. For example, the last constraint in the file, called PUSH-PULL, defines the behavior of the transmission of force between the joints at either end of a bar. This constraint implements the propagation rules found in Table 13.

FIGS. 11a to 11f illustrate analysis of a mechanism according to one embodiment of the invention. FIG. 11a illustrates a 5-bar linkage mechanism which has been entered into the system. The ground link is not shown. The grounded joints have a dot in the center.

FIG. 11b shows a menu from which a designer may elect various options, e.g., to add a bar, pivot, etc. "Show static constraints" is selected to show only the constraints that contribute to the reactive restrictions. The single lines show that certain joints (B and D) can only move in directions along the lines. Joint C, however, is unconstrained at this point.

FIG. 11d illustrates a second menu from which "Show Dynamic Constraints" is selected. This permits entry of a qualitative force into the linkage.

FIG. 11e illustrates a qualitative applied force (the line with the dot) and reactions thereto. Joints B and D are now constrained to move in only one direction.

FIG. 11f illustrates another applied force, this force being between the range of force between two coordinate axis. Again, joints B and D are constrained to move in only one direction.

VI. Catalog Generation and Selection

Appendix 4 provides source code in CommonLisp for generating catalogs of four-bar linkages with catalog entries uniformly distributed in parameter space. Entries in the catalog are automatically characterized according to qualitative and quantitative features. Entries are automatically grouped according to curve shapes.

A. File Unisim

This file contains functions for sampling a linkages' coupler cure uniformly along its perimeter length. This is used for later characterization of the curves.

B. File Newpsil

Contains functions for characterizing curves by curvature and derivatives of curvature.

C. File 1Base

Contains code for manipulating association lists that are used in the indexing of linkage properties.

D. File Graph

Utilities for plotting graphs of data.

E. File Getpath

Functions for generating a smooth curve from a set of user-specified points. This curve can be characterized and then matched in the catalog.

F. File Fourier

Code for analyzing linkage curves using Fourier transforms.

G. File Catalog-Linkages

This file defines the high-level functions used for characterizing linkage curves in the catalog. It also defines utilities for browsing through catalogs.

H. File Catalog

This file defines the data structures that make up the catalog itself. It also defines functions for manipulating the data structures.

It is to be understood that the above description is intended to be illustrative and not restrictive. For example, the methods disclosed herein could be used in the design and analysis in a wide variety of contexts such as structural design, circuit design, and the like. The scope of the invention should, therefore, not be determined with reference to the above description, but instead should be determined with reference to the appended claims, along with the full scope of equivalents to which they are entitled.

What is claimed is:

1. In a digital computer, a method of performing a kinematic analysis of a linkage comprising the steps of:
    a) storing linkage information for members of a linkage said information comprising topological and geometric information, said topological and geometric information further comprising a plurality of kinematic constraints;
    b) using said stored information to generate an assembly procedure for at least partially assembly a computer representation of said linkage, said assembly procedure comprising a plurality of assembly rules for said linkage;
    c) storing said assembly procedure; and
    d) iteratively using said assembly procedure to at least partially assemble computer representations of said linkage in response to at least one driving input, said computer representations simulating position and orientation of parts of said linkage during motion of said linkage.

2. The method as recited in claim 1, wherein the method uses single precision arithmetic.

3. In a digital computer, a method of performing a kinematic analysis of a linkage comprising the steps of:
    a) storing linkage information for members of a linkage said information comprising topological and geometric information;
    b) using said stored information to generate an assembly procedure for at least partially assembling a computer representation of said linkage, said assembly procedure comprising a plurality of assembly rules for said linkage;
    c) storing said assembly procedure; and
    d) iteratively using said assembly procedure to at least partially assemble computer representations of said linkage in response to at least one driving input, wherein said topological stored information further comprises joint type, link length, link shape, and location of joints on links.

4. In a digital computer, a method of performing a kinematic analysis of a linkage comprising the steps of:
    a) storing linkage information for members of a linkage said information comprising topological and geometric information;
    b) using said stored information to generate an assembly procedure for at least partially assembling a computer representation of said linkage, said assembly procedure comprising a plurality of assembly rules for said linkage;
    c) storing said assembly procedure; and
    d) iteratively using said assembly procedure to at least partially assemble computer representations of said linkage in response to at least one driving input, wherein said geometric information further comprises a series of generalized rules.

5. The method as recited in claim 4, wherein said generalized rules are selected from the group rules for inferring marker constraints, rules for constructing displaced marker constraints, rules for intersecting and reducing constrained markers, rules for propagating constraints across joints, rules for inferring that a link is known, rules for moving links to satisfy new constraints while preserving existing constraints, and combinations thereof.

6. In a digital computer, a method of performing a kinematic analysis of a linkage comprising the steps of:
   a) storing linkage information for members of a linkage said information comprising topological and geometric information;
   b) using said stored information to generate an assembly procedure for at least partially assembly a computer representation of said linkage, said assembly procedure comprising a plurality of assembly rules for said linkage;
   c) storing said assembly procedure;
   d) iteratively using said assembly procedure to at least partially assemble computer representations of said linkage in response to at least one driving input; and
   e) supplying a binary configuration parameter, said binary configuration parameter resolving an ambiguity in assembly of at least one pair of links.

7. In a digital computer, a method of performing a kinematic analysis of a linkage comprising the steps of:
   a) storing linkage information for members of a linkage said information comprising topological and geometric information;
   b) using said stored information to generate an assembly procedure for at least partially assembling a computer representation of said linkage, said assembly procedure comprising a plurality of assembly rules for said linkage;
   c) storing said assembly procedure;
   d) iteratively using said assembly procedure to at least partially assemble computer representations of said linkage in response to at least one driving input; and
   e) supplying a vector of binary configuration parameters, said vector resolving ambiguities in assembly of the linkage.

8. In a digital computer, a method of performing a kinematic analysis of a linkage comprising the steps of:
   a) storing linkage information for members of a linkage said information comprising topological and geometric information;
   b) using said stored information to generate an assembly procedure for at least partially assembling a computer representation of said linkage, said assembly procedure comprising a plurality of assembly rules for said linkage;
   c) storing said assembly procedure; and
   d) iteratively using said assembly procedure to at least partially assemble computer representations of said linkage in response to at least one driving input, wherein the step of iteratively using said assembly procedure is used to evaluate an error function, said error function representing a departure from a desired behavior of the linkage.

9. In a digital computer, a method of performing a kinematic analysis of a linkage comprising the steps of:
   a) storing linkage information for members of a linkage said information comprising topological and geometric information;
   b) using said stored information to generate an assembly procedure for at least partially assembling a computer representation of said linkage, said assembly procedure comprising a plurality of assembly rules for said linkage;
   c) storing said assembly procedure; and
   d) iteratively using said assembly procedure to at least partially assemble computer representations of said linkage in response to at least one driving input, wherein the error function is used to substantially optimize said linkage.

10. In a digital computer, a method of performing a kinematic analysis of a linkage comprising the steps of:
    a) storing linkage information for members of a linkage said information comprising topological and geometric information;
    b) using said stored information to generate an assembly procedure for at least partially assembling a computer representation of said linkage, said assembly procedure comprising a plurality of assembly rules for said linkage;
    c) storing said assembly procedure; and
    d) iteratively using said assembly procedure to at least partially assemble computer representations of said linkage in response to at least one driving input, wherein said digital computer is programmed in a LISP language.

11. In a digital computer, a method of performing a kinematic analysis of a linkage comprising the steps of:
    a) storing linkage information for members of a linkage said information comprising topological and geometric information;
    b) using said stored information to generate an assembly procedure for at least partially assembling a computer representation of said linkage, said assembly procedure comprising a plurality of assembly rules for said linkage;
    c) storing said assembly procedure; and
    d) iteratively using said assembly procedure to at least partially assemble computer representations of said linkage in response to at least one driving input, wherein said stored information is in the form of a database, said database comprising a set of propositions said propositions defining at least markers associated with links of said linkage.

12. The method as recited in claim 11, wherein said propositions are generated by said generalized rules.

13. The method as recited in claim 11, wherein said propositions comprise open and closed predicates, said closed predicates remaining constant during said step of generating, said open predicates encoding items of partial knowledge that is being incrementally inferred.

14. In a digital computer, a method of performing a kinematic analysis of a linkage comprising the steps of:
    a) storing linkage information for members of a linkage said information comprising topological and geometric information;
    b) using said stored information to generate an assembly procedure for at least partially assembling a computer representation of said linkage, said assembly procedure comprising a plurality of assembly rules for said linkage;
    c) storing said assembly procedure;
    d) iteratively using said assembly procedure to at least partially assemble computer representations of said linkage in response to at least one driving input;
    e) storing location constraints of at least two markers; and
    f) intersecting said constraints in said assembly procedure.

15. The method as recited in claim 14 wherein the step of intersecting is a step of intersecting a member of the group circles, spheres, planes, cylinders, ellipses, helixes, cycloids, and lines with a member of the group circles, spheres, planes, cylinders, ellipses, helixes, cycloids, and lines.

16. In a digital computer, a method of performing a kinematic analysis of a linkage comprising the steps of:
   a) storing linkage information for members of a linkage said information comprising topological and geometric information;
   b) using said stored information to generate an assembly procedure for at least partially assembling a computer representation of said linkage, said assembly procedure comprising a plurality of assembly rules for said linkage;
   c) storing said assembly procedure; and
   d) iteriatively using said assembly procedure to at least partially assemble computer representations of said linkage in response to at least one driving input, wherein a link is assumed to be known when the position of three markers on a link are known; when the position, alignment, and orientation of one marker on a link are known; when the position of one marker is known and the position and alignment of another marker is known; when the position and alignment of one marker are known and the alignment of a second marker is known; or where the position of two non-alignable markers are known and there is no third marker.

17. In a digital computer, a method of performing a kinematic analysis of a linkage comprising the steps of:
   a) storing linkage information for members of a linkage said information comprising topological and geometric information;
   b) using said stored information to generate an assembly procedure for at least partially assembling a computer representation of said linkage, said assembly procedure comprising a plurality of assembly rules for said linkage;
   c) storing said assembly procedure; and
   d) iteratively using said assembly procedure to at least partially assemble computer representations of said linkage in response to at least one driving input, wherein a pattern matcher determines if a generalized rule matches an entry in a database.

18. The method as recited in claim 11, wherein said propositions may only be asserted into a database during generation of said assembly procedure.

19. The method as recited in claim 11, wherein a pattern matcher determines if a generalized rule matches an entry in a database during generation of said assembly procedure, said database comprising a set of propositions, said propositions defining at least markers associated with links of said linkage, said pattern matcher matching propositions which share predicates.

20. The method as recited in claim 19, wherein said generalized rules are preferentially applied when a predicate on which they depend has been previously asserted into said database.

21. Apparatus for simulating kinematic behavior of a linkage comprising:
   a) a digital computer programmed to:
      i) store linkage information for members of a linkage, said information comprising topological and geometric information, said topological and geometric information further comprising a plurality of kinematic constraints;
      ii) process said stored information to generate an assembly procedure for at least partially assembling a computer representation of said linkage;
      iii) store said assembly procedure; and
      iv) iteratively use said assembly procedure to at least partially assemble computer representations of said linkage in response to at least one driving input, said computer representations simulating position and orientation of parts of said linkage during motion of said linkage; and
   b) means for displaying said linkage using at least one of said computer representations.

22. Apparatus as recited in claim 21, wherein said digital computer operates in a single precision mode.

23. A digital computer for kinematic analysis of a linkage programmed to:
   a) store linkage information for members of a linkage said information comprising topological and geometric information, said topological and geometric information further comprising a plurality of kinematic constraints;
   b) use said stored information to generate an assembly procedure for at least partially assembling a computer representation of said linkage, said assembly procedure comprising a plurality of assembly rules for said linkage;
   c) storing said assembly procedure; and
   d) iteratively use said assembly procedure to at least partially assemble computer representations of said linkage in response to at least one driving input, said computer representations simulating position and orientation of parts of said linkage during motion of said linkage.

24. The computer as recited in claim 23, wherein the computer uses single precision arithmetic.

25. A digital computer for kinematic analysis of a linkage programmed to:
   a) store linkage information for members of a linkage said information comprising topological and geometric information;
   b) use said stored information to generate an assembly procedure for at least partially assembling a computer representation of said linkage, said assembly procedure comprising a plurality of assembly rules for said linkage;
   c) storing said assembly procedure; and
   d) iteratively use said assembly procedure to at least partially assemble computer representations of said linkage in response to at least one driving input, wherein said topological stored information further comprises joint type, link length, link shape, and location of joints on links.

26. A digital computer for kinematic analysis of a linkage programmed to:
   a) store linkage information for members of a linkage said information comprising topological and geometric information;
   b) use said stored information to generate an assembly procedure for at least partially assembling a computer representation of said linkage, said assembly procedure comprising a plurality of assembly rules for said linkage;
   c) storing said assembly procedure; and
   d) iteratively use said assembly procedure to at least partially assemble computer representations of said linkage in response to at least one driving input, wherein said geometric information further comprises a series of generalized rules.

27. A digital computer for kinematic analysis of a linkage programmed to:
   a) store linkage information for members of a linkage said information comprising topological and geometric information;

b) use said stored information to generate an assembly procedure for at least partially assembling a computer representation of said linkage, said assembly procedure comprising a plurality of assembly rules for said linkage;

c) storing said assembly procedure; and d) iteratively use said assembly procedure to at least partially assemble computer representations of said linkage in response to at least one driving input, wherein said generalized rules are selected from the group rules for inferring marker constraints, rules for constructing displaced marker constraints, rules for intersecting and reducing constrained markers, rules for propagating constraints across joints, rules for inferring that a link is known, rules for moving links to satisfy new constraints while preserving existing constraints, and combinations thereof.

28. A digital computer for kinematic analysis of a linkage programmed to:

a) store linkage information for members of a linkage said information comprising topological and geometric information;

b) use said stored information to generate an assembly procedure for at least partially assembling a computer representation of said linkage, said assembly procedure comprising a plurality of assembly rules for said linkage;

c) storing said assembly procedure; and d) iteratively use said assembly procedure to at least partially assemble computer representations of said linkage in response to at least one driving input, wherein said computer is further programmed to input binary configuration parameter, said binary configuration parameter resolving an ambiguity in assembly of at least one pair of links.

29. A digital computer for kinematic analysis of a linkage programmed to:

a) store linkage information for members of a linkage said information comprising topological and geometric information;

b) use said stored information to generate an assembly procedure for at least partially assembling a computer representation of said linkage, said assembly procedure comprising a plurality of assembly rules for said linkage;

c) storing said assembly procedure; and d) iteratively use said assembly procedure to at least partially assemble computer representations of said linkage in response to at least one driving input, wherein said computer is further programmed to supply a vector of binary configuration parameters, said vector resolving ambiguities in assembly of the linkage.

30. A digital computer for kinematic analysis of a linkage programmed to:

a) store linkage information for members of a linkage said information comprising topological and geometric information;

b) use said stored information to generate an assembly procedure for at least partially assembling a computer representation of said linkage, said assembly procedure comprising a plurality of assembly rules for said linkage;

c) storing said assembly procedure; and d) iteratively use said assembly procedure to at least partially assemble computer representations of said linkage in response to at least one driving input, wherein said computer is further programmed to iteratively use said assembly procedure to evaluate an error function, said error function representing a departure from a desired behavior of the linkage.

31. The computer as recited in claim 30 wherein the error function is used to substantially optimize said linkage.

32. A digital computer for kinematic analysis of a linkage programmed to:

a) store linkage information for members of a linkage said information comprising topological and geometric information;

b) use said stored information to generate an assembly procedure for at least partially assembling a computer representation of said linkage, said assembly procedure comprising a plurality of assembly rules for said linkage;

c) storing said assembly procedure; and d) iteratively use said assembly procedure to at least partially assemble computer representations of said linkage in response to at least one driving input, wherein said computer is programmed in a LISP language.

33. A digital computer for kinematic analysis of a linkage programmed to:

a) store linkage information for members of a linkage said information comprising topological and geometric information;

b) use said stored information to generate an assembly procedure for at least partially assembling a computer representation of said linkage, said assembly procedure comprising a plurality of assembly rules for said linkage;

c) storing said assembly procedure; and d) iteratively use said assembly procedure to at least partially assemble computer representations of said linkage in response to at least one driving input, wherein said stored information is in the form of a database, said database comprising a set of propositions said propositions defining at least markers associated with links of said linkage.

34. A digital computer for kinematic analysis of a linkage programmed to:

a) store linkage information for members of a linkage said information comprising topological and geometric information;

b) use said stored information to generate an assembly procedure for at least partially assembling a computer representation of said linkage, said assembly procedure comprising a plurality of assembly rules for said linkage;

c) storing said assembly procedure; and d) iteratively use said assembly procedure to at least partially assemble computer representations of said linkage in response to at least one driving input, wherein said propositions are generated by said generalized rules.

35. A digital computer for kinematic analysis of a linkage programmed to:

a) store linkage information for members of a linkage said information comprising topological and geometric information;

b) use said stored information to generate an assembly procedure for at least partially assembling a computer representation of said linkage, said assembly procedure comprising a plurality of assembly rules for said linkage;

c) storing said assembly procedure; and d) iteratively use said assembly procedure to at least partially assemble computer representations of said linkage in response to at least one driving input, wherein said propositions comprise open and closed predicates, said closed predicates remaining constant during said step of generating, said open predicates encoding items of partial knowledge that is being incrementally inferred.

36. A digital computer for kinematic analysis of a linkage programmed to:
   a) store linkage information for members of a linkage said information comprising topological and geometric information;
   b) use said stored information to generate an assembly procedure for at least partially assembling a computer representation of said linkage, said assembly procedure comprising a plurality of assembly rules for said linkage;
   c) storing said assembly procedure; and
   d) iteratively use said assembly procedure to at least partially assemble computer representations of said linkage in response to at least one driving input, wherein said computer is further programmed to:
      i) store location constraints of at least two markers; and
      (ii) intersect said constraints in said assembly procedure.

37. A digital computer for kinematic analysis of a linkage programmed to:
   a) store linkage information for members of a linkage said information comprising topological and geometric information;
   b) use said stored information to generate an assembly procedure for at least partially assembling a computer representation of said linkage, said assembly procedure comprising a plurality of assembly rules for said linkage;
   c) storing said assembly procedure; and
   d) iteratively use said assembly procedure to at least partially assemble computer representations of said linkage in response to at least one driving input, further comprising a pattern matcher to determine if a generalized rule matches an entry in a database.

38. The computer as recited in claim 23 wherein said assembly procedure terminates when the position of three markers on a link are known; when the position, alignment, and orientation of one marker on a link are known; when the position of one marker is known and the position and alignment of another marker is known; when the position and alignment of one marker are known and the alignment of a second marker is known; or where the position of two non-alignable markers are known and there is no third marker.

39. The computer as recited in claim 23, further comprising a pattern matcher to determine if a generalized rule matches an entry in a database.

40. The computer as recited in claim 33, wherein said propositions may only be asserted into a database during generation of said assembly procedure.

41. The computer as recited in claim 33, wherein a pattern matcher determines if a generalized rule matches an entry in a database during generation of said assembly procedure, said database comprising a set of propositions, said propositions defining at least markers associated with links of said linkage, said pattern matcher matching propositions which share predicates.

42. The computer as recited in claim 41, wherein said generalized rules are preferentially applied when a predicate on which they depend has been previously asserted into said database.

43. The method as recited in claim 16, wherein the linkage compiler terminates when all of the links in said linkage are assumed to be known.

* * * * *